US005567630A

United States Patent [19]

Matsumoto et al.

[11] Patent Number: 5,567,630

[45] Date of Patent: Oct. 22, 1996

[54] METHOD OF FORMING AN INK JET RECORDING DEVICE, AND HEAD USING SAME

[75] Inventors: Shigeyuki Matsumoto, Atsugi; Asao Saito, Yokohama; Yashiro Naruse, Kiyokawa-mura; Kei Fujita, Kokubunji, all of Japan

[73] Assignee: Canon Kabushiki Kaisha, Tokyo, Japan

[21] Appl. No.: 58,433

[22] Filed: Apr. 20, 1993

Related U.S. Application Data

[62] Division of Ser. No. 652,432, Feb. 7, 1991, Pat. No. 5,264,874.

[30] Foreign Application Priority Data

| | | | |
|---|---|---|---|
| Feb. 9, 1990 | [JP] | Japan | 2-28265 |
| Apr. 11, 1990 | [JP] | Japan | 2-95402 |
| Apr. 11, 1990 | [JP] | Japan | 2-95403 |

[51] Int. Cl.$^{6}$ .......... H01L 21/265; H01L 21/70; H01L 21/77

[52] U.S. Cl. .......... 437/31; 437/47; 437/54; 347/59

[58] Field of Search .......... 437/31, 32, 33, 437/57, 59, 74, 75, 54, 47; 148/DIG. 9, DIG. 10, DIG. 96; 347/59

[56] References Cited

U.S. PATENT DOCUMENTS

| | | | |
|---|---|---|---|
| 3,894,891 | 7/1975 | Magdo et al. | 437/31 |
| 3,928,082 | 12/1975 | Schwettmann et al. | 437/31 |
| 3,981,072 | 9/1976 | Buie | 437/31 |
| 4,007,474 | 2/1977 | Yagi et al. | 437/31 |
| 4,251,824 | 2/1981 | Hara et al. . | |
| 4,313,124 | 1/1982 | Hara . | |
| 4,345,262 | 8/1982 | Shirato et al. . | |
| 4,410,899 | 10/1983 | Haruta et al. . | |
| 4,412,224 | 10/1983 | Sugitani . | |
| 4,429,321 | 1/1984 | Matsumoto | 347/59 |
| 4,459,600 | 7/1984 | Sato et al. . | |
| 4,463,359 | 7/1984 | Ayata et al. . | |

(List continued on next page.)

FOREIGN PATENT DOCUMENTS

| | | |
|---|---|---|
| 0020233 | 12/1980 | European Pat. Off. . |
| 0283066 | 9/1988 | European Pat. Off. . |
| 0369347 | 5/1990 | European Pat. Off. . |
| 0378439 | 7/1990 | European Pat. Off. . |
| 54-056847 | 5/1979 | Japan . |
| 57-072867 | 5/1982 | Japan . |
| 59-123670 | 7/1984 | Japan . |
| 59-138461 | 8/1984 | Japan . |
| 60-071260 | 4/1985 | Japan . |
| 63-120656 | 5/1988 | Japan . |
| 1-132174 | 5/1989 | Japan . |
| 2088286 | 6/1982 | United Kingdom . |
| W0871868 | 3/1987 | WIPO . |

OTHER PUBLICATIONS

Hamilton, D. J. & Howard, W. G. "Basic Integrated Circuit Engineering"; McGraw Hill Book Co., New York 1975; pp. 265 and 266.

*Primary Examiner*—Mary Wilczewski
*Assistant Examiner*—Brian K. Dutton
*Attorney, Agent, or Firm*—Fitzpatrick, Cella, Harper & Scinto

[57] ABSTRACT

A recording head for discharging ink by using thermal energy comprises a plurality of outlets for discharging ink and a substrate including a common substrate plate of P type, a plurality of electrothermal converting elements and a plurality of functional elements connected to the respective electrothermal converting elements and formed on the common substrate plate as well as the electrothermal converting elements. Each of the functional elements has a first semiconductor region of N type, a second semiconductor region of P type provided within the first semiconductor region and a third semiconductor region of N type provided within the second semiconductor region, so as to form a rectifying junction. The first, second and third semiconductor regions are formed by diffusion of impurity atoms in the common semiconductor substrate plate.

14 Claims, 34 Drawing Sheets

U.S. PATENT DOCUMENTS

| | | | |
|---|---|---|---|
| 4,558,333 | 12/1985 | Sugitani et al. . | |
| 4,723,129 | 2/1988 | Endo et al. . | |
| 4,740,796 | 4/1988 | Endo et al. . | |
| 4,743,955 | 5/1988 | Matsumoto . | |
| 4,778,774 | 10/1988 | Blossfeld | 437/32 |
| 4,794,443 | 12/1988 | Tanaka et al. . | |
| 4,814,846 | 3/1989 | Matsumoto et al. . | |
| 4,814,852 | 3/1989 | Sundstrom | 257/551 |
| 4,816,889 | 3/1989 | Matsumoto . | |
| 4,947,192 | 8/1990 | Hawkins et al. . | |
| 4,951,118 | 8/1990 | Nakamura . | |
| 4,965,215 | 10/1990 | Zambrano et al. | 437/74 |
| 5,055,859 | 10/1991 | Wakabayashi et al. | 347/59 |
| 5,066,602 | 11/1991 | Takemoto et al. | 437/31 |
| 5,081,474 | 1/1992 | Shibata et al. . | |
| 5,136,189 | 8/1992 | Demaris | 307/475 |
| 5,157,419 | 10/1992 | Matsumoto et al. | 346/140 R |
| 5,198,374 | 3/1993 | Kato | 437/59 |
| 5,198,692 | 3/1993 | Momose | 257/557 |
| 5,212,503 | 5/1993 | Saito et al. | 347/59 |
| 5,218,228 | 6/1993 | Williams et al. | 257/557 |
| 5,341,005 | 8/1994 | Canclini | 257/173 |

METHOD OF FORMING AN INK JET RECORDING DEVICE, AND HEAD USING SAME

This application is a division of application Ser. No. 07/652,432 filed Feb. 7, 1991, now U.S. Pat. No. 5,264,874.

BACKGROUND OF THE INVENTION

1. Field of the Invention

The present invention relates to an ink jet recording system used for copying machines, facsimile machines, word processors, printers as output terminals for work stations personal computers, host computers or optical disc apparatuses, video output printers, handy or portable printers to be coupled to the above-described equipment or the like and more particularly to a substrate for a recording head where an electrothermal converting element which generates a thermal energy used for recording information and functional elements for recording are configured on the common substrate plate, a recording head having the substrate, an ink jet recording system having the recording head and a method of manufacturing the substrate.

2. Related Background Art

Conventionally, recording heads generally have the following structures. Electrothermal converting elements are arranged in an array geometry and formed on a single crystal silicon substrate plate. A driver circuit for driving the electrothermal converting elements is formed outside the silicon substrate plate by arranging functional elements such as transistor arrays and/or diode arrays. Electric connections between the electrothermal converting elements and the functional elements such as transistors arrays are made by flexible cables, wire bonding or the like.

On the other hand, for the purpose of simplification of a structure of the above-mentioned recording head, reduction of the defective components during manufacturing processes, and improvements of uniformity of characteristics of electronic devices and reproducibility of the device, an ink jet recording head was developed having electrothermal converting elements and functional elements, both of which are formed on the common semiconductor substrate plate, such as disclosed in Japanese Patent Application Laying-open No. 72867/1982.

FIG. 1 shows a part of a recording head formed on a common semiconductor substrate including an N type epitaxial layer plate. Reference numeral 901 denotes a semiconductor substrate plate formed by a single crystal silicon. Reference numeral 902 denotes an N type semiconductor collector region formed by the epitaxial growth. Reference numeral 903 denotes an ohmic contact region of N type semiconductor containing a high impurity concentration. Reference numeral 904 denotes a base region of P type semiconductor. Reference numeral 905 denotes an emitter region of N type semiconductor containing a high impurity concentration. The regions 902 to 905 define a bipolar transistor 920. Reference numeral 906 denotes a silicon oxide layer as heat accumulating and insulating layer. Reference numeral 907 denotes a hafnium boride layer as a heat generating resistance layer. Reference numeral 908 denotes an aluminium electrode. Reference numeral 909 denotes a silicon oxide layer as a protective layer. The regions 901 to 909 form a substrate 930 for a recording head. In the layer configurat ion shown in FIG. 1, reference numeral 940 denotes a heating portion. A top plate 910 defines a liquid passage (ink passage) 950 in cooperation with the substrate 930.

Various improvements and proposals have been made with respect to the recording head having structures mentioned above. Recently, specific performance improvements have been further required in the recording head, such as attaining higher speed driveability, saving energy consumption, higher integration density, lower cost, higher reliability and high level functionality.

When using the above-mentioned substrate as a part of an ink jet recording head, or of a thermal head, effective steps must be taken to prevent the head or the entire recording apparatus from increasing its size and cost. Here, the ink jet recording head is composed of, for example, discharging orifices for discharging recording liquid (ink), liquid passages communicating to the orifices, electrothermal converting elements which are provided corresponding to orifices and function as discharge energy generating elements; and the thermal head is used for thermal recording.

Commercial success cannot be expected without supplying high quality recording heads at low cost, which is achieved by constructing low cost recording heads by implementing high-density integration of functional elements and reduction of the area of a chip as substrates of the recording heads. For this, functional elements such as diodes, transistors or the like must be made smaller.

With the ink jet recording head, however, an electric current of about 200–400 mA is needed to effectively drive electrothermal converting elements disposed in the head. This presents the following problems involved in the reduction of sizes of diodes or the like.

(1) The electric current is concentrated on a portion of a diode. This will sharply increase the current density of the portion, thereby damaging a junction of the diode.

(2) A high voltage is required to ensure a sufficient electric current for driving the head. This necessitates the change of the arrangement of the entire system.

(3) A current density of the junction will be saturated when it exceeds a certain value, which prevents the sufficient current.

In particular, the inventors have found through a number of experiments that the construction of recording heads used by ink jet recording apparatuses must be determined taking sufficient account of the effect of heat which is produced by semiconductor devices, electrothermal converting elements, or the like, because a liquid (ink) is used in the recording heads.

SUMMARY OF THE INVENTION

The present invention has been carried out in view of the above-mentioned technical problems.

Therefore, an object of the present invention is to provide a recording head and a recording head substrate the fabrication of which is relatively easy and low cost.

A second object of the present invention is to provide a recording head which has a plurality of energy generating producing elements and semiconductor devices, and which can perform good recording with uniform elements constructed by restricting the variation between the elements of the recording heads.

A third object of the present invention is to provide a recording head which is reduced in size by increasing integration density.

A fourth object of the present invention is to provide an effective recording head by reducing eddy currents caused by parasitic PN junction structure.

A fifth object of the present invention is to provide a recording head which has a semiconductor device with a plurality of elements, and which can operate without error by preventing interference to adjacent elements.

A sixth object of the present invention is to provide a recording head which is superior in discharging characteristics of ink, and can perform recording at a high speed with an excellent resolution.

A seventh object of the present invention is to provide a recording head that can maintain good recording conditions without deteriorating the ink discharging characteristics.

An eighth object of the present invention is to provide a substrate for the above-mentioned recording head of high integration density, high reliability, and low cost.

A ninth object of the present invention is to provide a low-cost ink jet recording apparatus which has the above-mentioned recording head, and which can perform high-speed, high-resolution recording.

A tenth object of the present invention is to provide a facsimile machine to which the ink jet recording system is equipped.

An eleventh object of the present invention is to provide a word processor to which the ink jet recording system is equipped.

A twelfth object of the present invention is to provide an optical disc apparatus to which the ink jet recording system is equipped.

A thirteenth object of the present invention is to provide a work station to which the ink jet recording system is equipped.

A fourteenth object of the present invention is to provide a personal or host computer to which the ink jet recording system is equipped.

A fifteenth object of the present invention is to provide a portable or handy printer having the above-described recording head.

In the first aspect of the present invention, a recording head for discharging ink by using thermal energy comprises:

- means for defining a plurality of openings for discharging ink; and
- a substrate including:
  - a common semiconductor substrate plate of a first conductivity type,
  - a plurality of electrothermal converting elements for generating a thermal energy, and
  - a plurality of functional elements electrically connected to respective electrothermal converting elements, each of the functional elements having a first semiconductor region of a second conductivity type different from the first conductivity type, a second semiconductor region of the first conductivity type provided within the first semiconductor region and a third semiconductor region of the second conductivity type provided within the second semiconductor region, so as to form a rectifying junction,
- wherein the first, second and third semiconductor regions are formed by diffusion of impurity atoms in the common semiconductor substrate plate.

Here, the first conductivity type may be P type and the plurality of functional elements may each have an NPN transistor structure in which a base electrode and a collector electrode are short-circuited so that the NPN transistor acts as a diode.

The common substrate plate may be grounded.

A junction area of an anode electrode and a cathode electrode of the diode may be not less than $5\times10^{-5}$ cm$^2$ when a driving current of the diode is less than 300 mA and not less than 200 mA.

A junction area of an anode electrode and a cathode electrode of the diode may be not less than $1\times10^{-4}$ cm$^2$ when a driving current of the diode is less than 400 mA and not less than 300 mA.

The plurality of electrothermal converting elements may be transducers for generating thermal energies in correspondence with driving signals from the plurality of functional elements, the thermal energies cause film boiling in ink and thereby discharge ink from the openings.

In the second aspect of the present invention, a substrate for a recording head for discharging ink by using thermal energy comprises:

- a common semiconductor substrate plate of a first conductivity type;
- a plurality of electrothermal converting elements for generating a thermal energy; and
- a plurality of functional elements electrically connected to respective electrothermal converting elements, each of the functional elements having a first semiconductor region of a second conductivity type different from the first conductivity type, a second semiconductor region of the first conductivity type provided within the first semiconductor region and a third semiconductor region of the second conductivity type provided within the second semiconductor region, so as to form a rectifying junction;
- wherein the first, second and third semiconductor regions are formed by diffusion of impurity atoms in the common semiconductor substrate plate.

In the third aspect of the present invention, an ink jet recording apparatus comprises:

- a recording head including;
  - means for defining a plurality of openings for discharging ink,
  - a substrate having
  - a common semiconductor substrate of a first conductivity type,
  - a plurality of electrothermal converting elements for generating a thermal energy, and
  - a plurality of functional elements electrically connected to respective electrothermal converting elements, each of the functional elements having a first semiconductor region of a second conductivity type different from the first conductivity type, a second semiconductor region of the first conductivity type provided within the first semiconductor region and a third semiconductor region of the second conductivity type provided within the second semiconductor region, so as to form a rectifying junction,
- wherein the first, second and third semiconductor regions are formed by diffusion of impurity atoms in the common semiconductor substrate plate;
- ink feed means for supplying ink into the recording head; and
- transport means for carrying a recording medium to a recording position of the recording head.

In the forth aspect of the present invention, a process for producing a substrate for an ink jet recording head comprises the steps of:

- forming a plurality of N type collector regions on a P type semiconductor substrate plate by ion implantation and thermal diffusion;
- forming respective lowly doped P type base regions within the plurality of N type collector regions by ion implantation and thermal diffusion;

forming respective P type isolation regions surrounding the plurality of N type collector regions and at a distance from the N type collector regions by thermal diffusion of impurities;

forming highly doped $P^+$ regions on the P type isolation regions and on respective inner peripheral portions of the lowly doped P type base regions by ion implantation;

forming highly doped $N^+$ regions on the N type collector regions and at respective portions within the lowly doped P type base region by thermal diffusion of impurities;

depositing and patterning aluminum or aluminum alloy to form isolation electrodes on the $P^+$ regions on the P type isolation regions, emitter electrodes on the $N^+$ regions within the lowly doped P type base region and collector-base common electrodes on the $N^+$ regions on the N type collector regions and the $P^+$ regions on the lowly doped P type base regions;

forming a layer made of a high electrical resistance material for heat generating elements on the surface of the substrate plate via an insulation layer; and forming wirings for connecting respectively the heat generating elements to the emitter electrodes and the collector-base common electrodes.

In the fifth aspect of the present invention, a copying machine comprises:

an ink jet recording unit including:

means for defining a plurality of openings for discharging ink;

a substrate having a common semiconductor substrate of a first conductivity type, a plurality of electrothermal converting elements for generating a thermal energy, and a plurality of functional elements electrically connected to respective electrothermal converting elements, each of the functional elements having a first semiconductor region of a second conductivity type different from the first conductivity type, a second semiconductor region of the first conductivity type provided within the first semiconductor region and a third semiconductor region of the second conductivity type provided within the second semiconductor region, so as to form a rectifying junction, wherein the first, second and third semiconductor regions are formed by diffusion of impurity atoms in the common semiconductor substrate plate;

ink feed means for supplying ink into the recording head; and transport means for carrying a recording medium to a recording position of the recording head.

In the sixth aspect of the present invention, a facsimile apparatus comprises:

an ink jet recording unit including:

means for defining a plurality of openings for discharging ink;

a substrate having a common semiconductor substrate of a first conductivity type, a plurality of electrothermal converting elements for generating a thermal energy, and a plurality of functional elements electrically connected to respective electrothermal converting elements, each of the functional elements having a first semiconductor region of a second conductivity type different from the first conductivity type, a second semiconductor region of the first conductivity type provided within the first semiconductor region and a third semiconductor region of the second conductivity type provided within the second semiconductor region, so as to form a rectifying junction, wherein the first, second and third semiconductor regions are formed by diffusion of impurity atoms in the common semiconductor substrate plate;

ink feed means for supplying ink into the recording head; and transport means for carrying a recording medium to a recording position of the recording head.

In the seventh aspect of the present invention, a word processor comprises:

an ink jet recording unit including:

means for defining a plurality of openings for discharging ink;

a substrate having a common semiconductor substrate of a first conductivity type, a plurality of electrothermal converting elements for generating a thermal energy, and a plurality of functional elements electrically connected to respective electrothermal converting elements, each of the functional elements having a first semiconductor region of a second conductivity type different from the first conductivity type, a second semiconductor region of the first conductivity type provided within the first semiconductor region and a third semiconductor region of the second conductivity type provided within the second semiconductor region, so as to form a rectifying junction, wherein the first, second and third semiconductor regions are formed by diffusion of impurity atoms in the common semiconductor substrate plate;

ink feed means for supplying ink into the recording head; and transport means for carrying a recording medium to a recording position of the recording head.

In the eighth aspect of the present invention, an optical disc apparatus comprises:

an ink jet recording unit including:

means for defining a plurality of openings for discharging ink;

a substrate having a common semiconductor substrate of a first conductivity type, a plurality of electrothermal converting elements for generating a thermal energy, and a plurality of functional elements electrically connected to respective electrothermal converting elements, each of the functional elements having a first semiconductor region of a second conductivity type different from the first conductivity type, a second semiconductor region of the first conductivity type provided within the first semiconductor region and a third semiconductor region of the second conductivity type provided within the second semiconductor region, so as to form a rectifying junction, wherein the first, second and third semiconductor regions are formed by diffusion of impurity atoms in the common semiconductor substrate plate;

ink feed means for supplying ink into the recording head; and transport means for carrying a recording medium to a recording position of the recording head.

In the ninth aspect of the present invention, a work station comprises:

an ink jet recording unit including:

means for defining a plurality of openings for discharging ink;

a substrate having a common semiconductor substrate of a first conductivity type, a plurality of electrothermal converting elements for generating a thermal energy, and a plurality of functional elements electrically connected to respective electrothermal converting elements, each of the functional elements having a first semiconductor region of a second conductivity type different from the first conductivity type, a second semiconductor region of the first conductivity type provided within the first semiconductor region and a third semiconductor region of the second conductivity type provided within the second semiconductor region, so as to form a rectifying junction, wherein the first, second and third semiconductor regions are formed by diffusion of impurity atoms in the common semiconductor substrate plate;

ink feed means for supplying ink into the recording head; and transport means for carrying a recording medium to a recording position of the recording head.

In the tenth aspect of the present invention, a computer comprises:

an ink jet recording unit including:

means for defining a plurality of openings for discharging ink;

a substrate having a common semiconductor substrate of a first conductivity type, a plurality of electrothermal converting elements for generating a thermal energy, and a plurality of functional elements electrically connected to respective electrothermal converting elements, each of the functional elements having a first semiconductor region of a second conductivity type different from the first conductivity type, a second semiconductor region of the first conductivity type provided within the first semiconductor region and a third semiconductor region of the second conductivity type provided within the second semiconductor region, so as to form a rectifying junction, wherein the first, second and third semiconductor regions are formed by diffusion of impurity atoms in the common semiconductor substrate plate;

ink feed means for supplying ink into the recording head; and transport means for carrying a recording medium to a recording position of the recording head.

In the eleventh aspect of the present invention, a portable printer comprises:

an ink jet recording unit including:

means for defining a plurality of openings for discharging ink;

a substrate having a common semiconductor substrate of a first conductivity type, a plurality of electrothermal converting elements for generating a thermal energy, and a plurality of functional elements electrically connected to respective electrothermal converting elements, each of the functional elements having a first semiconductor region of a second conductivity type different from the first conductivity type, a second semiconductor region of the first conductivity type provided within the first semiconductor region and a third semiconductor region of the second conductivity type provided within the second semiconductor region, so as to form a rectifying junction, wherein the first, second and third semiconductor regions are formed by diffusion of impurity atoms in the common semiconductor substrate plate;

ink feed means for supplying ink into the recording head;

transport means for carrying a recording medium to a recording position of the recording head;

means receiving processed information to be recorded from an external utilizing apparatus for controlling the plurality of functional elements in accordance with the processed information; and means receiving controlling data from the external utilizing apparatus for controlling the ink feed means and the transport means in accordance with the controlling data.

The present invention makes it possible not only to incorporate into a single substrate a plurality of rectifying elements that can be independently driven, but also to positively separate these rectifying elements. Furthermore, using a P type substrate with grounding it can prevent an electric potential, which exerts an adverse effect on ink of the ink jet recording head, from being applied to the substrate.

Moreover, the present invention makes it possible to fabricate a high density, high performance, small recording head at a low cost because a plurality of elements can be incorporated into the substrate of the recording head in the same process.

Furthermore, the present invention can prevent the damage of the energy generating elements and semiconductor elements because the collectors and bases of the transistors driving the electrothermal converting elements are electrically short-circuited so that a current concentration to a specific diode with a large current amplification can be prevented even if transistors forming the plurality of diodes have the variations of the current amplifications.

The present invention makes it possible to incorporate the transistor elements and electrothermal converting elements on the same substrate, and hence to fabricate a high density, high performance, small recording head. In addition, the circuit arrangement of the present invention enables liquid droplets which are superior in discharging response and in stability to be formed at a high speed.

The present invention can solve the above-mentioned problems involved in lowering the cost by reducing the area of the entire functional elements by making the junction areas larger than set values. In other words, the driving current of less variations can be obtained without changing a conventional driving voltage.

The above and other objects, effects, features and advantages of the present invention will become more apparent from the following description of embodiments thereof taken in conjunction with the accompanying drawings.

DETAILED DESCRIPTION OF PREFERRED EMBODIMENTS

Figure 1:
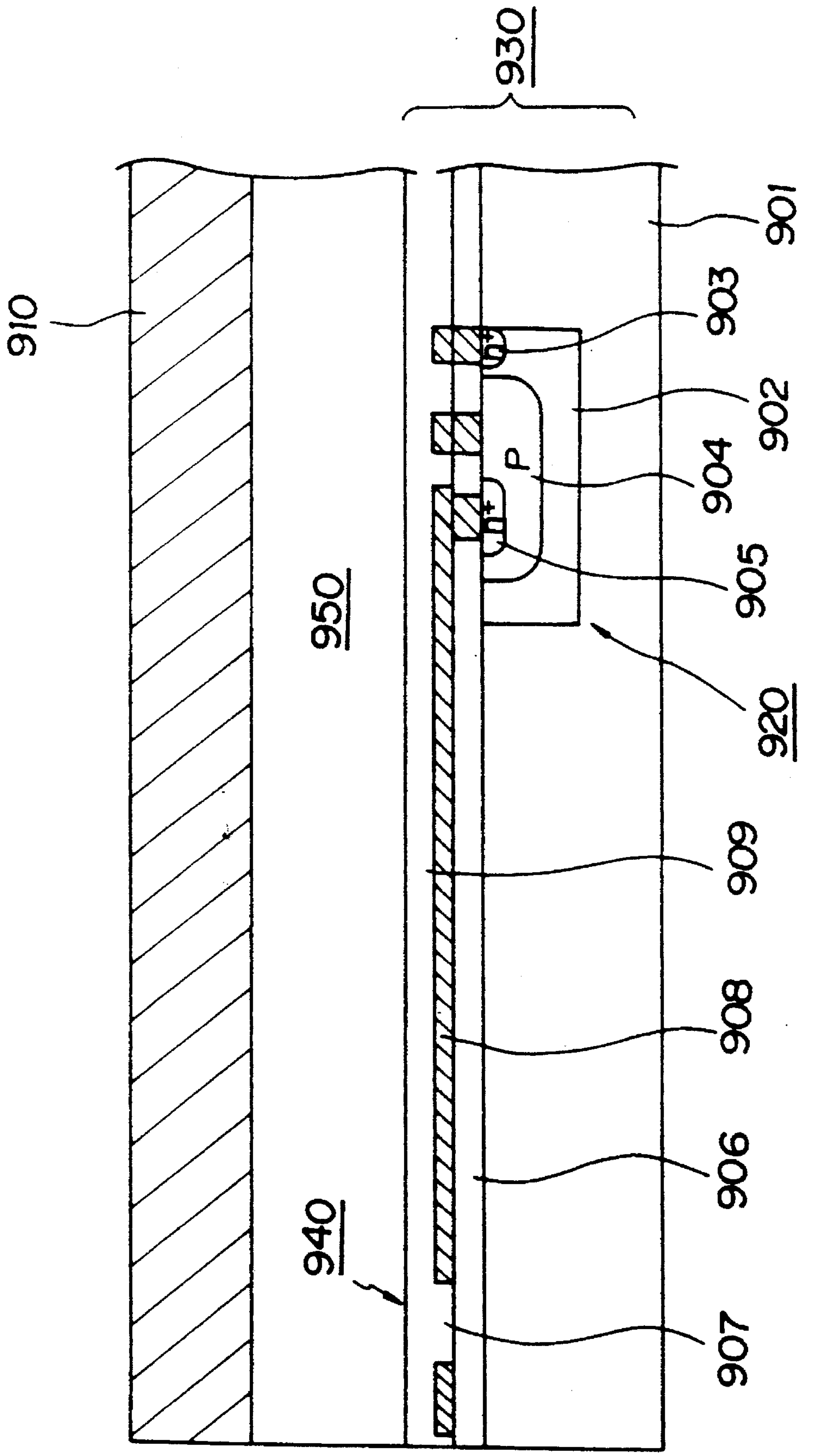
FIG. 1 (PRIOR ART)
FIG. 1 is a schematic sectional view of a conventional recording head.

The invention will now be described with reference to the accompanying drawings.

In a preferred embodiment of the present invention, when elements having rectifying junctions are used as driving functional elements for controlling electric currents supplied to electrothermal converting elements which generate thermal energy for discharging ink, the functional elements are so constructed to include three semiconductor regions which are formed by performing three impurity diffusions to a common semiconductor substrate. As the functional elements, bipolar transistors or junction diodes can be used: preferably, transistor elements which are fabricated by forming N type diffused collector regions within a P type common semiconductor substrate plate, by forming P type diffused base regions within the collector regions, and by forming N type diffused emitter regions within the base regions; or diode elements which are fabricated by forming N type diffused well regions within a P type substrate plate, by forming P type diffused anode regions within the well regions, and by forming N type diffused cathode regions within the anode regions. As an impurity diffusion process for fabricating the functional elements, the thermal diffusion process or the ion implantation process is used.

Using a process other than an epitaxial growth process makes it possible to eliminate problems such as auto-doping, crystal defects, pattern misalignment or the like. Recently, mass production and a large-sized substrate for an ink jet head have been required. The present embodiment can fulfil the requirements for fabricating large diameter wafers and increasing throughput, i.e., an area occupied by the electrothermal converting elements and particularly the wiring portion thereof on the substrate of the head is increased. In contrast, in a conventional process for fabricating such devices, semiconductor regions under the electrothermal converting elements are formed by the epitaxial growth method, which is one of the major causes of low throughput of the entire process for fabricating substrates for heads.

Impurities to be used by the present invention can be P type or N type dopants such as B, P, As, Sb which are doped by thermal diffusion from gaseous sources such as $PH_3$ or $B_2H_6$, by thermal diffusion from liquid sources such as $POCl_3$, $BBr_3$, $PBr_3$, or by thermal diffusion from solid sources such as $As_2O_3$, $S_{B2}O_3$, $B_2O_3$, $P_2O_5$ or the like. It is obvious that the thermal diffusion from deposited films of doped polycrystal silicon, PSG, BSG or the like in which P or B is doped can be used. An ion implantation method is carried out by implanting B ions, P ions, or As ions as a dopant using $BF_3$, $PH_3$, $AsH_3$, $AsF_3$ or the like as an ion source.

Next, a first embodiment of the present invention will be described in more detail.

First, the connection between electrothermal converting elements and diodes functioning as driving elements of the electrothermal converting elements will be described with the explanation of the driving operation of the electrothermal converting elements.

Figure 2A:
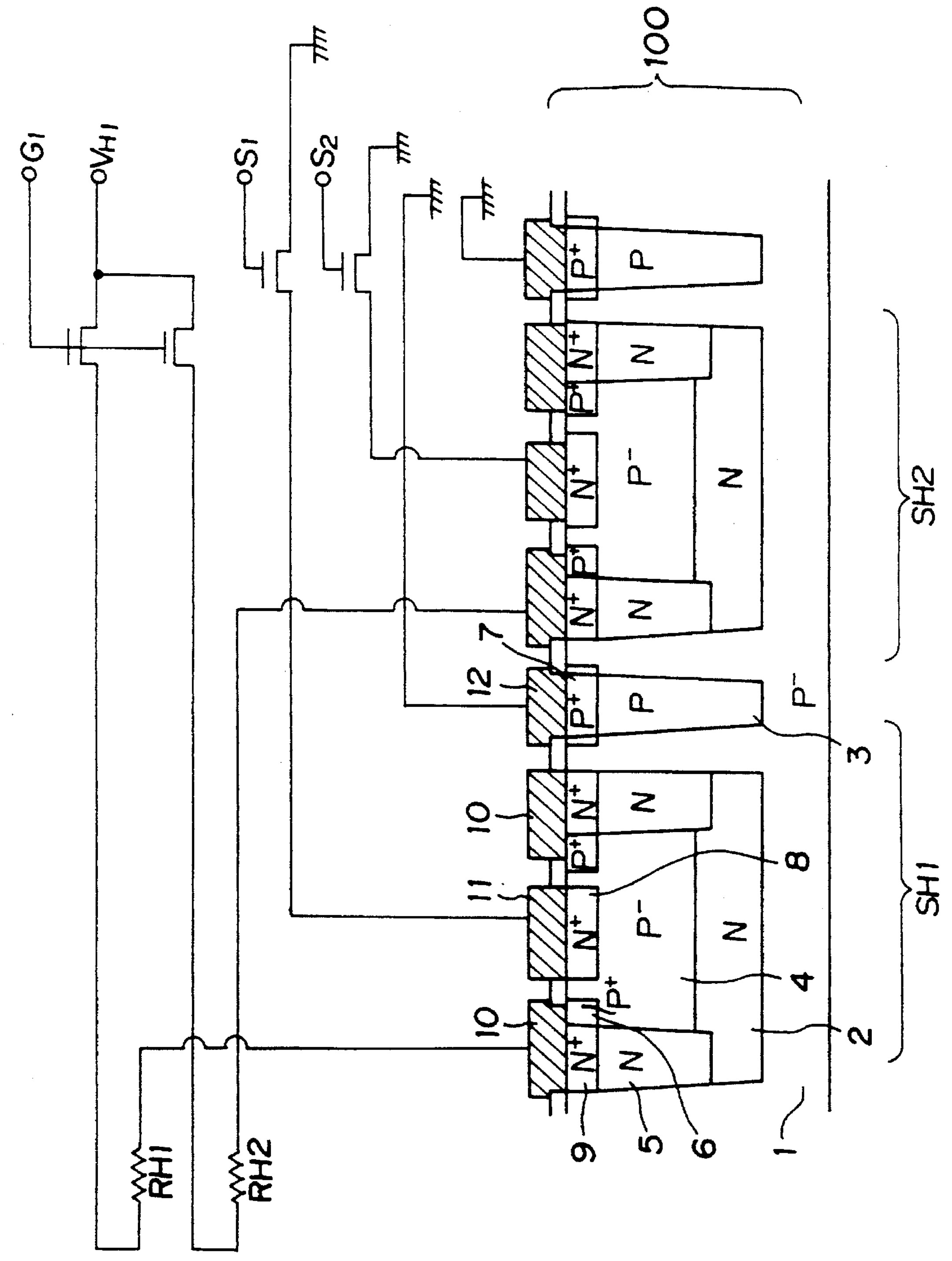
FIGS. 2A and 2B are a sectional view and an equivalent circuit diagram, respectively, schematically showing the wiring portion of a first embodiment of the recording head substrate of the present invention.
Figure 2B:
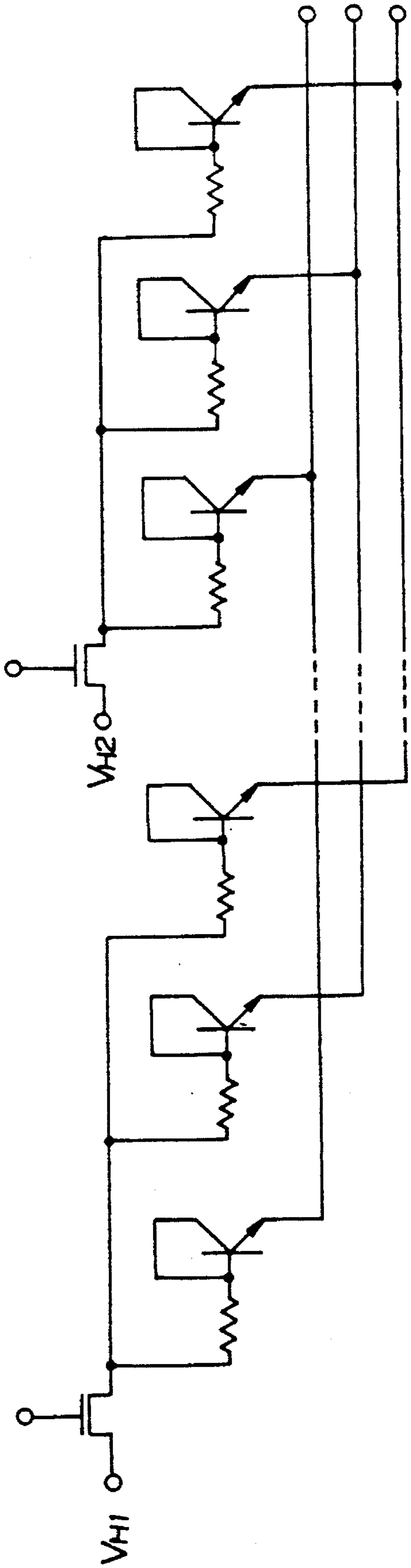

FIG. 2A is a sectional view schematically showing the wiring portion of a first embodiment of a substrate according to the present invention, and FIG. 2B is an equivalent circuit diagram of two blocks including a predetermined number of electrothermal converting elements and functional elements (i.e., transistors).

In FIG. 2A, each element SH1 (or SH2) of the functional elements is composed of an N type collector region 2, a P type base region 4, a heavily doped N type collector region 5, a heavily doped P type base region 6, an N type emitter region 8, a heavily doped N type collector region 9, a collector base common electrode 10, and an emitter electrode 11. Each element is formed on a P type single crystal silicon substrate plate 1, and is isolated by a P type isolation region 3, which is connected to an isolation electrode 12 via a heavily doped P type isolation region 7. The N type collector region 2, P type base region 4, and the N type emitter region 8 constitute an NPN transistor. The collector regions 2, 5 and 9 are constructed in such a manner that they completely enclose the emitter region 8 and the base regions 4 and 6. The P type isolation region 3 and the heavily doped P type isolation region 7 constitute an isolation region functioning as a device isolation domain. These regions and electrodes constitute a cell, and a plurality of cells are electrically connected in a matrix form. Incidentally, these regions are formed by ion implantation or thermal diffusion without using epitaxial growth.

In this embodiment, collector base common electrode 10 corresponds to the anode of a diode, and the emitter electrode 11 corresponds to the cathode of the diode. When driving electrothermal converting elements RH1 and RH2 are driven, a positive bias voltage $V_{H1}$ is applied to the electrothermal converting elements connected to the collector base common electrodes 10, and the NPN transistors in the cells are turned on, so that bias currents will flow out of emitter electrodes 11 as collector plus base currents.

As a result of shorting the base and collector as shown in FIG. 2A, the rising and falling characteristics of the electrothermal converting elements are improved, which in turn improves generation of film boiling phenomena, as well as the controllability of growth and shrinkage of bubbles involved in the boiling phenomena, thus executing stable ink discharging. The reason for this is that the characteristics of the transistors and the characteristics of the film boiling are greatly dependent each other in the ink jet recording head, and that the speed and rising characteristic of switching characteristics are unexpectedly improved owing to the reduction in the minority carrier storage effect in the transistors. In addition, the parasitic effect in the transistors are comparatively small, and the variations among the elements are few, thereby achieving stable driving currents. Furthermore, the present embodiment is arranged in a manner that the isolation electrodes 12 are grounded. This makes it possible to prevent electric charges from flowing into adjacent cells, thereby preventing faulty operation of other cells.

The driving method of the recording head will be further described in detail. In FIG. 2A, only two semiconductor functional elements SH1 and SH2 are depicted, but actually, a number of elements, 128, for example, are disposed corresponding to the same number of electrothermal converting elements, and are electrically connected to each other to form a matrix so that the electrothermal converting elements can undergo block driving. In FIG. 2B only two blocks are shown schematically.

Here, the driving operation of two segments in the same group, namely, the electrothermal converting elements RH1 and RH2 will be described.

Driving of the electrothermal converting element RH1 is carried out as follows: first, group selection is performed by using a switch G1; second, the electrothermal converting element RH1 is selected by a switch S1, and the positive voltage $V_{H1}$ is applied thereto; and third, the diode cell SH1 in the form of transistor is positively biased so that a current flows out of the emitter electrode 11. Thus, the electrothermal converting element RH1 develops heat, and the thermal energy thus produced induces change in the state of the liquid to generate bubbles, thus discharging the liquid from the discharging orifice.

Similarly, when the electrothermal converting element RH2 is driven, the switch G1 and the switch S2 are selectively turned on so that the diode cell SH2 is driven, thus supplying a current to the electrothermal converting element.

In this case, the substrate 1 is grounded through the isolation regions 3 and 7, which prevents the electrical interference between the cells. The electrothermal converting elements RH1 and RH2 are formed on the Si substrate plate 1 together with the diode cells SH1 and SH2, which constitute a substrate 100 of the recording head.

Figure 2C:
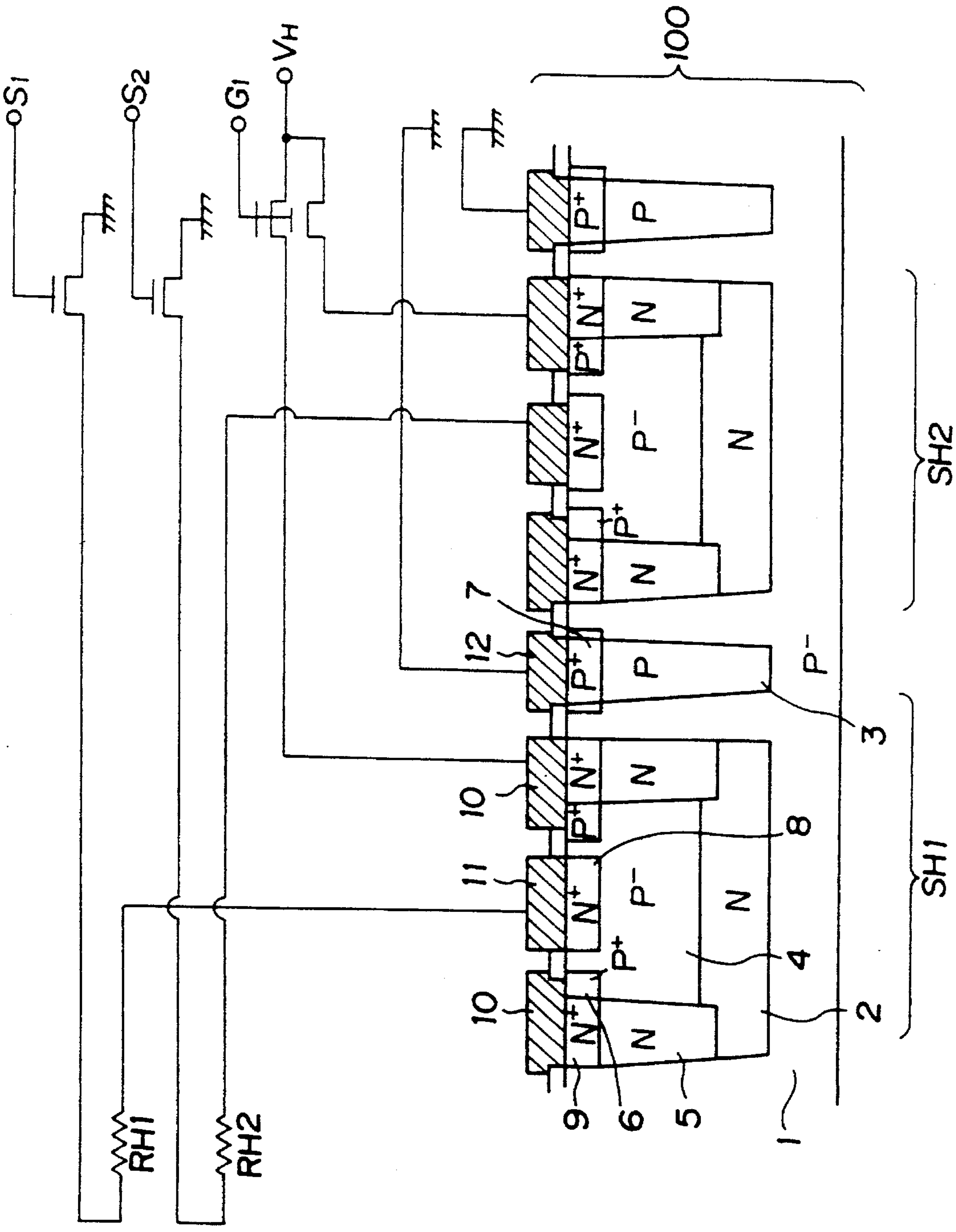
FIGS. 2C and 2D are a sectional view and an equivalent circuit diagram, respectively, schematically showing the wiring portion of a second embodiment of the recording head substrate of the present invention.
Figure 2D:
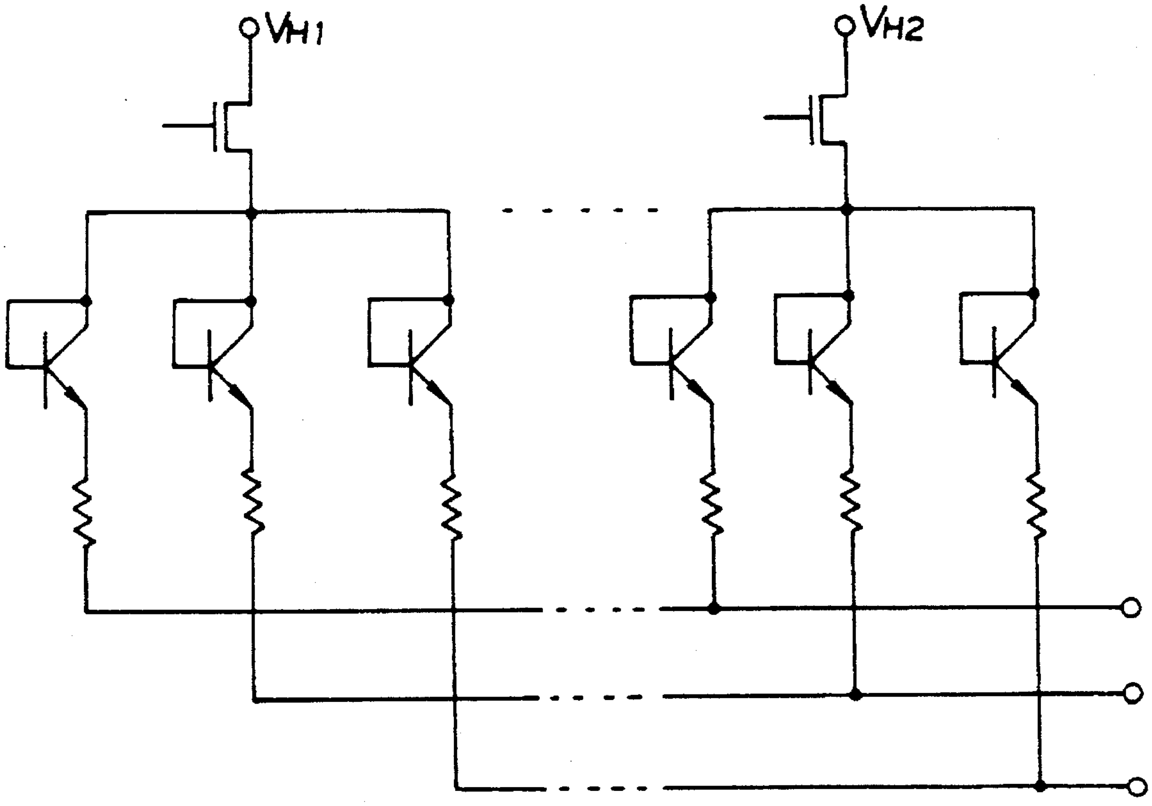

Incidentally, the wiring may be configured as shown in FIG. 2C or 2D: it may be arranged in such a manner that the positive bias voltage $V_{H1}$ is applied to the electrothermal converting elements RH1 and RH2 through the emitter electrodes 11.

Figure 3A:
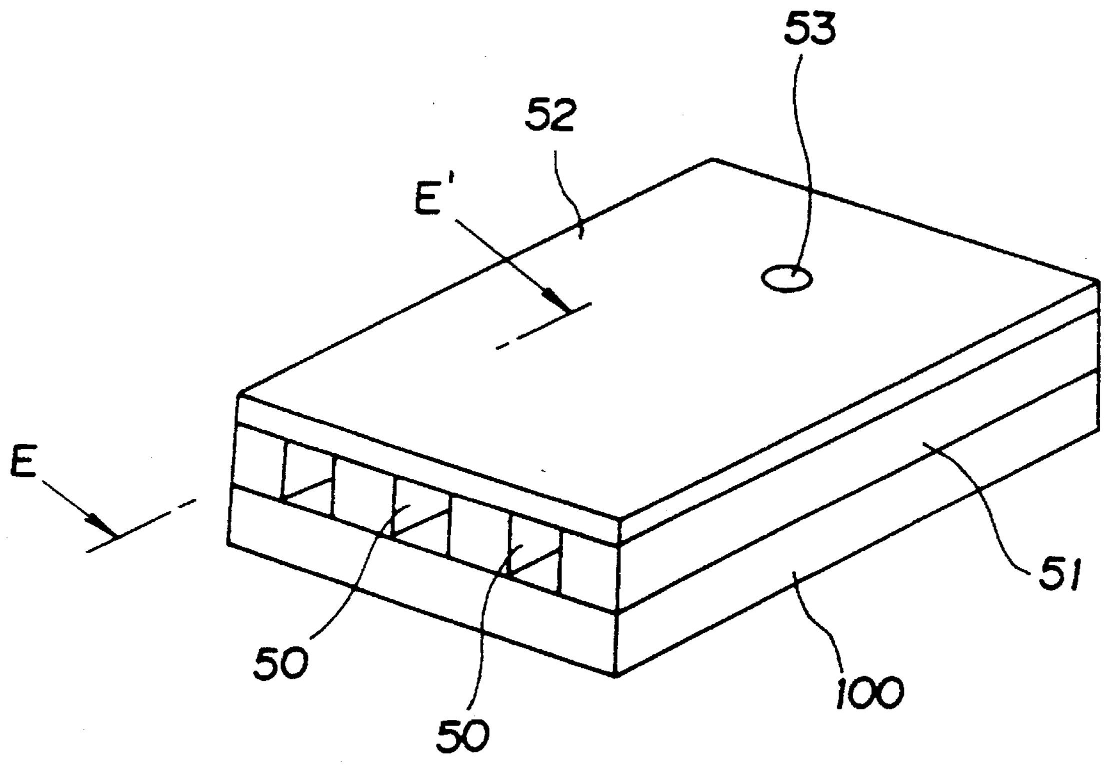
FIGS. 3A and 3B are a perspective view and a sectional view taken along line 3B–3B' of FIG. 3A, respectively, of the first embodiment of the recording head of the present invention.

FIG. 3A shows a recording head arranged by using a substrate (heater board) 100 similar to the above-mentioned substrate. The recording head has a plurality of discharging orifices 50, partition member 51 which is made of a photosensitive resin or the like, and is provided to form liquid passages communicating to the discharging orifices, a top plate 52, an ink inlet 53. Here, the partition member 51 and the top plate 52 can be unified by using a resin mold material.

Next, the substrate and the wiring portion thereof will be further described in detail.

Figure 3B:
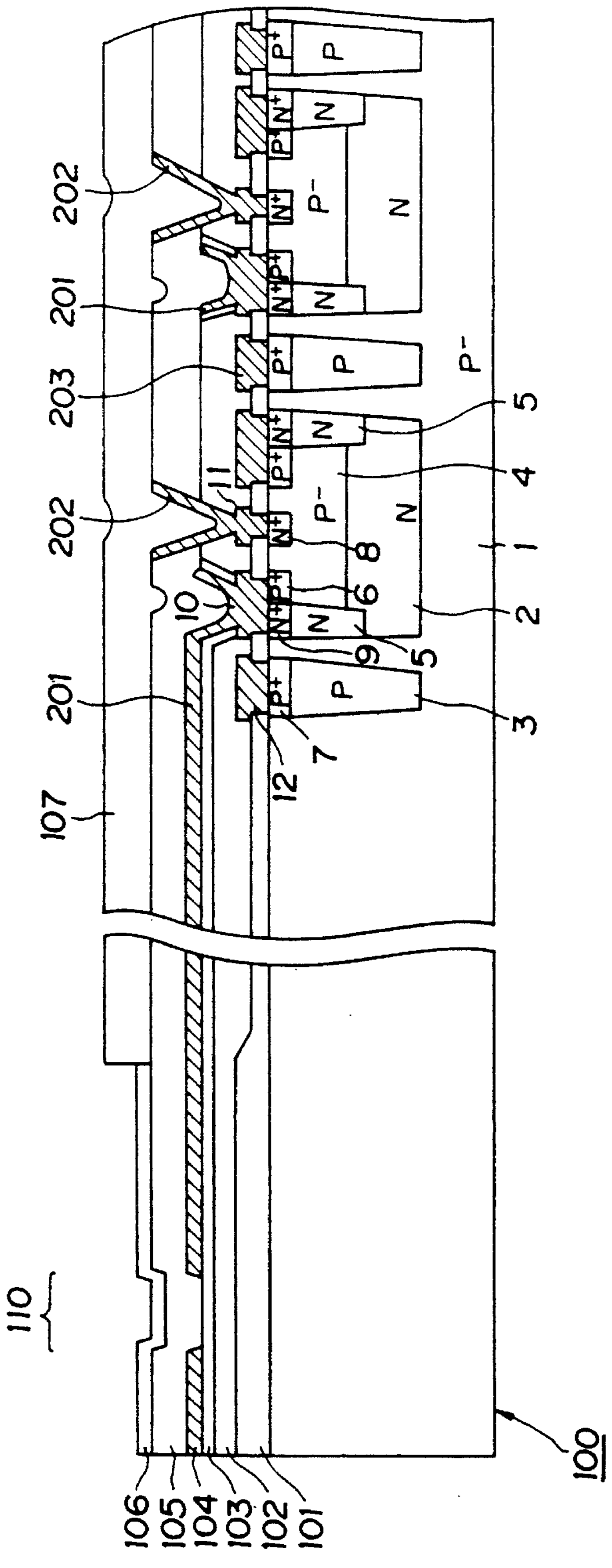

FIG. 3B is a schematic sectional view of the recording head substrate and the wiring portion thereof arranged as shown in FIG. 2A, that is, a sectional view taken along line 3B–3B' of FIG. 3A.

The recording head of the present invention is provided with the following: an $SiO_2$ film 101 which is formed, by the thermal oxidation, on the substrate having the driving portion; a heat accumulating layer 102 composed of a silicon oxide film formed by the CVD process or sputtering process; and electrothermal converting elements which are disposed on the layer 102, and are composed of a heat generating resistance layer 103 made of hafnium boride ($HfB_2$), and of electrodes 104 made of aluminum or the like, which are formed by the sputtering process.

As the heat generating resistance layer, other materials can be used: for example, Pt, Ta, $ZrB_2$, Ti—W, Ni—Cr, Ta—Si, Ta—Mo, Ta—W, Ta—Cu, Ta—Ni, Ta—Ni—Al, Ta—Mo—Ni, Ta—W—Ni, Ta—Si—Al, Ta—W—Al—Ni, Ti—Si, W, Ti, Ti—N, Mo, Mo—Si, W—Si or the like can be used.

Furthermore, on the heater portions 110 of the electrothermal converting elements, are provided a protective film of $SiO_2$ or the like formed by the sputtering process or CVD process, and a protective film 106 of Ta or the like.

The $SiO_2$ film constituting the heat regenerating layer 102 is unitarily formed with an interlayer insulation film between wiring portions 201 and 203 of the driving portion. Likewise, the protective layer 105 is also unitarily formed with an interlayer insulation film between wiring portions 201 and 202 of the driving portion.

In addition, on the wiring portion 202 on the top of the driving portion, there is provided a protective layer 107 made of an organic material such as a photo-sensitive polyimide, which forms a good ink resistance film.

Next, the fabrication process of the recording head of the embodiment will be described with reference to FIGS. 4A–4G.

(1) A silicon oxide film of about 5,000–20,000 Å thickness was formed on the P-type silicon substrate plate 1, the impurity concentration of which is about $1\times10^{12}$–$10^{16}$ $cm^{-3}$.

The silicon oxide film on the region in which the collector region 2 of each cell was to be formed, was removed by the photolithography process.

After a silicon oxide film of about 100–3,000 Å thickness, which is used as a protective film against damages by the ion implantation, was formed, N type impurities such as P or As were ion implanted into the substrate plate 1, thereby to form the N type collector region 2 of about 15–20 μm depth by thermal diffusion.

Next, a silicon oxide film of about 100–300 Å thickness was formed on the surface of the N type collector regions. After that, the silicon oxide film was coated with a resist, a patterning was performed, and the ion implantation of P type impurities was executed to the regions in which the lightly doped base regions 5 were to be formed. After the resist was removed, the lightly doped P type base regions 5 were formed by thermal diffusion: here, the impurity concentration of the base regions 5 was about $1\times10^{13}$–$1\times10^{15}$ $cm^{-3}$; and the thickness thereof was about 5–10 μm (so far, see FIG. 4A).

(2) The silicon oxide film was entirely removed, and a silicon oxide of about 1,000–10,000 Å thickness was formed. After that, parts of the oxide film at which the P type isolation regions 3 were to be formed were removed, and a borosilicate glass (BSG) film was deposited on the entire surface by using the CVD process. Subsequently, the P type isolation regions 3 were formed by thermal diffusion, the impurity concentration of the isolation regions 3 being $1\times10^{18}$–$10^{20}$ $cm^{-3}$.

After removing the BSG film, a silicon oxide film of about 1,000–10,000 Å thickness was formed, and subsequently, parts of the oxide film at which the N type collector regions were to be formed were removed, and PSG film was deposited on the entire surface by using the CVD process. After that, the N type collector regions 5 of about 10 μm thickness were formed by thermal diffusion (so far, see FIG. 4B).

(3) After removing the oxide film on the cell regions, a silicon oxide film of about 100–3,000 Å was formed. Then, a resist was applied and patterned, and the ion implantation of P type impurities was performed into only the regions in which the heavily doped base regions 6 and the heavily doped isolation regions 7 were to be formed. After the resist, were removed parts of the oxide film were removed on the regions in which the N type emitter regions 8 and heavily doped N type collector regions 9 were to be formed. Subsequently, a phosphosilicate glass (PSG) film was formed on the entire surface, and then the heavily doped P type base regions 6, the heavily doped P type isolation regions, the N type emitter regions 8, and the heavily doped N type collector regions 9 were formed at the same time. Here, the thickness of each region was made less than 1.0 μm, and the impurity concentration was made $1\times10^{19}$–$20^{20}$ $cm^{-3}$ (so far, see FIG. 4C).

(4) After the silicon oxide film 101 was formed, parts of the oxide film were removed on the locations to which the electrodes were to be connected. Then, pure aluminum was deposited on the entire surface, and all the aluminum other than the electrode regions was removed. In addition, alloying was executed to improve the junction between the aluminum and the silicon, and the wiring portions were formed.

Then, the wiring portion 203 was formed which was electrically connected to the substrate plate 1 by way of the isolation regions 7. Subsequently, the $SiO_2$ film 102 as the heat accumulation layer and the interlayer isolation film was formed on the entire surface with a thickness of about 1.0 μm by the sputtering process, and then it was selectively removed. The $SiO_2$ film may be formed by the CVD process (so far, see FIG. 4D).

Figure 4A:
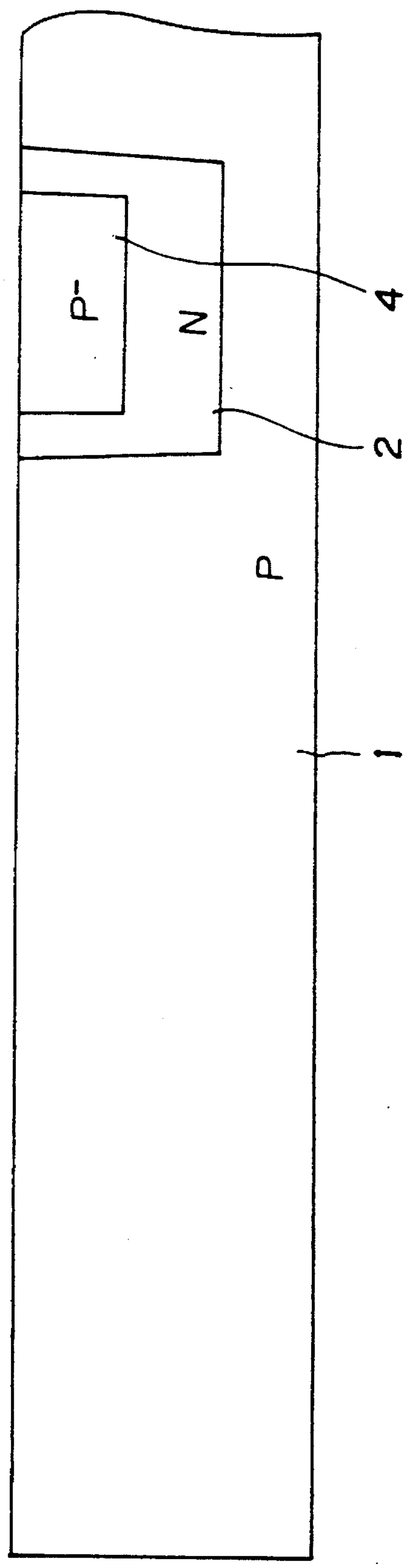
FIGS. 4A–4G are schematic sectional views for explaining a fabrication process of the recording head of the first embodiment.
Figure 4B:
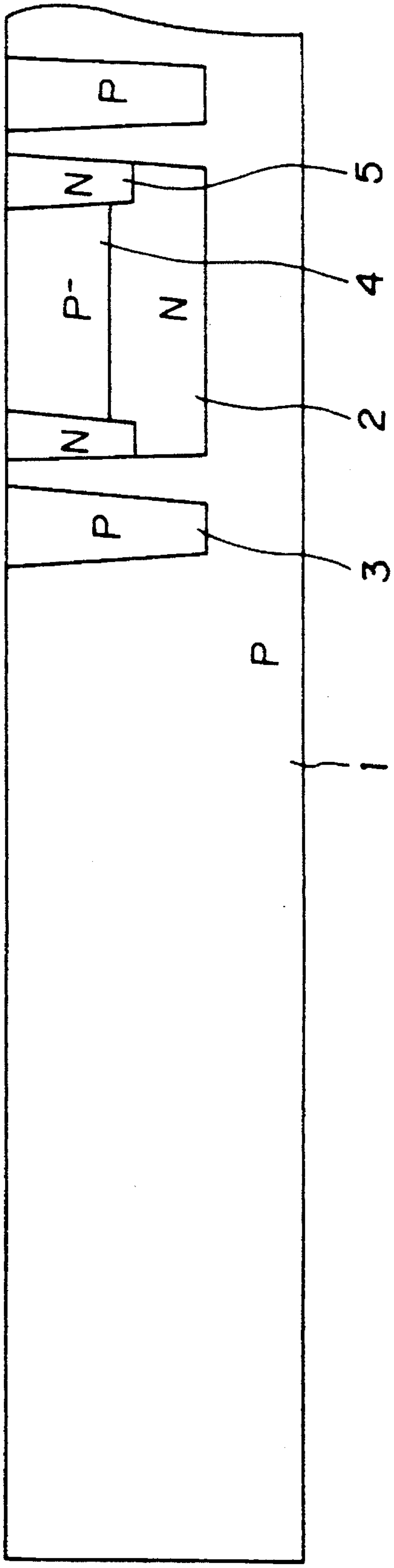
Figure 4C:
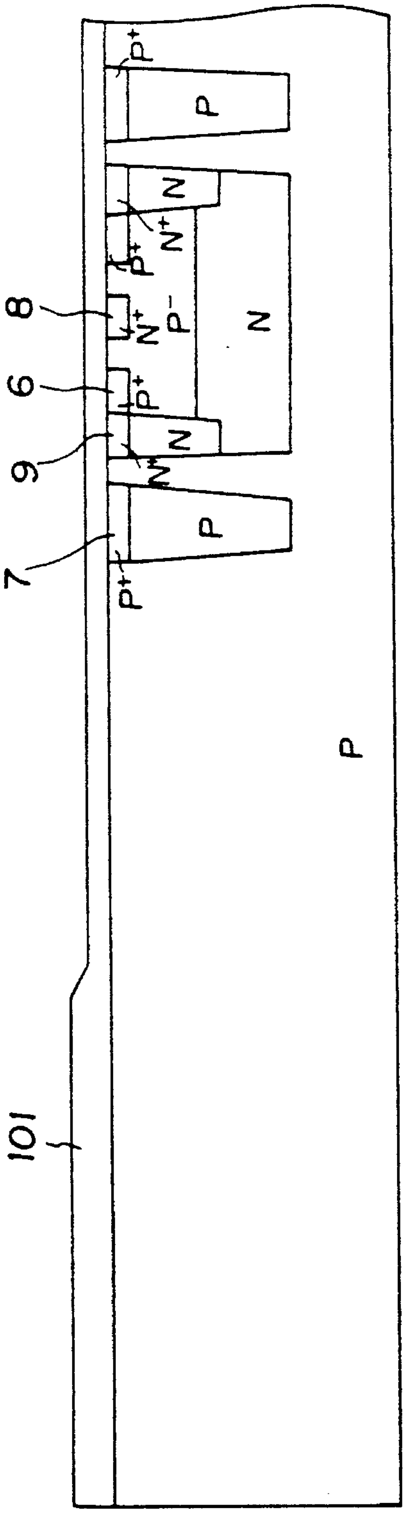
Figure 4D:
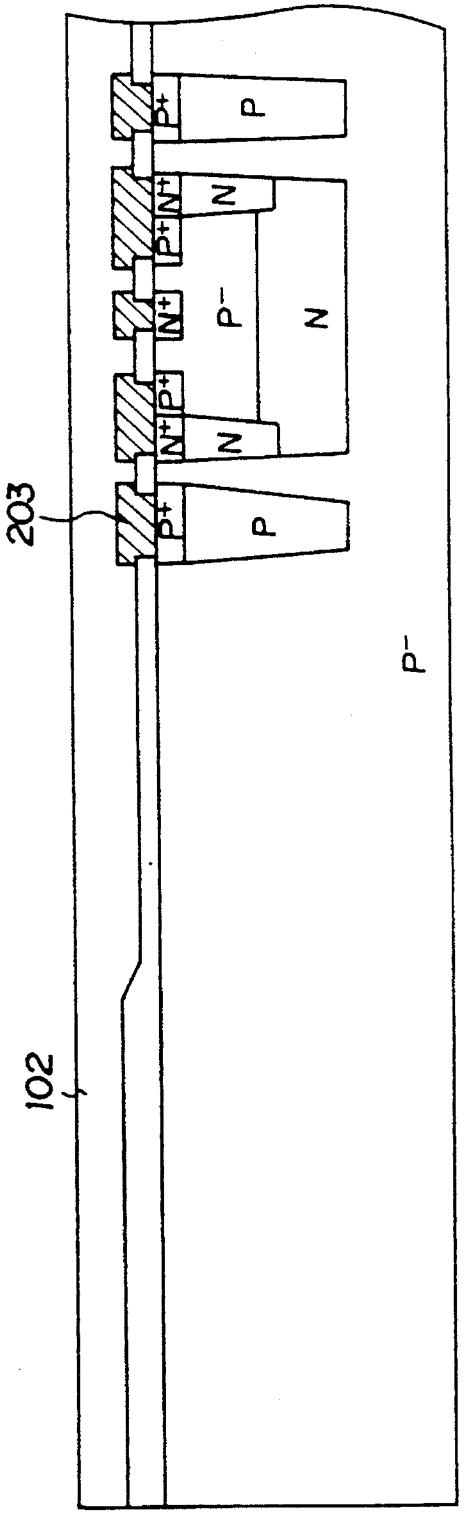
Figure 4E:
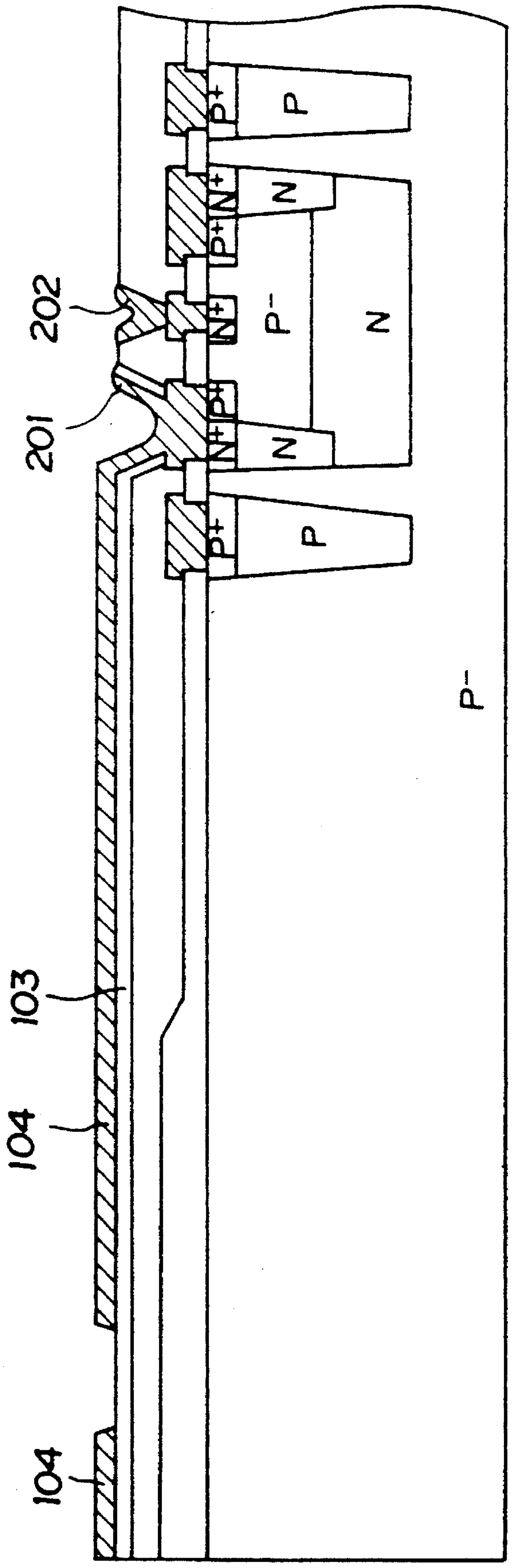
Figure 4F:
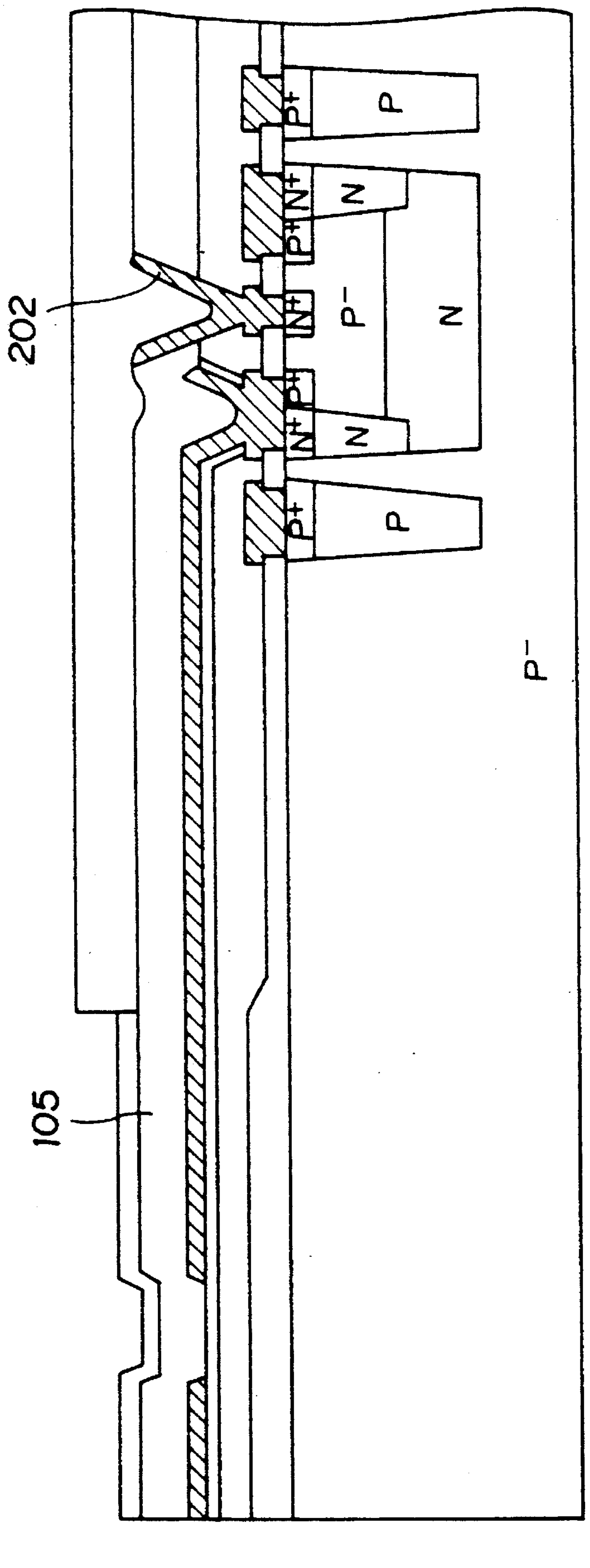

(5) Next, $HfB_2$ of the heat-generating resistance layer 103 was deposited by about 1,000 Å, on which aluminum was deposited and patterned so as to form pairs of electrodes 104 of the electrothermal converting elements, the anode electrode wiring 201 of the diode cells, and the cathode electrode wiring 202 (so far, see FIG. 4E).

(6) After that, by using the sputtering process the $SiO_2$ film 105 was deposited as a protective film of the electrothermal converting elements and an isolation layer between the Al wirings, and then contact holes were formed. Cathode electrode wiring 202 was formed, and on the heater portions of the electrothermal converting elements, Ta of about 2,000 Å thickness was deposited as a protective layer for improving cavitation resistance characteristics. In addition, on the $SiO_2$ film 105 and the cathode electrode wiring, a photo-sensitive polyimide film was formed as a protective layer (so far, see FIG. 4F).

Figure 4G:
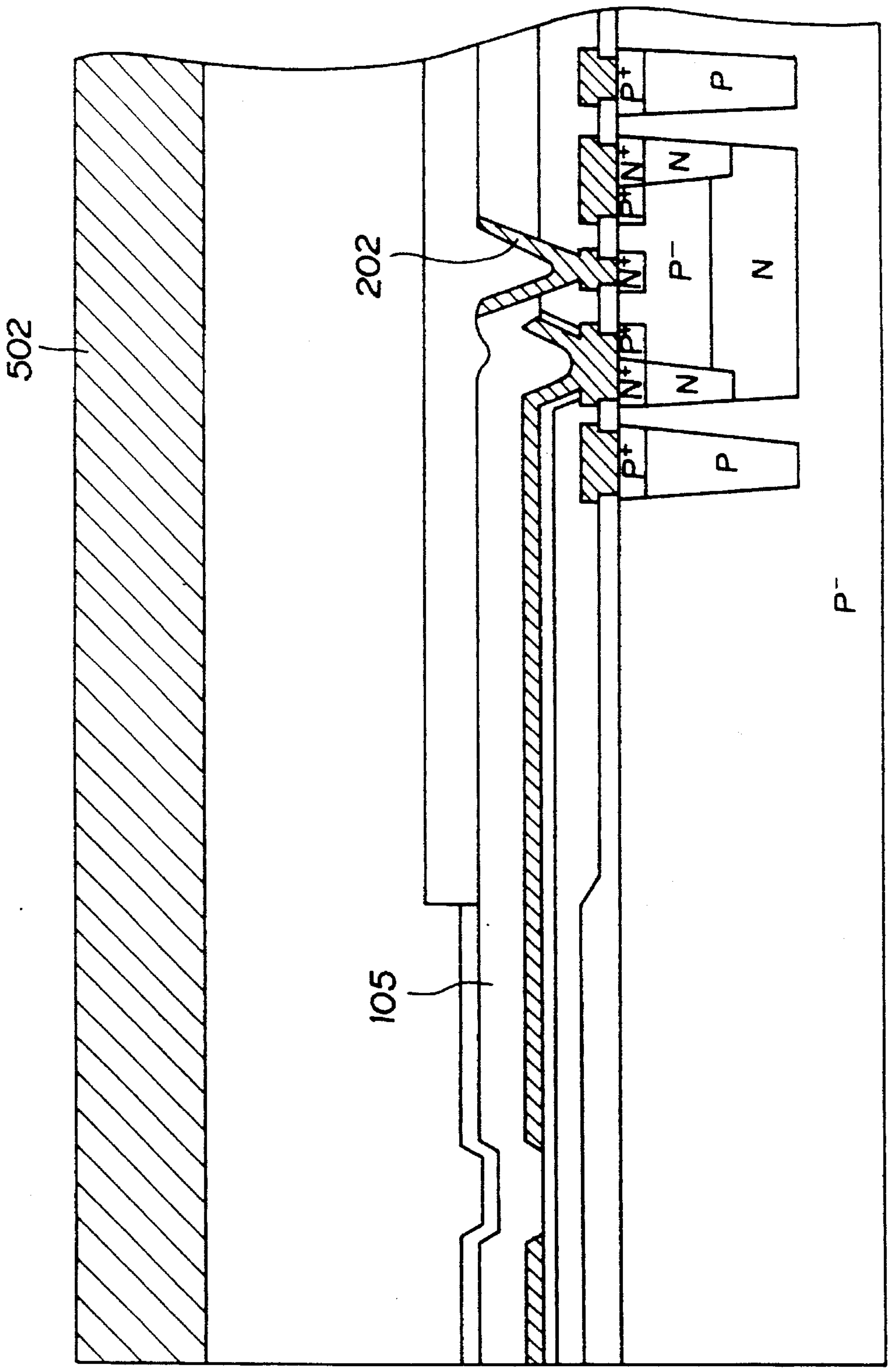

(7) On the substrate having electrothermal converting elements and semiconductor elements thus constructed, the partition member for forming the ink discharging portion and the top plate 52 were disposed, thereby fabricating the recording head inside of which ink passages were formed (see FIG. 4G).

A recording operation test was carried out with regard to such a recording head by connecting the electrothermal converting elements in a matrix form, and by driving them block by block. In the operation test, eight semiconductor diodes were connected to one segment, and each diode is supplied with a current of 300 mA (i.e., total current of 2.4 A). No other diodes faultily operated, thus achieving good discharge. Incidentally, the present invention can be applied to an arrangement using PNP transistors.

Figure 5A:
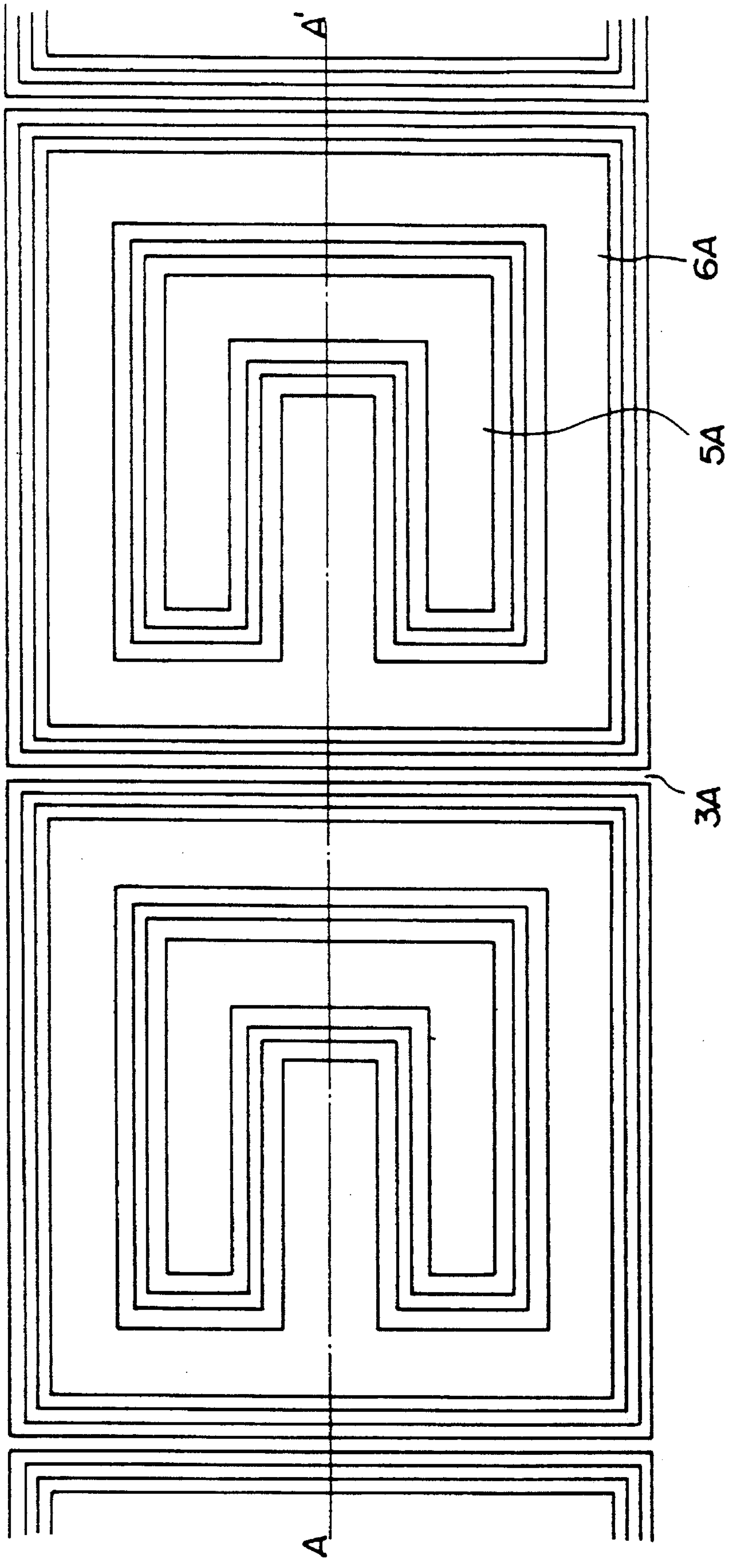
FIGS. 5A and 5B are a plan view and a sectional view, respectively, showing comparative embodiments of the recording head substrate.
Figure 5B:
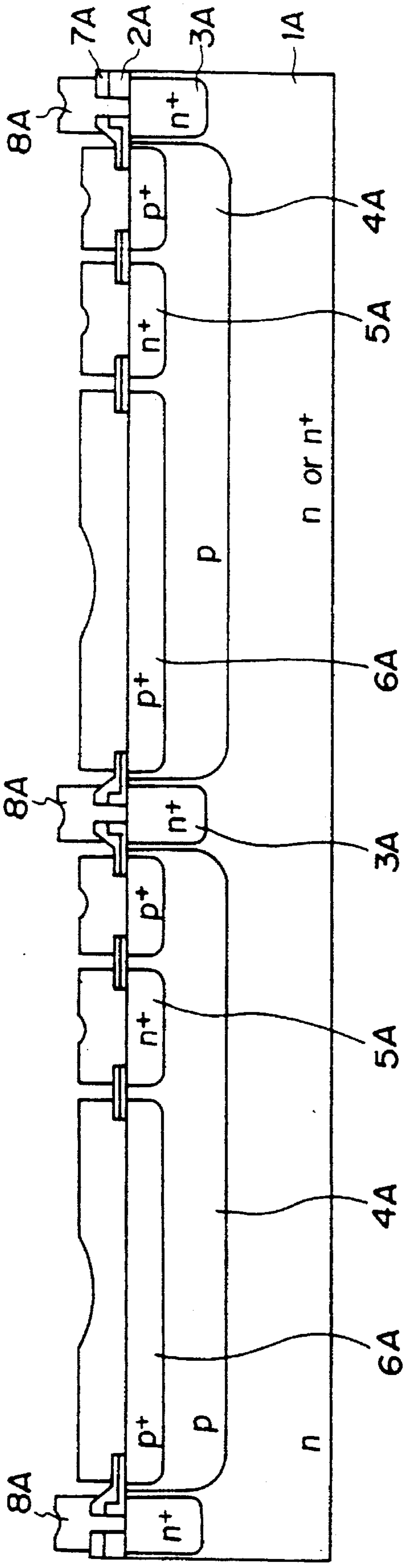
Figure 5C:
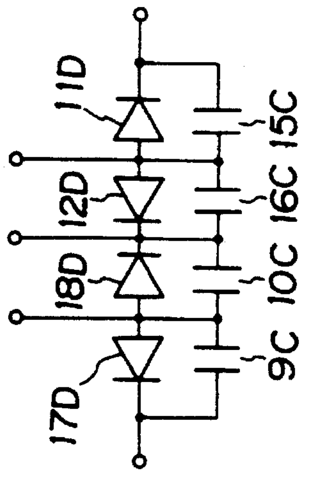
FIGS. 5C and 5D are equivalent circuits of FIGS. 5A and 5B.
Figure 5D:
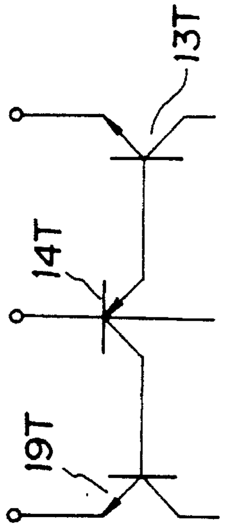

FIGS. 5A and 5B are a plan view and a sectional view along line 5B–5B' in FIG. 5A, respectively showing a comparative example of the recording head, and further FIGS. 5C and 5D are equivalent circuits of FIG. 5B. For simplifying, Al wirings are not shown in FIG. 5A.

In FIGS. 5A and 5B, reference numeral 1A denotes an N type or $N^+$ type silicon substrate plate (hereinafter, named as N type silicon substrate plate) doped with impurities such as phosphorus (P), antimony (Pb) or arsenic (As). Reference numeral 2A denotes an insulation oxide film composed of silicon oxide ($SiO_2$) film formed on the N type silicon substrate plate 1A.

Reference numeral 3A denotes an isolation region formed by the diffusion of impurities, the isolation region 3A is formed for preventing a part of the surface region in the vicinity of the boundary of the adjacent PN junction diodes from converting to P type conduction type, and for ohmic contact with the N type silicon substrate 1A.

Reference numeral 4A denotes a P region (P type anode region) being an anode of the PN junction diode.

Reference numeral 5A denotes an $N^+$ region ($N^+$ type cathode region) being cathode of the PN junction diode.

Reference numeral 6A denotes a $P^+$ region ($P^+$ anode contact region) to be connected with an anode electrode, the region 6A is formed in the P type anode region 4A.

The P type anode region 4A, $N^+$ type cathode region 5A and $P^+$ type anode contact region 6A are formed by the impurity diffusion method or ion implantation method, respectively.

Reference numeral 7A denotes a silicon oxide film ($SiO_2$, PSG or the like) formed by the CVD method.

Reference numeral 8A denotes a wiring formed of conductive material such as Al, Al—Si, Al—Cu—Si or the like.

Next, the equivalent circuits as shown in FIGS. 5C and 5D will be explained.

In FIG. 5C, capacitors 9C and 15C are corresponding to the junction capacity of the P type anode region 4A and the $N^+$ type cathode region 5A. Capacitors 10C and 16C are corresponding to the junction capacity of the P type anode region 4A and the N type silicon substrate plate 1.

While, diodes 11D and 17D are corresponding to the PN junction diode formed with the $N^+$ cathode region 5A and P type anode region 4A, diodes 12D and 18D correspond to the PN junction diode formed with the P type anode region 4A and the N type silicon substrate plate 1A.

The equivalent circuit as shown in FIG. 5D is constructed with bipolar transistors 13T and 19T formed with the P type anode region 4A, $N^+$ type cathode region 5A and N type silicon substrate plate and a bipolar transistor 14T which is formed with the P type anode regions 4A of adjacent PN junction diodes and the N type silicon substrate plate 1A.

The semiconductor device having the aforementioned construction and the equivalent circuits has the following features.

(1) As shown in FIG. 5B, the area of the $N^+$ cathode region 5A is made larger than that of usual construction for reducing the current density at the PN junction to prevent thermal damage due to the current concentration and for making the conductance of the diode higher and making the threshold voltage lower to improve the rectifying characteristic.

(2) As shown in FIG. 5B, $N^+$ cathode region 5A is divided into the plural parts for preventing the current concentration into the cathode edge to prevent the semiconductor device from the thermal damage and to increase the conductance of the diode, and for making the threshold voltage of the diode lower to improve the rectifying characteristic.

(3) Further, the impurity concentration of the P type anode region 4A is made lower so as to its electric resistance becomes 20–30 Ω·cm and its depth is made deeper, the impurity concentration of the N type silicon substrate plate 1A is made lower and the $N^+$ isolation region 3A is formed between the adjacent PN junction diodes. By such constructions, when respective PN junction diodes are driven the malfunction of the respective adjacent PN junction diodes can be prevented.

In more detail, the impurity concentration of the P type anode region is within a range from $1\times10^{15}$ to $10^{17}$ $cm^{-3}$, preferably around $1\times10^{15}$ $cm^{-3}$. The diffusion depth of the P type anode region 4A is 5–10 μm, preferably 8 μm. The impurity concentration of $N^+$ impurity layer 3A is around $1\times10^{21}$ $cm^{-3}$ and its diffusion depth is about 7 μm.

When the cathode is grounded and positive bias voltage is applied on the anode the diode shows forward direction characteristic and the current flows into the diode. While the negative bias voltage is applied on the anode the diode shows the reverse direction characteristic and only the low saturation current can be flowed. Furthermore, in the PN junction diodes array, which includes a plurality of diodes connected in a matrix form with each other, it is necessary to prevent the interference between the adjacent diodes as well as to drive the individual diodes satisfactorily.

However, in the foregoing semiconductor devices, when the potential of the substrate plate 1A is floating state the following problems occur.

When PN junction diode 11D is acting in forward direction, if the anode of the PN junction diode 17D is made in floating state the PNP bipolar transistor 14T and the PN junction diode 17D have equivalent PNPN structure so that a thyristor is constructed. When the thyristor is constructed latching up must be taken into consideration. The trigger for the latching up may be a displace current due to the deviation of the voltage of the power supply or a leak current of the PN junction. Further, the generation of the electron-hole pairs due to irradiation with a light or a radioactive ray can become the trigger. For example, if applying pulses with a shot period on the anode of the PN junction diode 12D when the potential of the active region of the PNP bipolar transistor reach such value as the transistor 14T can be biased for forward direction action, the PNP bipolar transistor 14T is turned on.

When the collector current of the turned on PNP bipolar transistor 14 flows from the anode of the PN junction diode 12D, and the current reaches such a value as to make the PNP bipolar transistor 13T turn on, the potential of the base of the PNP bipolar transistor 14T, which is biased in forward direction already, is increased. Accordingly, a positive feed back which increases the current of the NPN bipolar transistor 19T occurs. Finally, due to the occurrence of the latching up a current is supplied on the cathode of the PN junction diode 14D. Because the device includes the thyristor structure, it is easily affected by noise and the interference between the adjacent diodes easily occurs. That is, when the switching rate of the diode is increased, it functions as a trigger and the latching up easily occurs.

To avoid the aforementioned disadvantages it is considered to make the anode of the PN junction diode 14D floating and to bias the potential of the N type silicon substrate plate to positive.

There are three bias states when applying positive bias potential Vss on the silicon substrate plate 1A. That is, in the first case the relation between Vss and the positive potential $V_H$ applied on the anode of the PN junction diode lid is $V_H$>Vss, in the second case $V_H$=Vss and in the third case $V_H$ <Vss. In any case, the problem is whether the PNP transistor 14T is turned on or not.

When $V_H$>Vss, the forward direction voltage applied on the junction between the emitter and base of PNP bipolar transistor 14T becomes smaller because of the formation of the barrier due to the potential Vss of the N type silicon substrate plate. By this reason, the anti-latching up characteristic increases with an increase of Vss.

When $V_H$=Vss, the forward direction bias potential applied on the junction between the emitter and base balances with Vss so that PNP bipolar transistor 14T is hardly turned on.

When $V_H$<Vss, the junction between the emitter and base is practically biased in negative, and the PNP bipolar transistor 14 is not turned on, so that the current is not supplied on the cathode of PN junction diode 14T and accordingly any malfunction can not be occurred.

However, when the aforementioned devices are used in such state as the substrate plate is exposed, if a positive bias potential is applied on the N type substrate plate 1A it is feared that the following improprieties take place. That is, when the foregoing substrate is utilized for constructing a recording head, in particular an ink jet recording head, ink may contact the substrate plate 1A to draw a current, so that it is feared that the ink becomes inadequate for a recording liquid due to electrolysis or a fine ink outlet is plugged with precipitates.

Figure 6:
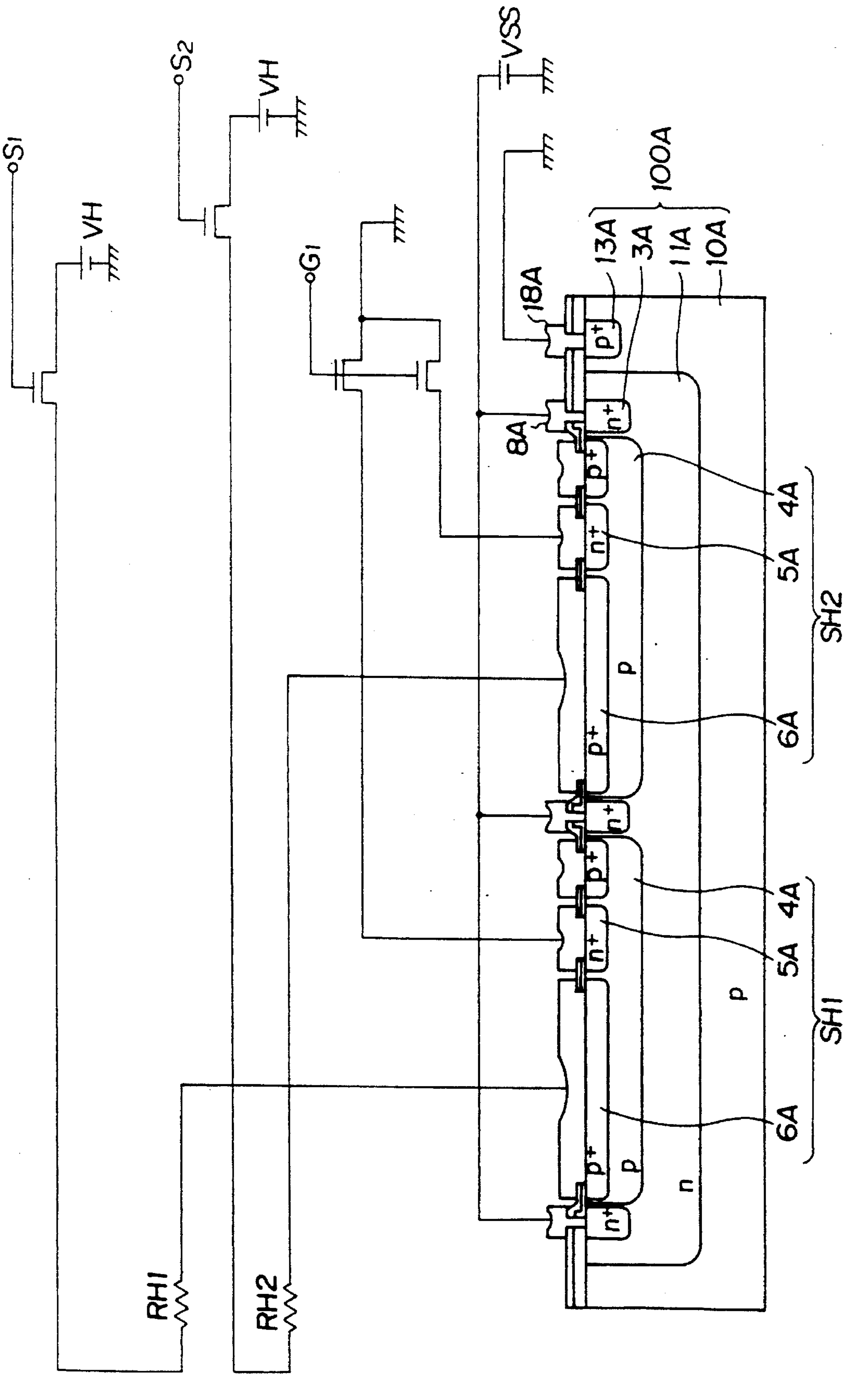
FIG. 6 is a sectional view schematically showing the wiring portion of a third embodiment of the recording head substrate of the present invention.

FIG. 6 shows the third embodiment constructed for resolving the foregoings problems, in FIG. 6, the wirings are also illustrated schematically. The parts having the same function as that of the device as shown in FIG. 5A are shown by the same reference numerals as in FIG. 5A. In this embodiment, on a P type single crystal Si substrate plate 10A, a structure similar to that shown in FIG. 5A is constructed. The P type substrate plate 10A is grounded through a $P^+$ diffusion region 13A and an electrode 18A. An N type common well 11A is formed within the substrate 10A by a diffusion process and maintained positive bias voltage. Anode regions 4A are formed within the well 11A by a diffusion of P type dopant in the well. Cathode regions 5A are formed within the respective anode regions 4A by a diffusion of N type dopant in the anode regions. In accordance with such construction, occurrence of the above-mentioned improprieties due to exposure of the part on which positive potential is applied can be prevented and further the isolation of the transistors or diodes are surely achieved.

Although only two functional elements (cells) are shown in FIG. 6, in practice, for example, 128 devices (cells) are provided in correspondence with 128 electrothermal converting elements and they are electrically connected in a matrix form so that they can be driven block by block. The respective semiconductor regions on the substrate plate 10A are formed by the impurity diffusion processes without using an epitaxial growth process.

Here, the driving of two segments in the same group, that is the driving electrothermal converting elements RH1, RH2 for generating thermal energy utilized for discharging of ink in the ink jet recording head is explained.

For driving the electrothermal converting element RH1, the group is selected with a switch G1 and the electrothermal converting element RH1 is selected with a switch S1 so that positive voltage VH is applied. Then, a diode cell SH1 is positively biased and the current flows out from the cathode. Thus, the electrothermal converting element RH1 generates thermal energies. In the ink jet recording head, the thermal energies thus generated bring a change of state in the recording liquid to generate a bubble and discharge liquid from ink out let.

In the same manner, when driving the electrothermal converting element RH2, the switches G1 and S2 are selectively made on to drive a diode cell SH2 and supply a current on the transducer RH2.

The substrate plate 10A is grounded through the $P^+$ diffusion region 13A and the electrode 18A, and further, positive bias potential is applied on an N type diffusion layer 11 through the $N^+$ impurity layer 3, in accordance with such construction malfunctions due to electrical interferences between the cells are prevented.

A substrate 100A composed of the above-described structures is usable as a heater board in the same manner as the substrate 100 as shown in FIG. 3A.

Production precesses of the third embodiment of the recording head in accordance with the present invention will be explained with reference to FIGS. 7A–7G.

(1) A silicon oxide film with a thickness of 5,000–20,000 Å was formed on the P type silicon substrate plate with a impurity concentration of $1\times10^{12}$–$10^{16}$ $cm^{-3}$.

A portion of the silicon oxide film at which an N type diffusion region 11A should be formed was removed by the photolithography processes.

A silicon oxide film with a thickness of 100–3,000 Å for preventing a damage due to ion implantation was formed on the whole surface of the substrate plate, then N type impurities such as P or As were ion implanted. Subsequently, the substrate plate was heated to form the N type diffusion region 11A with a depth of 15–21 μm due to thermal diffusion.

Next, an oxide film 19A with a thickness of 5,000–10,000 Å for a mask was formed by using a process such as pyrogenetic oxidation ($H_2$+$O_2$), wet oxidation ($O_2$+$H_2O$), steam oxidation ($N_2$+$H_2O$) or dry oxidation. For forming a stacking fault free oxide film, high pressure oxidation at 800°–1,000° C. is preferable.

Figure 7A:
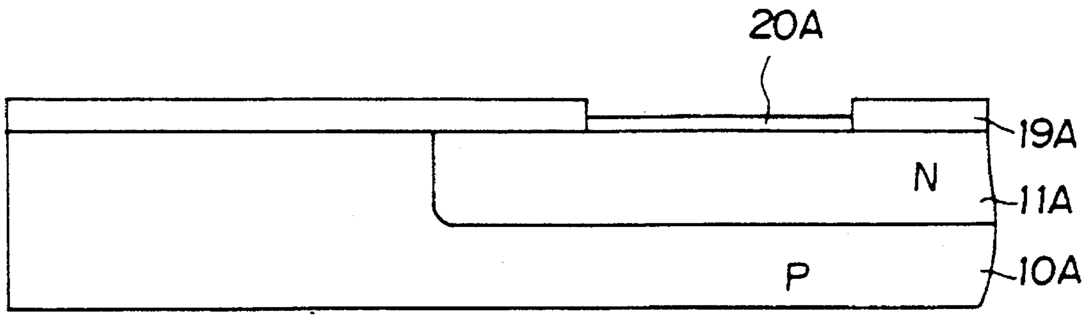
FIGS. 7A–7G are schematic sectional views for explaining a fabrication process of the recording head of the third embodiment.

Next a photoresist was coated and a portion of the oxide film at which anode regions should be formed was removed by etching with the photolithography processes. Subsequently, a buffer oxide film with a thickness of 1,000–2,000 Å was formed. FIG. 7A shows the substrate subjected to the above-described processes.

Figure 7B:
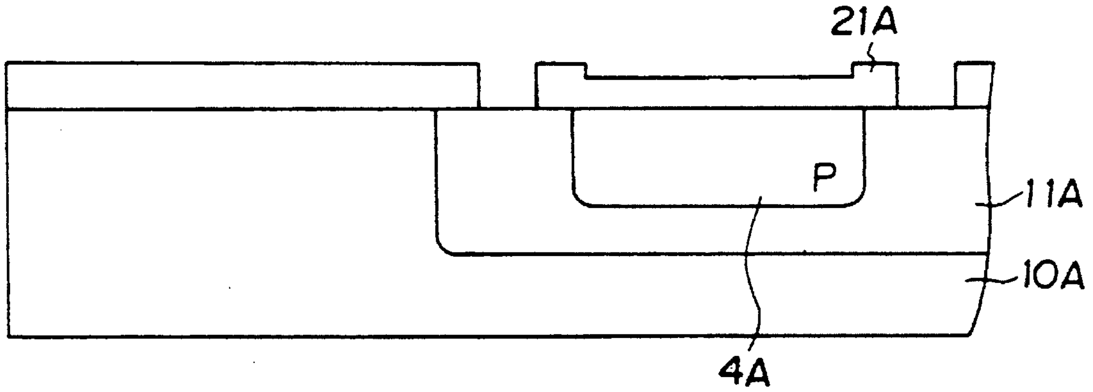

(2) Subsequently, $B^+$ ions generated from $BF_3$ or $BF_2^+$ ions were implanted into the substrate plate. The implanted ion concentration was $5\times10^{12}$–$5\times10^{13}$ $cm^{-3}$. After the ion implantation, ions were thermally diffused under the condition of the temperature of 1,000°–1,100° C. and in $N_2$ atmosphere to form a P anode region 4A with a predetermined depth. Then, thick oxide film 21A was formed on the surface of the substrate plate 10A in $N_2$+$O_2$ atmosphere. Next, portions of the oxide film at which $N^+$ impurity layers 3A should be formed were selectively removed. FIG. 7B shows the substrate subjected to the above-described processes.

The depth of the P anode region 4A was, for example, 5–10 μm. However, for improving withstanding voltages between the anode and the cathode and between the anode and the silicon substrate plate, preferably the depth and the impurity concentration is made lower to such a value as a punching through does not occur. The above situation is effective to reduce the current amplification factor of the PNP bipolar transistor 14T.

Alternately, for forming the anode region, borosilicate glass (BSG) may be deposited on the substrate plate and B may be thermally diffused into a predetermined depth by heating at the temperature of 1,100°–1,200° C.

(3) Next, donor ions were diffused to form $N^+$ layers 3A. The concentration of the donor was preferably $10^{18}$–$10^{21}$ $cm^{-3}$. As a doping method, the diffusion of phosphorus from $POCl_3$ or ion implantation of P ion is usable. In this embodiment, $POCl_3$ is bubbled with a carrier gas of flow rate of 50–200 cc/min for 10–40 minutes to diffuse phosphorus.

Figure 7C:
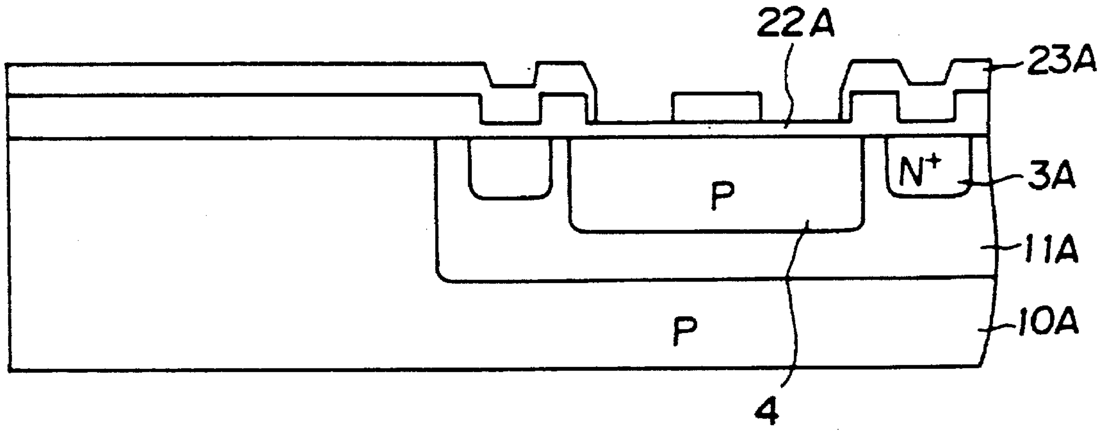

Portions of the oxide film at which an anode region and cathode regions should be respectively formed were selectively removed and a buffer oxide film 22A was formed. Further a photoresist 23A was coated and portions of the photoresist at which anode contact regions must be formed were selectively removed. The state of the substrate is shown in FIG. 7C.

Figure 7D:
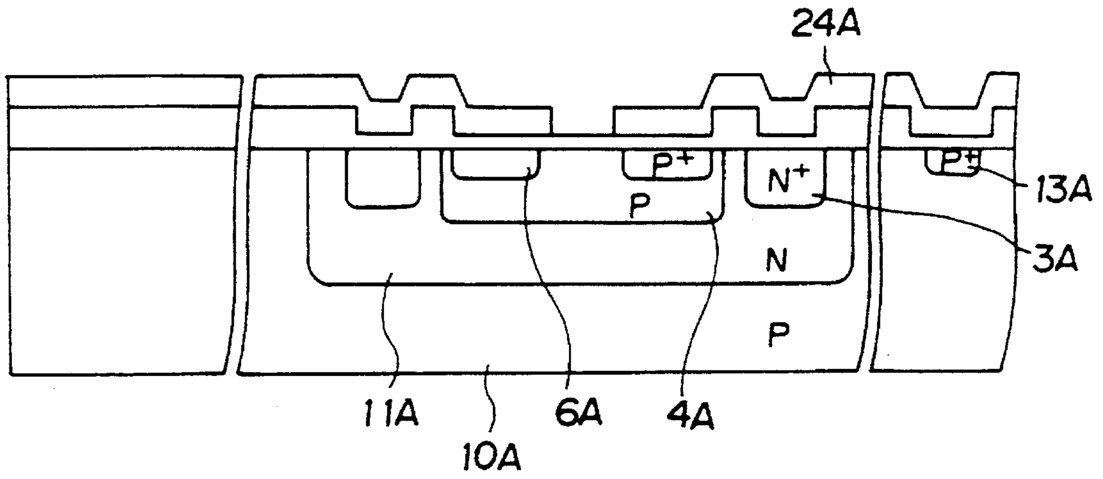

(4) Impurity ions such as B ion were implanted into the regions for anode contact regions 6A and a contact region 13A for the grounding of the substrate plate 10A. After removing of the photoresist 23A the substrate plate was heat-treated to form $P^+$ regions 6A and 13A. Next, a photoresist 24A was coated and a portion at which a cathode region should be formed was removed. Then impurity ions such as P or As were implanted into the portion at which the cathode region should be formed. This state of the substrate is shown in FIG. 7D.

Figure 7E:
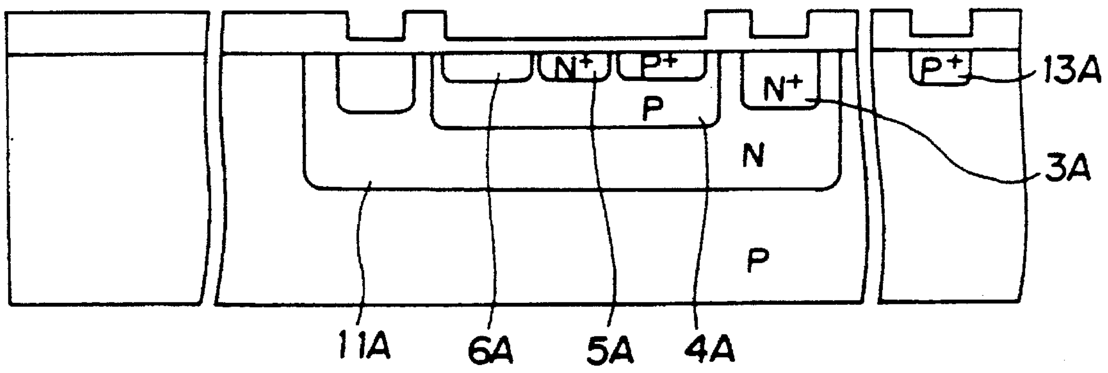

(5) After removing of photoresist 24A, an $N^+$ region 5A was formed by heat treatment as shown in FIG. 7E.

(6) Portions of the silicon oxide film corresponding to the connection of electrodes were removed and Al, Al—Si—Cu alloy or Al—Cu alloy was deposited on the whole surface of the substrate plate, then Al or Al alloy was removed except the electrode regions. Further, wirings for the $N^+$ regions 3A and $P^+$ region 13A were formed.

Next, an $SiO_2$ film 102A with a thickness of 0.4–1.0 μm for heat accumulation and for interlayer insulation was formed on the whole surface by the sputtering method and parts of the film 102A corresponding to the $N^+$ region 5A and $P^+$ region 6A together with the buffer oxide film. Alternately, the $SiO_2$ film may be formed by the CVD method.

Next, portions of the insulation film 102A corresponding to the anode 6A and the cathode 5A are opened by the photolithography processes.

Next, $HfB_2$ or the like for heat generating resistance layer 103A with a thickness around 1,000 Å was deposited.

Furthermore, a layer composed of Al, Al—Si—Cu alloy or Al—Cu alloy as one pair of electrode 104A and 104'A for the electrothermal converting element, as a cathode electrode 201'A of the diode and as a wiring 202A for the anode electrode was deposited and was patterned.

Subsequently, an $SiO_2$ film 105A as a protective layer of the electrothermal converting element and as an insulation layer between the wirings was deposited by the sputtering method.

Figure 7F:
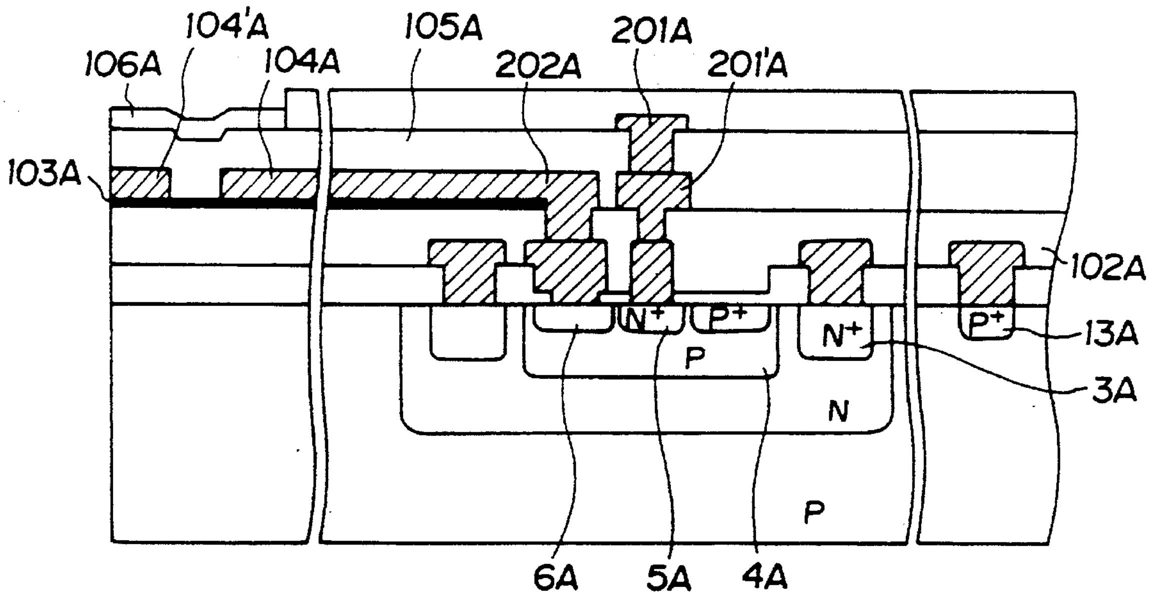

After a contact hole was opened on the cathode electrode a wiring 201A for the cathode electrode was formed. A Ta layer with a thickness of around 2,000 Å as a protection layer 106A for improving cavitation resistance was formed on the heat generation portion of the electrothermal converting element. Further, a photosensitive polyimide layer was formed on the $SiO_2$ film 105A and the wiring 201A for the cathode electrode, as shown in FIG. 7F.

Figure 7G:
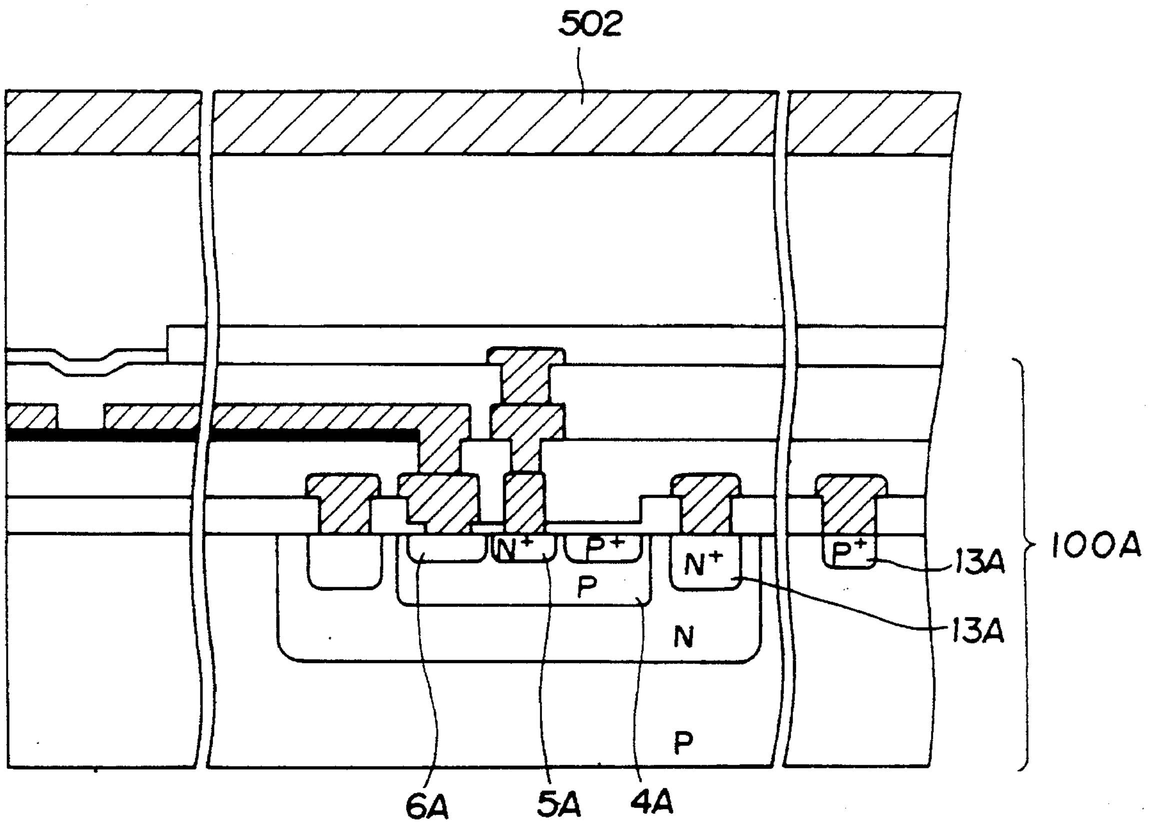

(7) As shown in FIG. 7G, the substrate 100A comprising thus produced electrothermal converting elements and semiconductor devices was provided with partition members and top plate 52 for forming an ink outlet. Thus, a recording head including an ink passage therein was produced.

In the above-described processes, a silicon oxide film ($SiO_2$ or PSG) may be arranged between the insulation layers.

Figure 8A:
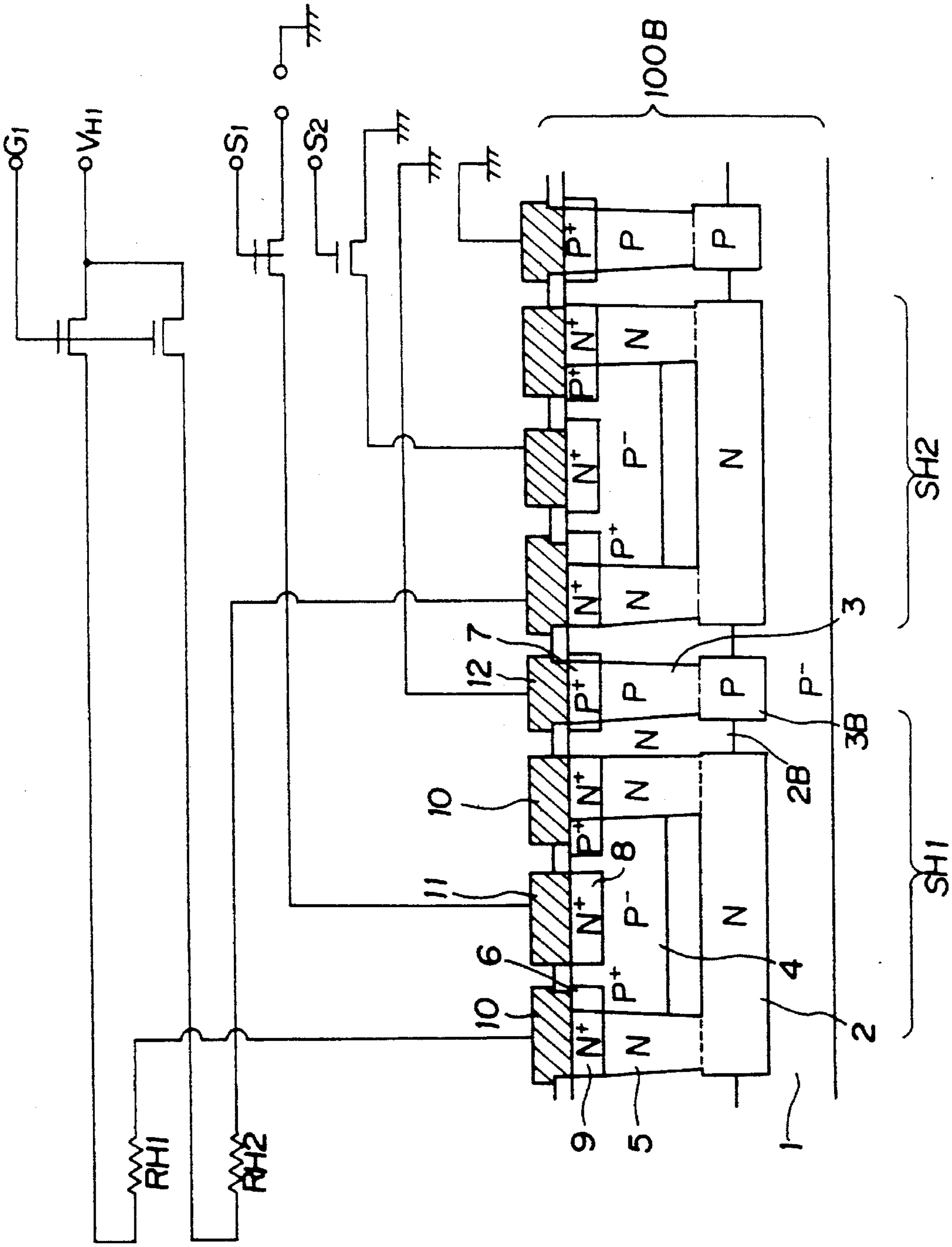
FIGS. 8A and 8B are sectional views schematically showing the wiring portion of fourth and fifth embodiments of the recording head substrate of the present invention, respectively.

FIGS. 8A is a schematic cross-sectional view showing the fourth embodiment of the recording head in accordance with the present invention. The differences between this embodiment and the embodiment as shown in FIG. 2A are an existence of an N type epitaxial layer 2B and a design of the PN junction area, hereinafter. The substrate plate 1 is grounded through the isolation electrode 12, isolation regions 3, 3B and 7. Since the isolation regions 3, 3B and 7 between the respective semiconductor devices (cells) are grounded, the malfunctions due to an electrical interference between cells can be prevented. The equivalent circuit of this embodiment is identical with the circuit as shown in FIG. 2B.

The electrothermal converting element can be driven in the same manner as explained with reference to FIG. 2A.

Figure 8B:
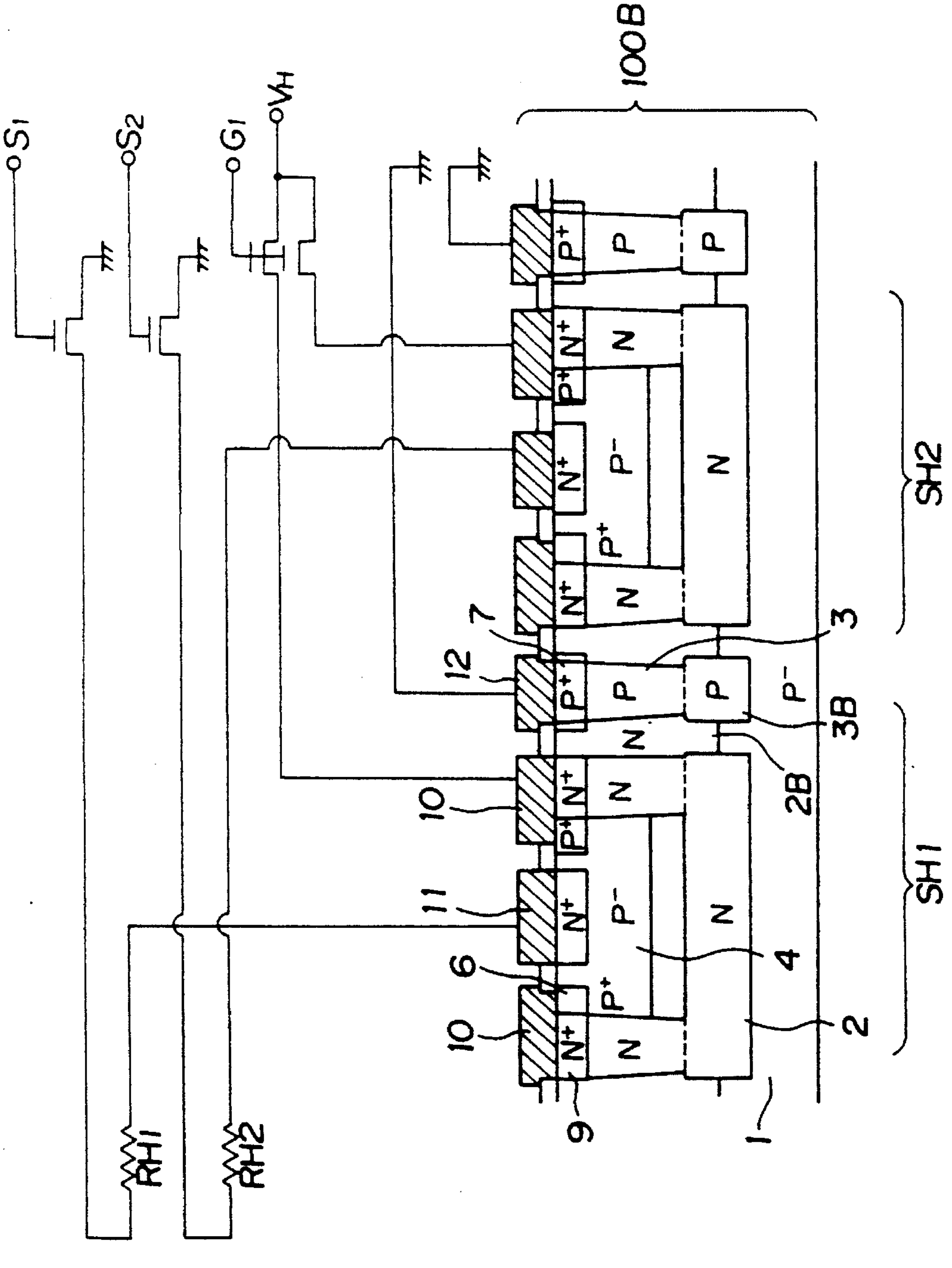

FIG. 8B is a schematic sectional view of the fifth embodiment of the recording head. In this embodiment, the electrical connection is changed from the manner as shown in FIG. 8A to the manner as shown in FIG. 2C. The other construction of FIG. 8B is the same as FIG. 8A. The equivalent circuit of this embodiment is identical with the circuit as shown in FIG. 2D.

The emitter junction area of this embodiment is $5\times10^{-5}$ $cm^2$ or more under the drive operation using 200 mA or more drive current, or $1\times10^{-4}$ $cm^2$ or more under the drive operation using 300 mA or more drive current.

In the fourth and fifth embodiments, since the base and collector are shorted the deviation of the characteristics of the devices are very small and the stable driving current can be obtained. In these embodiments, the isolation electrode 12 is grounded so that the electric charge is prevented from flowing into adjacent cells, accordingly the malfunctions of the adjacent cells can be prevented.

In the semiconductor devices described just above, it is preferable that the impurity concentrations of the N type collector buried region 2 and the base region 5 are not less than $1\times10^{19}$ $cm^{-3}$ and $5\times10^{14}$–$5\times10^{7}$ $cm^{-3}$, respectively, and the junction area between the highly doped base region 8 and the electrode is made as small as possible. By constructing a semiconductor device in the above-mentioned manner, the occurrence of the lack current which flows from the NPN transistor to the ground via the P type silicon substrate plate 1 and the isolation region can be prevented.

Figure 9:
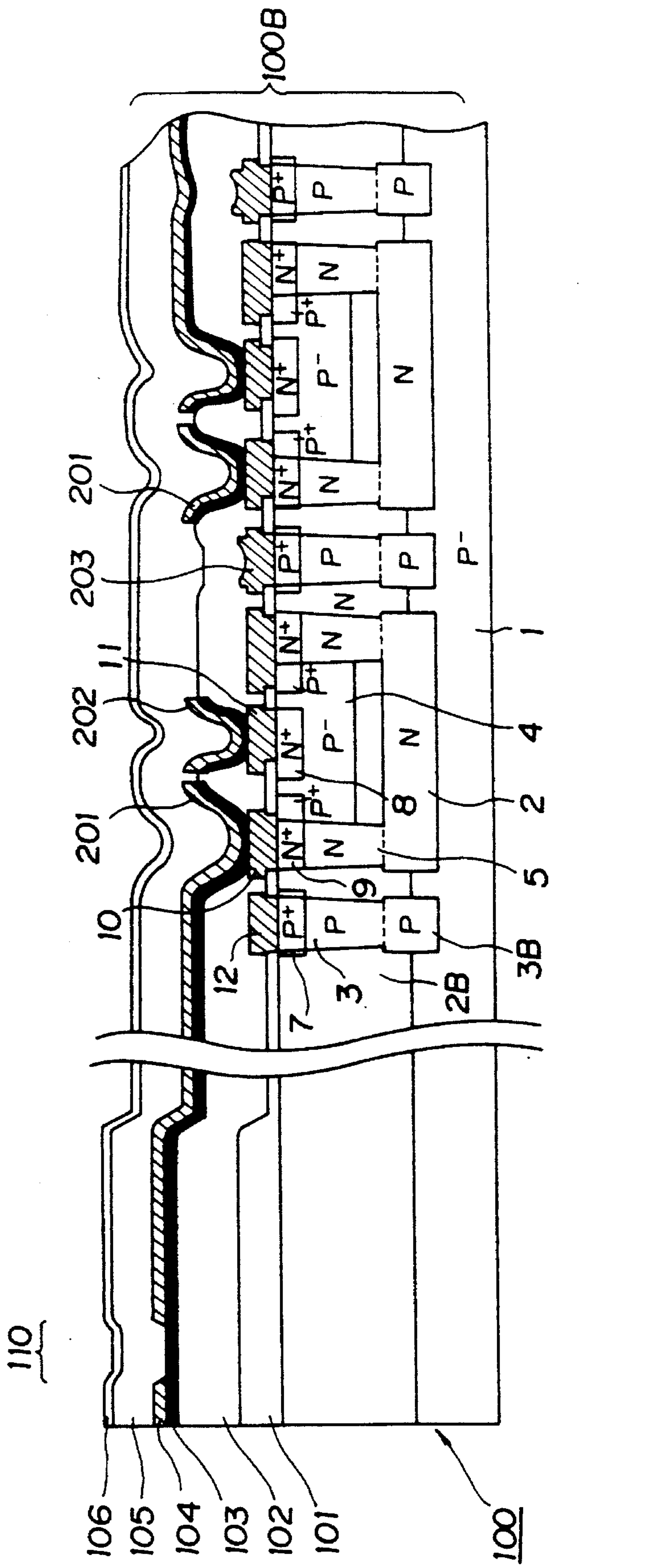
FIG. 9 is a fragmentary sectional view of the fourth embodiment of the recording head of the present invention.

FIG. 9 is a schematic cross-sectional view showing the substrate for the fourth embodiment of the recording head including wiring portions. The substrate 100B is used as a heater board for the recording head as shown in FIG. 3A.

With reference to FIGS. 10A–10K, the production processes of this embodiment will be explained.

(1) A silicon oxide film with a thickness of 5,000–20,000 Å was formed on the surface of a P type silicon substrate plate 1 with an impurity concentration of $1\times10^{12}$–$10^{16}$ $cm^{-3}$.

Portions of the silicon oxide film at which collector buried regions 2 of each cell were removed by the photolithography processes.

After a silicon oxide film was formed, N type impurities, for example, P or As, were ion implanted and the N type collector buried regions 2 with an impurity concentration of not less than $1\times10^{19}$ $cm^{-3}$ and a depth of 10–20 μm were formed by the thermal diffusion. The sheet resistance of the N collector buried regions were not higher than 30 Ω/□.

Figure 10A:
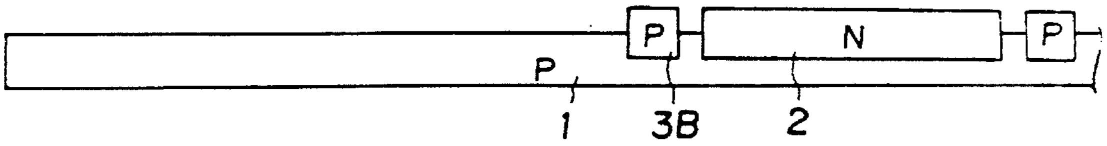
FIGS. 10A–10K are schematic sectional views for explaining a fabrication process of the recording head of the fourth embodiment.

Subsequently, portions of the oxide film at which P type isolation buried regions 3B should be formed were removed and further an oxide film with a thickness of 100–3,000 Å was formed. Then, P type impurities, for example B, were ion implanted and the P type isolation buried regions 3B with an impurity concentration of $1\times10^{17}$–$10^{14}$ $cm^{-3}$ were formed by the thermal diffusion, as shown in FIG. 10A.

Figure 10B:
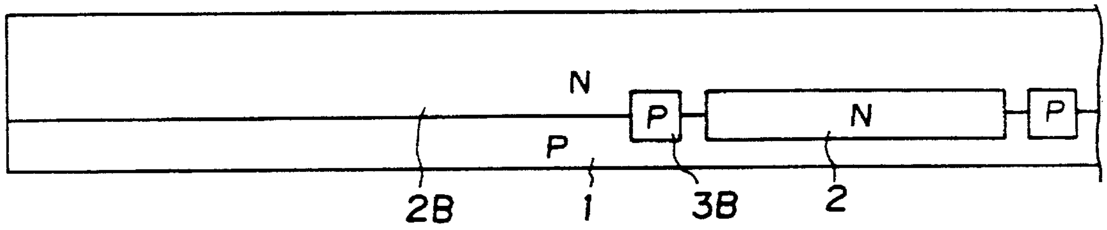

(2) After the whole oxide film was removed, an N type epitaxial layer 2B with an impurity concentration of $1\times10^{12}$–$10^{16}$ $cm^{-3}$ and a thickness of 5–20 μm was epitaxially grown, as shown in FIG. 10B.

(3) Next, a silicon oxide film with a thickness of 100–300 Å was formed on the surface of the N type epitaxial layer, a photoresist was coated on the oxide film and patterned. Then, P type impurities were ion implanted into only the regions at which low doped base regions 4 should be formed. After removing the photoresist, the lowly doped P type base regions 4 with an impurity concentration of $5\times10^{14}$–$5\times10^{17}$ $cm^{-3}$ and a depth of 5–10 μm were formed by the thermal diffusion.

Figure 10C:
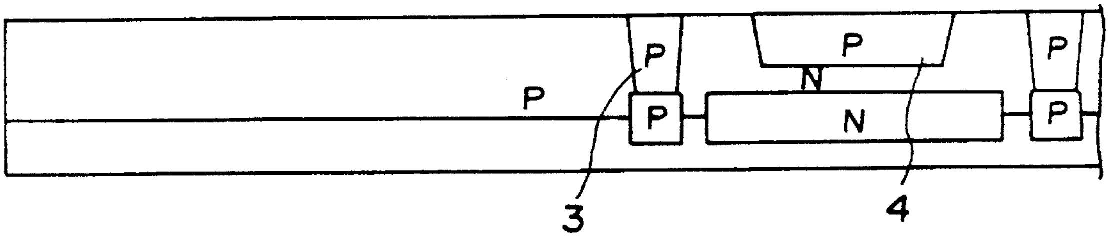

After the whole oxide film was removed and a silicon oxide film with a thickness of 1,000–10,000 Å was formed, portions of the oxide film at which P type isolation regions 3 should be formed were removed. Next, a BSG film was deposited on the whole surface by the CVD method. Further, by the thermal diffusion the P type isolation regions 3 with an impurity concentration of $1\times10^{18}$–$10^{20}$ $cm^{-3}$ and a depth of 10 μm were formed to reach the P type isolation buried regions 3B, as shown in FIG. 10C.

Alternately, $BBr_3$ may be used as a diffusion source.

(4) After the BSG film was removed, a silicon oxide film with a thickness of 1,000–10,000 Å was formed, and further, after removing portions of the oxide film at which N type collector regions 5 should be formed a PSG film was formed and P is thermally diffused or alternately $P^+$ ions were ion implanted to form the N type collector regions 5 so as to reach the collector buried regions 2. The sheet resistance of the collector regions 5 was not higher than 10 Ω/□. The depth of the collector regions 5 was about 10 μm and their impurity concentration was $1\times10^{18}$–$10^{20}$ $cm^{-3}$.

Figure 10D:
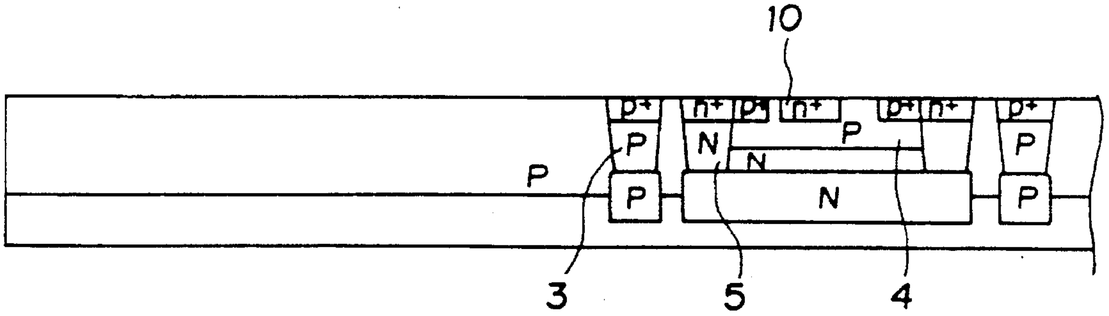

Subsequently, after removing portions of the oxide film corresponding to the cell regions, a silicon oxide film with a thickness of 100–300 Å was formed, a photoresist was coated on the oxide film and patterned and ions of P type impurity were ion implanted into only the regions at which highly doped base regions 6 and highly doped isolation regions 7 should be formed. After the photoresist was removed, portions of the oxide film at which N type emitter regions 8 and highly doped N type collector regions 9 should be formed were removed, and a PSG film was formed on the whole surface or P ions were ion implanted. Then, by thermal diffusion the highly doped P type base regions 4, highly doped P type isolation regions 7, N type emitter regions 8 and highly doped N type collector regions 9 were formed at the same time. The depths and the impurity concentrations of the respective regions were not larger than 1.0 μm and within the range of $1\times10^{19}$–$10^{20}$ $cm^{-3}$, respectively. The junction between the emitter region 8 and the base region 4 had an area of $5\times10^{-5}$–$5\times10^{-4}$ $cm^2$. This state of the substrate is shown in FIG. 10D.

Figure 10E:
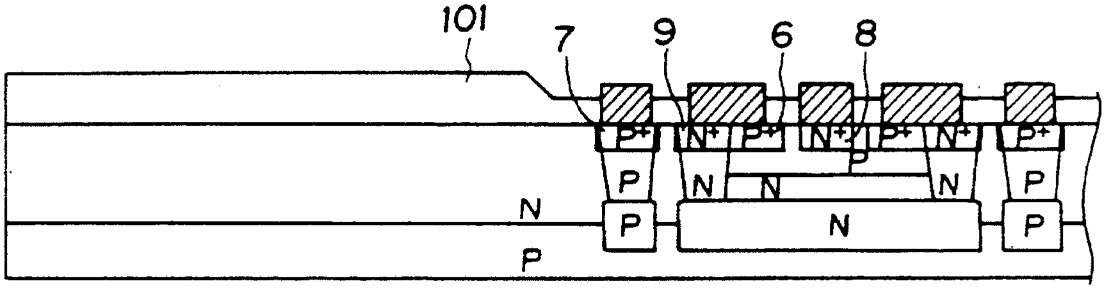

(5) After a silicon oxide film 101 was formed, portions of the silicon oxide film corresponding to the connection portions of the electrodes were removed. Then Al or the like is deposited on the whole surface and Al or the like was removed except the electrode regions. This state of the substrate is shown in FIG. 10E.

(6) An $SiO_2$ film with a thickness of 0.4–1.0 μm for a heat accumulation layer and an inter layer insulation film was formed on the whole surface by the sputtering method. This $SiO_2$ film may be formed by the CVD method.

Figure 10F:
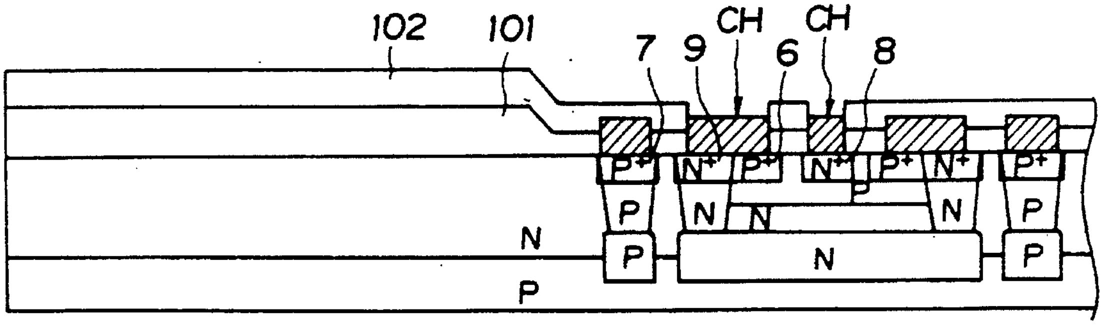

Next, portions CH of the insulation film 102 corresponding to the emitter regions, and base collector regions are opened for electric contact by the photolithography processes as shown in FIG. 10F.

Figure 10G:
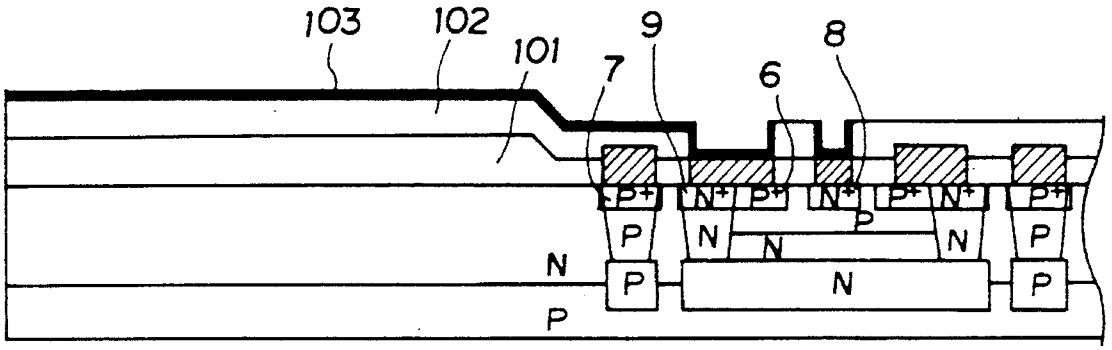

(7) Next, an $HfB_2$ film with a thickness of around 1,000 Å as a heat generating resistance layer was deposited on the $SiO_2$ film 102, the electrodes on the emitter regions and the electrodes on the base.collector regions were formed and patterned as shown in FIG. 10G.

Figure 10H:
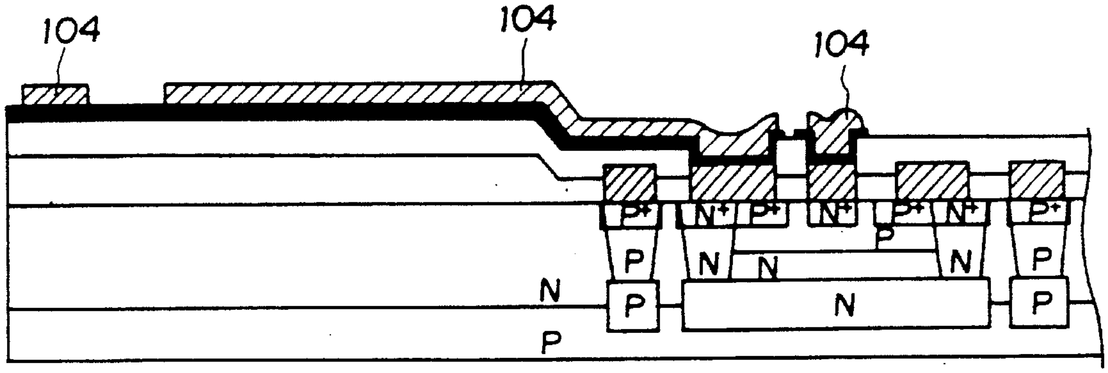

(8) A layer composed of Al as a pair of electrodes 104 of the electrothermal converting element, a wiring 202 for the cathode electrodes and a wiring 201 for the anode electrode of the diode was deposited and patterned to form wirings of the electrothermal converting element and the others at the same time, as shown in FIG. 10H.

(9) Then, the layer composed of the same material as that of the heat resistance layer 103 was formed between the semiconductor device and the Al electrode to be connected electrically.

Figure 10I:
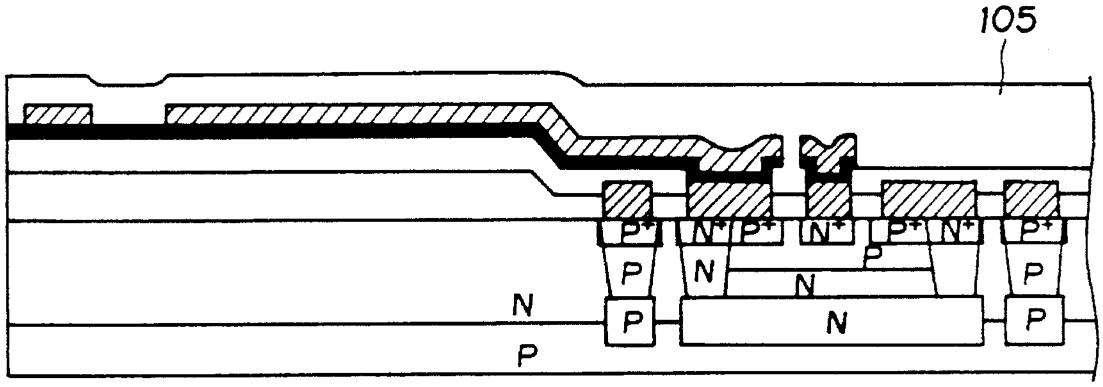

After that, an $SiO_2$ film 105 as a protection layer of the electrothermal converting element and as an insulation layer between the Al wirings was formed by the sputtering method, as shown in FIG. 10I.

Figure 10J:
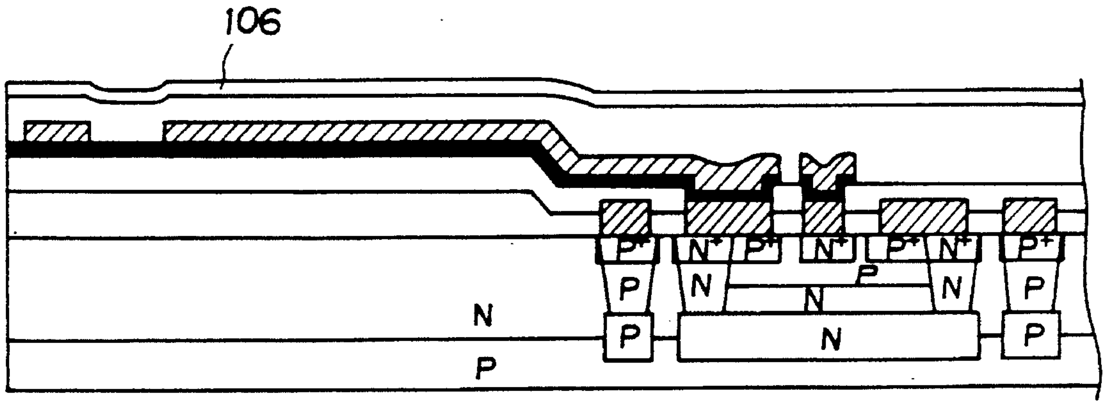

(10) A Ta layer with a thickness of around 2,000 Å as a protection layer 106 for improving the cavitation resistance was deposited on the heat generation portion of the electrothermal converting element, further a photosensitive polyimide layer as a protection layer was formed on the other portions. This state of the substrate is shown in FIG. 10J.

Figure 10K:
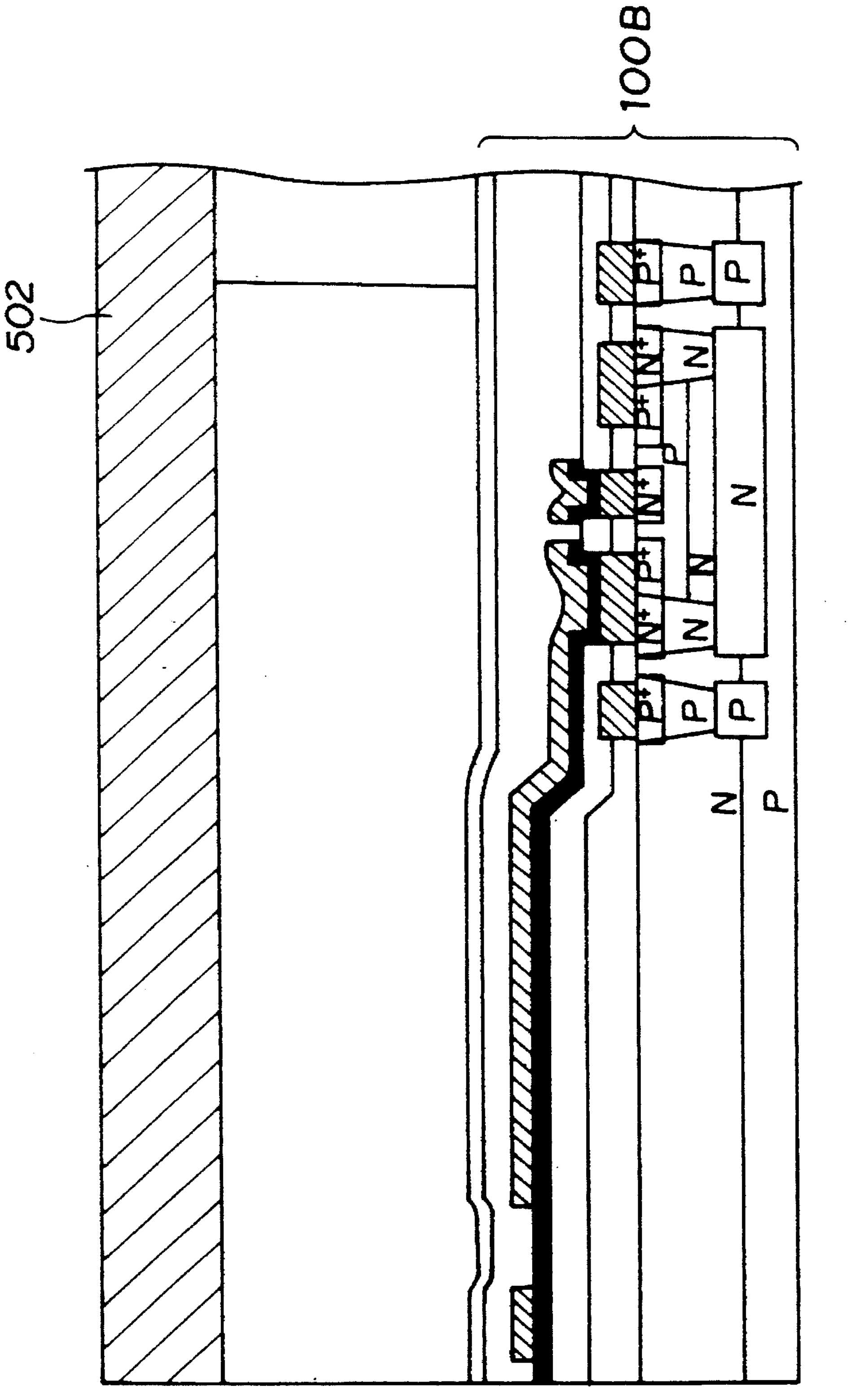

(11) As shown in FIG. 10K, the substrate 100B comprising thus produced electrothermal converting elements and semiconductor devices was provided with partition members and top plate 52 for forming an ink outlet. Thus, a recording head including an ink passage therein was produced.

In this embodiment, the $HfB_2$ layer exists on the emitter electrode and on a part of the base.collector common electrode, while since the short circuiting may occur at the thin emitter region the layer composed of the same material as that of the heat generating resistance must exist at least on the emitter electrode for preventing the short circuiting.

Although in this embodiment the epitaxial growth method is used for forming the N type region 2B, it is preferable that the impurity diffusion method is used for the formation of this region 2B as explained in the previous embodiments.

The recording heads of the fourth embodiment were produced and their electrothermal converting elements were block driven for testing the recording operation characteristics. In the test, when eight diodes were connected in one segment and the current of 300 mA were flowed into each diode (total current of 2.4 A) the other diodes ejected ink normally without malfunctions.

Naturally, this embodiment can be applied to head including PNP junction transistors construction.

The ink jet recording heads were produced in accordance with the processes described just above and the thermal heads using the diode produced by the aforementioned processes were produced.

The various substrates including respective diodes of different types regarding to the emitter junction area were produced. That is, the emitter junction areas of diodes were varied in sixteen types, namely, $5\times10^{-7}$, $5\times10^{-6}$, $8\times10^{-6}$, $1\times10^{-5}$, $2\times10^{-5}$, $3\times10^{-5}$, $5\times10^{-5}$, $7\times10^{-5}$, $8\times10^{-5}$, $9\times10^{-5}$, $1\times10^{-4}$, $2\times10^{-4}$, $3\times10^{-4}$, $5\times10^{-4}$, $1\times10^{-3}$, $5\times10^{-2}$ (in units of $cm^2$).

By using above-mentioned substrates, eight ink jet recording heads, per one type of the diode, each including sixty four ink discharging outlets were produced and also eight thermal heads, per one type of the diode, each including sixty four heat generation elements were also produced. With these recording heads, ink jet recording and thermal recording were operated continuously during one hour and the deviations of the recording dots per each pixel were estimated. The results are shown in Table 1.

Figure 11A:
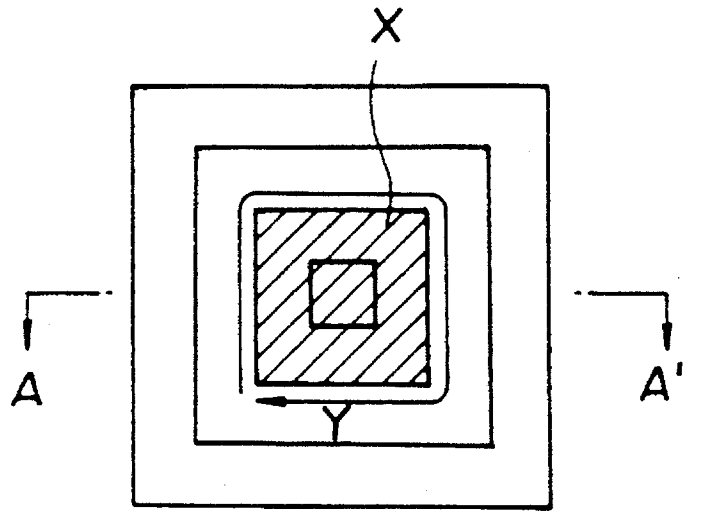
FIGS. 11A and 11B are schematic views for explaining the emitter junction area.
Figure 11B:
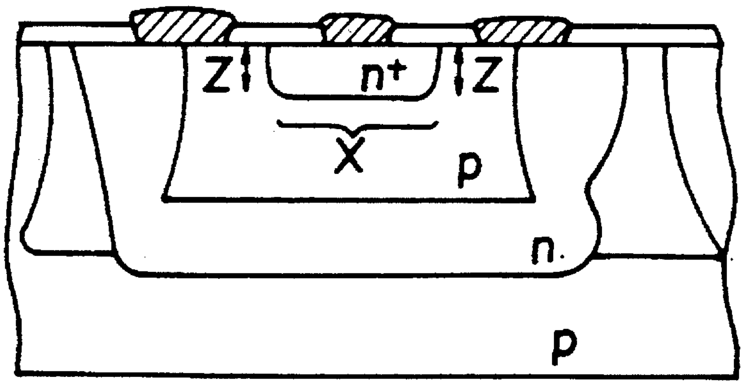

As shown in FIG. 11A, which is a plan view of the diode, and in FIG. 11B, which is a sectional view along the line 11B–11B' in FIG. 11B, the emitter junction area is an area denoted by X (hatched region), the emitter junction length of this region is Y. When the area denoted by Z (side portion) is added the emitter junction area increases by about 10%. In Table 1, "I/J" and "thermal" denote the ink jet recording head and the thermal head, respectively.

The evaluation was made in the following manner, for ink jet recording, that is, as to all dots ejected from one ink ejection outlet and that reach the recording paper, the distances between the individual dots were measured and when the maximum value of the distance is within the reference value the outlet was judged as accepted, while when the maximum value of the distance is beyond the reference value the outlet was judged as rejected. In Table 1, the head group including eight heads and all outlets of which were judged as accepted is indicated with the letter A. When among eight heads of the group one or two heads include each one or more outlets judged as rejected this group is indicated with the letter B. When three or four heads of the group include each one or more outlets judged as rejected this group is indicated with the letter C. Finally, when five or more heads of the group include each one or more outlets judged as rejected this group is indicated with the letter D. In the case of the thermal head, since the color reaction occurs due to the contact of the head with the thermal recording paper the deviation of the dot is not founded. In Table 1 at column of "thermal" the letter D indicates something unusual such as no coloring. From the comparison with the thermal head it can be understood that in the case of the ink jet recording head the quality of the recorded image is deteriorated not only due to the damage of the diodes but also it is affected by the ink ejection characteristics of the head.

Reference numeral 1200 denotes a distribution substrate connecting to the heater board 100, containing wirings to the heater board 100 (both ends of the wirings, for example, are fixed by wire bonding) and pads 1201 located at one end of the wiring from the heater board for transferring electric signals from the host apparatus of the recording system.

Reference numeral 1300 denotes a top plate with grooves which has separation walls for defining individual ink passages, a common fluid reservoir and so on. The top plate is a molded unit with an ink inlet 1500 for pouring ink supplied from the ink tank IT into the common fluid reservoir and an orifice plate 400. Though the preferable material for the molded unit is polysulfone, another kind of molding resin is acceptable to be used.

TABLE 1

| | | $5 \times 10^{-7}$ | $5 \times 10^{-6}$ | $8 \times 10^{-6}$ | $1 \times 10^{-5}$ | $2 \times 10^{-5}$ | $3 \times 10^{-5}$ | $5 \times 10^{-5}$ | $7 \times 10^{-5}$ |
|---|---|---|---|---|---|---|---|---|---|
| 300 mA | I/J | D | D | D | D | D | D | D | D |
| | Thermal | D | D | A | A | A | A | A | A |
| 200 mA | I/J | D | D | D | D | C | C | A | A |
| | Thermal | D | A | A | A | A | A | A | A |

| | | $8 \times 10^{-5}$ | $9 \times 10^{-5}$ | $1 \times 10^{-4}$ | $2 \times 10^{-4}$ | $3 \times 10^{-4}$ | $5 \times 10^{-4}$ | $1 \times 10^{-3}$ | $5 \times 10^{-3}$ |
|---|---|---|---|---|---|---|---|---|---|
| 300 mA | I/J | D | C | A | A | A | B | C | C |
| | Thermal | A | A | A | A | A | A | A | A |
| 200 mA | I/J | A | A | A | A | A | B | C | C |
| | Thermal | A | A | A | A | A | A | A | A |

The followings is embodiment of an equipment equipped with the recording head of the present invention.

FIG. 12 through FIG. 16 shows each of an ink jet unit IJU, an ink jet head IJH, an ink tank IT, an ink jet cartridge IJC, a main part of an ink jet recording system IJRA and a carriage HC and their relationship with which the recording head with its structure described above is embodied suitably. In the following descriptions, each component structure of the ink jet recording system is explained with these drawings.

Figure 12:
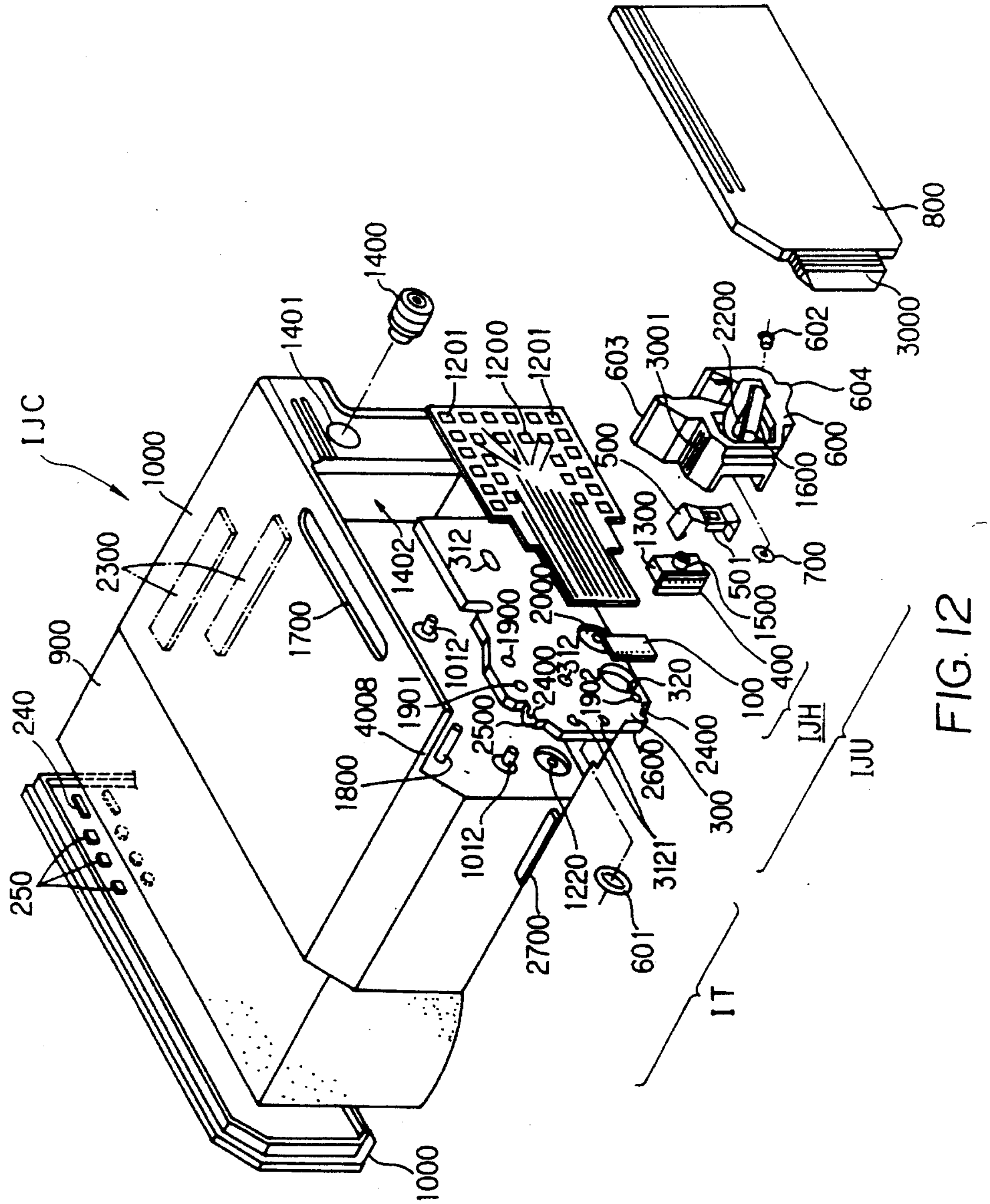
FIG. 12 is an exploded perspective view showing an arrangement of a cartridge which can be constructed by using the recording head of the present invention.

The ink jet cartridge IJK in this embodiment, as apparent in FIG. 12, has a large capacity for receiving ink and has such a shape that a portion of an ink jet unit IJU sticks out from the front face of the ink jet tank IT. This ink jet cartridge IJC is fixed and supported by locating means and electric contacts described later, or the carriage HC as shown in FIG. 16 which is mounted in the ink jet recording system IJRA. In addition, this ink jet cartridge is an exchangeable type, that is, it can be set on and detached from the carriage HC. In FIG. 12 through FIG. 16, some inventions arisen in the progress of establishing this invention may be found in the structures of each of the components. Along with brief descriptions of these structures of each components, the overall picture of the ink jet recording system IJRA is disclosed below.

(i) Description of the construction of the ink jet unit IJU

The ink jet unit IJU in this embodiment is a recording unit using an ink ejection mechanism for recording information in terms of characters and visual images, by using electrothermal converting elements generating thermal energy to make film boiling take place in the ink in response to input electric signals.

In FIG. 12, reference numeral 100 denotes a heater board or substrate as shown in FIG. 2A, FIG. 6 or FIG. 8A. The heater board 100 is composed of electrothermal converting elements (ejection heaters) arranged in an array geometry on a silicon substrate plate and electric wiring supplying power to the transducers formed with a film forming technology.

Reference numeral 300 denotes a support member, for example, made of metal, supporting the reverse side of the distributing substrate 1200 by meeting their flat faces together, defining a bottom of the ink jet unit IJU. Reference numeral 500 denotes a rebound spring shaped like a letter M. The rebound spring 500 holds the fluid reservoir by pressing it at the center of the letter M and at the same time its apron portion 501 also presses a portion of ink passage. The heater board 100 and the top plate 1300 are held by the rebound spring 500 with its legs penetrated through holes 3121 on the support member 300 and fixed in the reverse side of the support member 300. That is, the heater board 100 and the top plate 1300 are fixed and contacted to each other by the rebound force generated with the rebound spring 500 and its apron portion 501.

Figure 13:
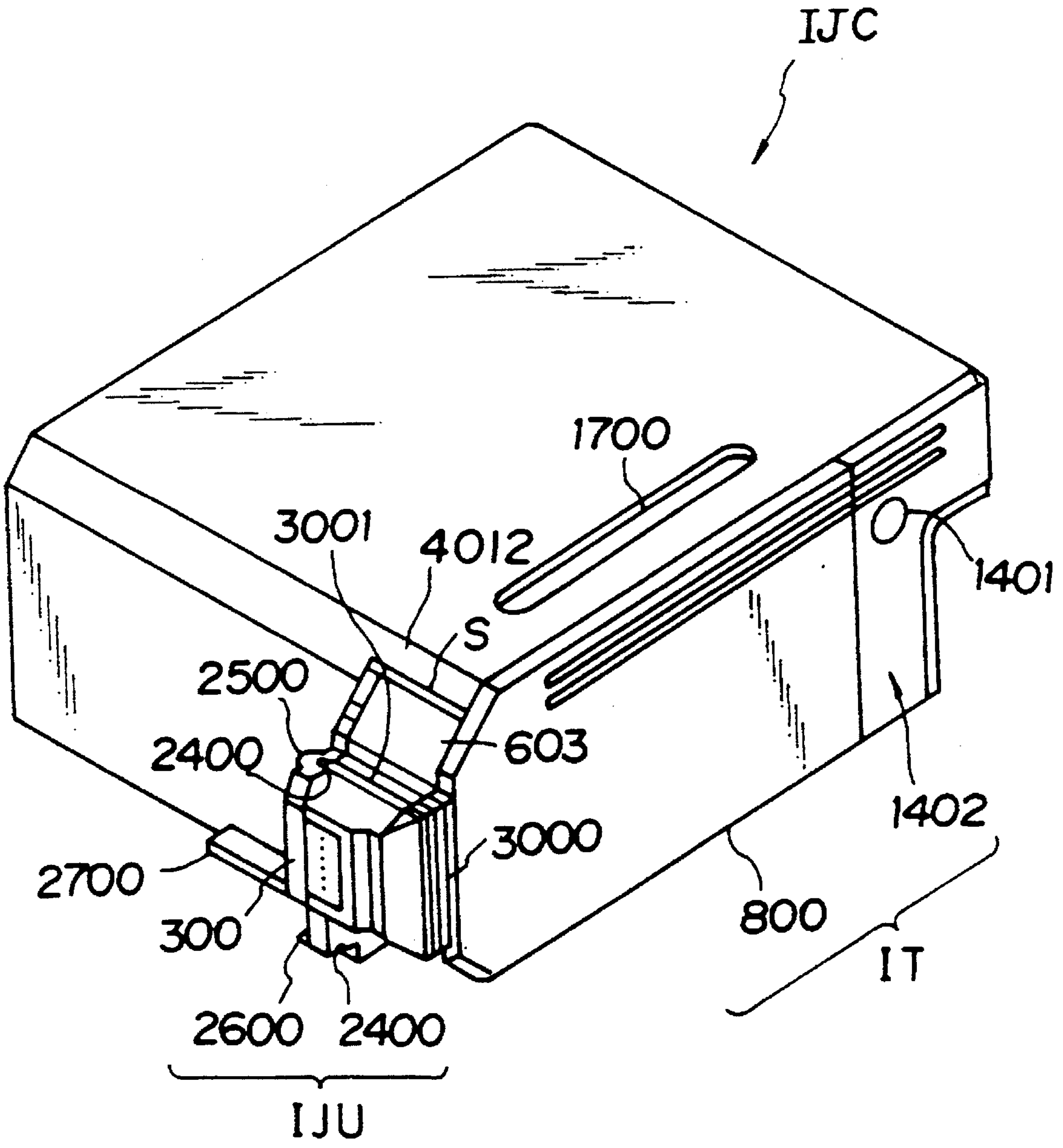
FIG. 13 is an assembly perspective view of FIG. 12.

The support member 300 has locating holes 312, 1900 and 2000 into which two protruding portions 1012 for locating on the side wall of the ink tank IT and protruding portions 1800 and 1801 for locating and supporting by fusion are inserted. The support member 300 has also protruding portions 2500 and 2600 for locating the carriage HC in the ink jet recording system IJRA in a rear side of the support member 300. In addition, the support member 300 has a hole 320 through which an ink supply pipe 2200 makes it possible to supply ink from the ink tank IT as disclosed later. The distributing substrate 1200 is bound on the support member 300 by bonding materials or the like. There are a couple of concave portions 2400 of the support member 300 in the neighborhood of the locating protruding portions 2500 and 2600. The concave portions are also located on the extension of the line from the apex portion of the recording head, three sides of which are defined by portions having a plurality of parallel grooves 3000 and 3001, in the ink jet cartridge IJC as shown in FIG. 13. therefore, the support member 300 makes it possible to keep an unfavorable dust and ink sludge away from the protruding portions 2500 and 2600. On the other hand, as illustrated in FIG. 12, a cover plate 800 with the parallel grooves 3000 forms an outer wall of the ink jet cartridge IJC as well as a space for the ink jet unit IJU. In an ink supply member 600 having other parallel grooves 3001 includes an ink pipe 1600 arranged as a cantilever with its end being fixed at the side of the ink supply pipe 2200 and linked continuously to the ink supply pipe. A sealing pin 602 is inserted in the ink supply pipe 2200 in order to establish a capillary action between the fixed end of the ink pipe 1600 and the ink supply pipe 2200. Reference numeral 601 denotes a packing material for sealing the ink tank IT and the ink supply pipe 2200. Reference numeral 700 denotes a filter placed at the end part of the ink supply pipe 2200 and the side of the ink tank IT.

As the ink supply member 600 is made by a molding method, the supply member is attained at a low cost and is finished with correct dimensions in the molding process practically. Further, in the ink supply member 600, owing to the cantilever structure of the ink pipe 1600, it is possible to keep the stable state of pressure welding the ink pipe 1600 onto the ink inlet 1500 in mass production planning. In this embodiment, under the state of pressure welding the ink pipe 1600 onto the ink inlet 1500, only by pouring a sealing bond into the side of the ink inlet 1500 from the side of the ink supply member 600, it is possible to establish a perfect ink flow path without leakage. The method to fix the ink supply member 600 to the support member 300 is described as in the following steps; (1) to put pins (not shown) at the rear side of the ink supply member 600 into holes 1901 and 1902 on the support member 300 and push out the pins through the holes at the other face of the support member 300, and (2) to make bonding the end portion of the pins onto the rear face of the support member 300 by heat fusion method. The end projection of the pins bonded is contained in a concave portion (not shown in drawings) on the surface of the ink tank IT where the ink jet unit IJU is mounted, and then a location of the ink jet unit IJU is fixed correctly with the ink tank IT.

(ii) Description of the structure of the ink tank IT

The ink tank IT is composed of a body of cartridge 1000, an ink absorber 900 and a cover plate 1100. The cover plate 1100 is used to seal the ink absorber 900 after inserting the ink absorber into the body of cartridge 1000 from the opposite face to the face where the ink jet unit IJU is mounted in the body of cartridge.

The ink absorber 900 is used for absorbing ink and is placed in the body of cartridge 1000. Reference numeral 1220 denotes an ink supply inlet for supplying ink to the ink jet unit IJU comprised of above mentioned components 100 through 600. In addition, the inlet 1220 is also used as an inlet port for pouring ink into the absorber 900 by an ink pouring process prior to mounting the ink jet unit IJU at the portion 1010 of the body of cartridge 1000.

In this embodiment, ink can be supplied into the ink tank IT through either an atmospheric air communication port 1401 or this ink supply inlet 1220. For the purpose of supplying ink into the absorber 900 relatively efficiently and uniformly, it is preferable to supply ink through the ink supply inlet 1220. This is because the empty space only containing air in the ink tank IT, which is formed by ribs 2300 and partial ribs 240 and 250 of the cover plate 1100 in order to attain an efficient ink supply flow from the absorber 900, occupies a corner space communicating with the atmospheric air communication port 1401 and is positioned at a longest distance from the ink supply inlet 1220. This ink supply method is very effective in view of practical use. The rib 2300 comprises four members parallel to the moving line of the carriage HC. The members are arranged on the back end face of the body of cartridge 1000. The rib 2300 prevents the absorber 900 from contacting to the back end face of the body 1000 of the ink tank. The partial ribs 240 and 250 are also placed on the inner surface of the cover plate 1100 positioned on the extension line from the rib 2300. In contrast with the rib 2300, the partial ribs 240 and 250 are composed of many smaller pieces of ribs respectively so that a volume of empty space containing air of the roles 240 and 250 becomes larger than the rib 2300. The partial ribs 240 and 250 are distributed over half or less of the area of the inner face of the cover plate 1100. With these ribs, the flow of ink at the corners of the ink tank IT far from the ink supply inlet 1220 of the absorber 900 is stabilized, the ink can be lead from every region of the absorber 900 into the ink supply inlet 1220 by a capillary action. The atmospheric air communication port 1401 is an open hole on the cover plate 1402 for communicating air between the inner containment of the ink tank IT and the atmosphere. The atmospheric air communication port 1401 is plugged with a repellency material 1400 for preventing ink leakage.

Figure 17:
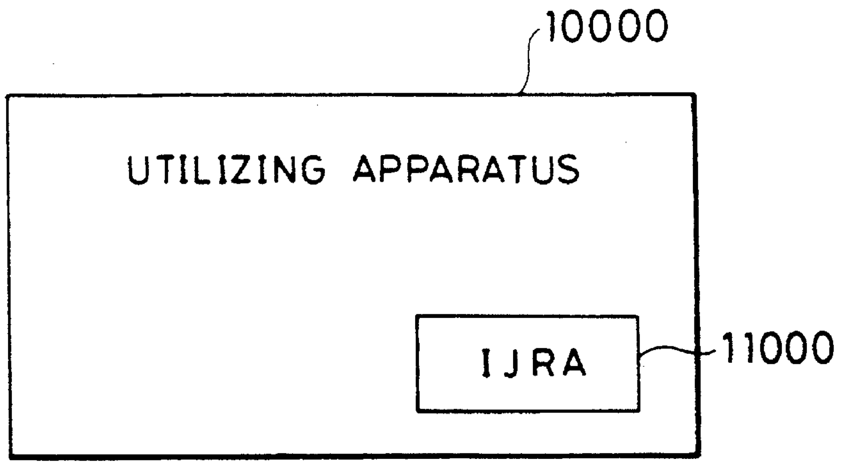
FIG. 17 is a schematic diagram illustrating an embodiment of apparatus in accordance with the present invention to which the ink jet recording system shown in FIG. 16 is equipped.

A space of ink containment of the ink tank IT in this embodiment is a rectangular parallelopiped and a longer side of the space is corresponding to the side of the ink tank IT as shown in FIG. 17 and FIG. 13. Hence, the layout of ribs 240 and 250 are effective specifically in this case. In case that the ink tank IT has its longer side in the direction of the movement of the carriage HC or the ink tank IT has the inner containment space in a cube, the flow of ink in the absorber 900 can be stabilized by placing those ribs on the whole area of the inner face of the cover plate 1100.

Figure 14:
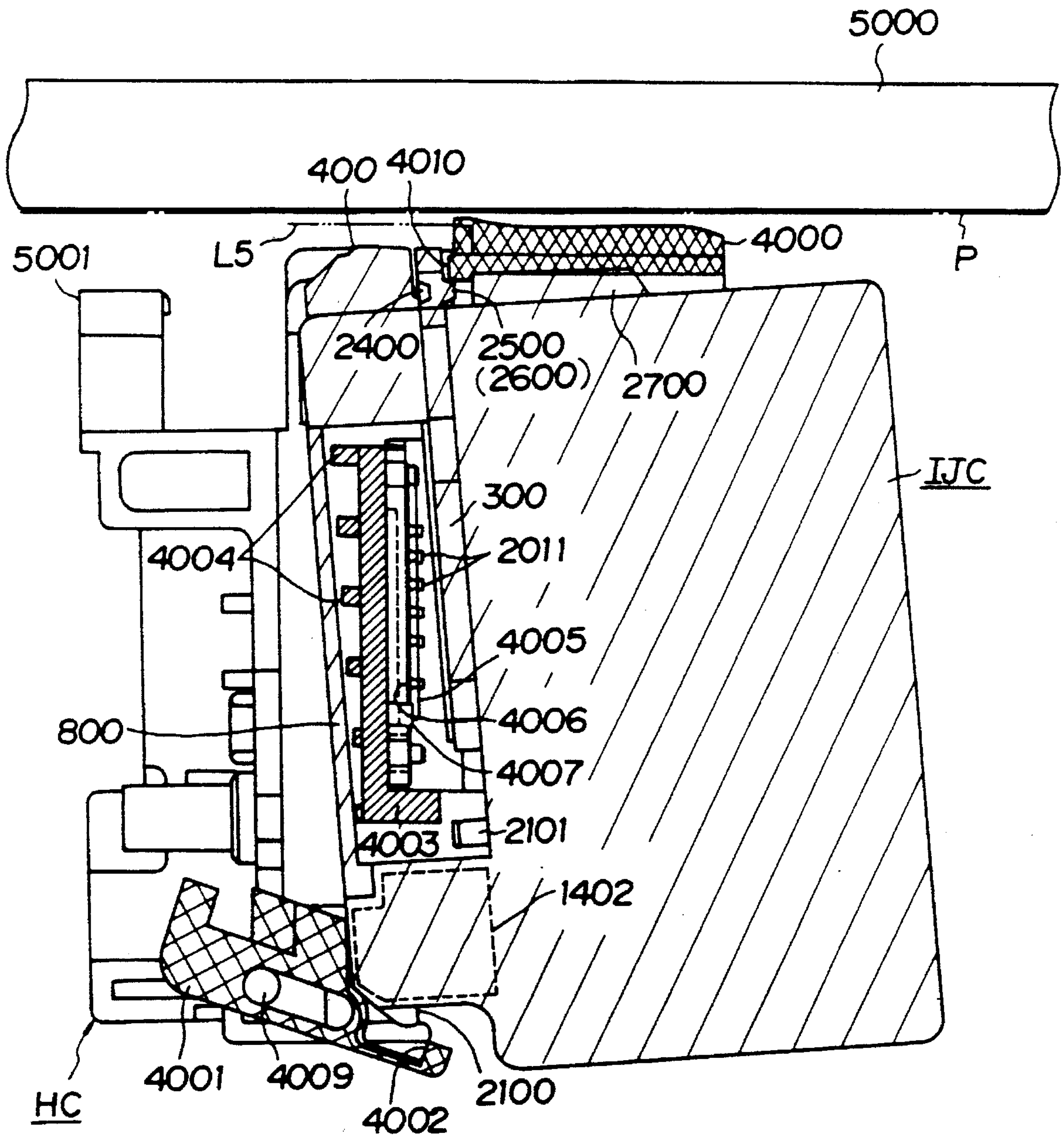
FIG. 14 is a perspective view showing the mounting portion of an ink jet unit in FIG. 12.

A structure of the fitting face of the ink tank IT to the ink jet unit IJU is illustrated in the FIG. 14. When a line L1 is taken to be a straight line passing through the center of the ink ejection outlet of the orifice plate 400 and parallel to the bottom face of the ink tank IT or to the reference face on the surface of the carriage on which the ink jet cartridge is mounted, two protruding portions 1012 to be inserted into the hole 312 on the support member 300 are on the line L1. The height of the protruding portions 1012 is a little less than the thickness of the support member 300 and the support member 300 is positioned with the protruding portions 1012. On the extension of the line L1, as shown in FIG. 14, a click 2100 is formed for catching a right angular hook surface 4002 of a locating hook 4001 shown in FIG. 15, so that a force for locating the carriage HC is applied on the surface region parallel to the before mentioned reference face on the surface of the carriage HC including the line L1. This layout relationship between the ink tank and the ink jet cartridge forms an effective structure to make the accuracy of locating the ink tank IT alone equivalent to that of locating the ink ejection outlet of the ink jet head IJH.

In addition, the length of the protruding portions 1800 and 1801 to be inserted in the holes 1900 and 2000 for fixing the support member 300 onto the side wall of the ink tank IT is greater than that of the above mentioned protruding portions 1012. The portions 1800 and 1801 are used for fixing the supporting member on the side wall of the ink tank IT by penetrating through the holes on the support member 300 and by bonding the end part of the protruding portions 1800 and 1801 with a heat fusion method. Let is a straight line intersecting perpendicularly with the straight line L1 and passing the protruding 1800, and L2 is a straight line intersecting perpendicularly with the straight line L1 and passing the protruding 1801. Because the center of the before mentioned ink supply inlet 1220 is locating nearly on the straight line L3, the protruding portion 1800 works for stabilizing the connection state between the ink supply inlet 1220 and the ink supply pipe 2200 so as to make it possible to reduce the over load on this connection state in case of dropping them and/or giving them shocks. As the straight lines L2 and L3 do not intersect at any point and there are protruding portions 1800 and 1801 in the neighborhood of the protruding portion 1012 at the side of the ink ejection outlet of the ink jet head IJH, the ink tank IT being supported on three points, a supportive effect occurs for locating the ink jet head IJH on the ink tank IT. And a curve L4 illustrated in FIG. 14 shows a position of an outside wall of the ink supply member 600 when installed. As the protruding portions 1800 and 1801 are layed out along the curve L4, it is possible to provide the ink tank IT with enough high strength and dimensional accuracy under the application of the weight load of the top of the ink jet head IJH. A nose flange 2700 of the ink tank IT is inserted into a hole in a front plate 4000 of the carriage HC (shown in FIG. 15) so as to prevent an abnormal state where the displacement of the ink tank IT becomes extremely large. A latchble portion 2101 to be inserted into yet another locating portion of the carriage HC is formed in the ink tank IT.

The ink jet unit IJU is installed inside of the ink tank IT and then is closed with the cover plate 800 so that the ink jet unit is surrounded by the ink tank and the cover plate except an under side opening of the ink tank. However, the under side opening approaches the carriage HC when the ink jet cartridge IJC is mounted on the carriage HC, thereby a substantial perfect closed space around the ink jet unit IJU is established. Accordingly, though the heat generated from the ink jet head IJH within the closed space is valid as forming a heat jacket, during a long time of a continuous use of the ink jet head, the temperature of the closed space increases slightly. In this embodiment, for promoting a natural heat dissipation from the supporting member 300, a slit 1700 with a width less than that of the above-mentioned closed space is formed on the upper deck of the ink jet cartridge IJC. Owing to the slit 1700, it is possible to prevent the temperature rise within the closed space and to establish an uniform temperature distribution in the whole of the ink jet unit IJU being independent of any environmental fluctuation.

By assembling the ink jet cartridge IJC composed of the ink tank IT and the ink jet unit IJU as shown in FIG. 13, ink can be fed from the ink tank into the ink supply member 600 thorough the ink inlet 1220, the hole 320 of the supporting member 300 and an inlet provided on a back face of the ink supply member 600, and after ink flows inside the ink supply member 600, ink pours into a common fluid reservoir through an adequate ink supply tube and the ink inlet 1500 of the top plate 1300 from the ink outlet of the ink supply member 600. Gaps formed at connecting portions of these components for supplying ink described above are filled with packing substance such as a silicone rubber, a butyl rubber or the like for sealing the gaps, and then an ink feed route is established.

In this embodiment, a material used for the top plate 1300 is an ink-resistant synthetic resin such as polysulfone, polyether sulphone, polyphenylene oxide, polypropylene or the like. The top plate 1300 is molded into a single module together with the orifice plate 400.

As described above, as the ink supply member 600, the single module of the top prate 1300 with the orifice plate 400, and the body 1000 of the ink tank are a single module molded respectively, not only a high accuracy in assembling the components for discharging ink can be attained but also a quality of the components in a mass production is increased effectively. In addition, by assembling individual parts into a single molded component, the number of parts of the ink jet cartridge IJC may be reduced, compared with a conventional assembling method, thereby a favorable and expected features of the ink jet cartridge is established.

Figure 15:
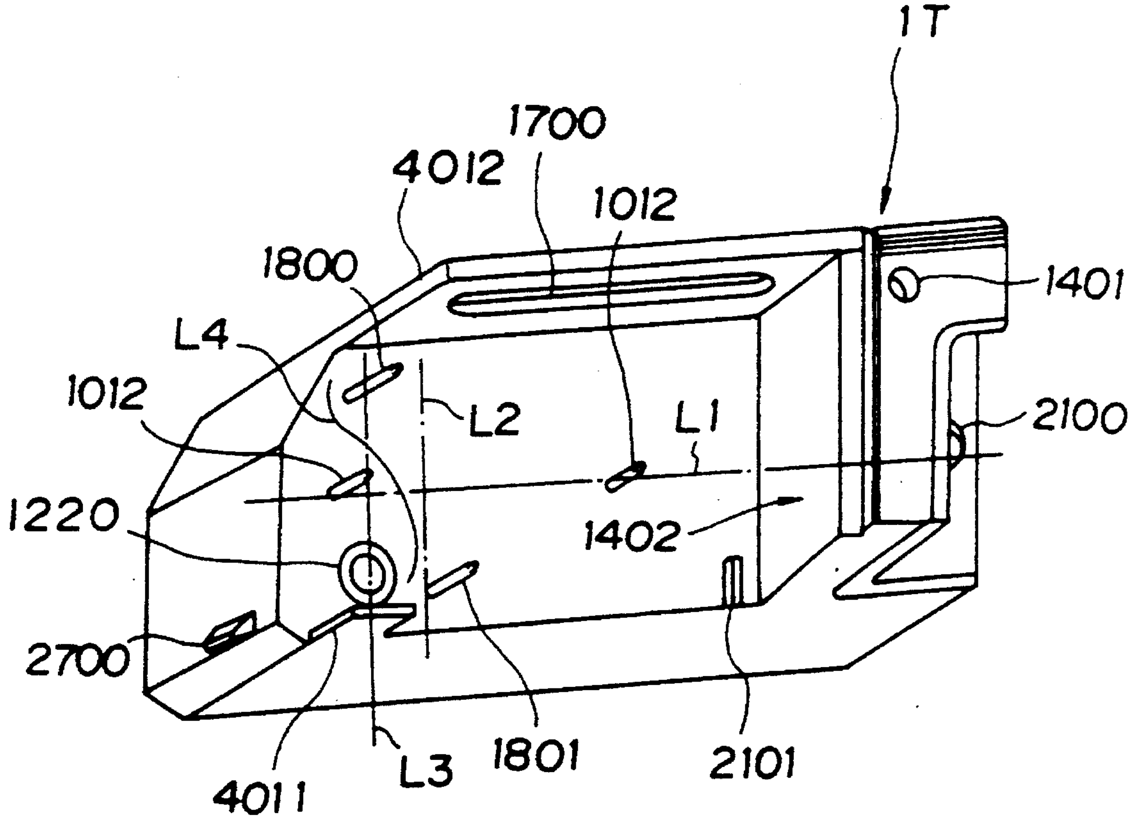
FIG. 15 is an explanation view showing the mounting of the cartridge of FIG. 12 on the apparatus.
Figure 16:
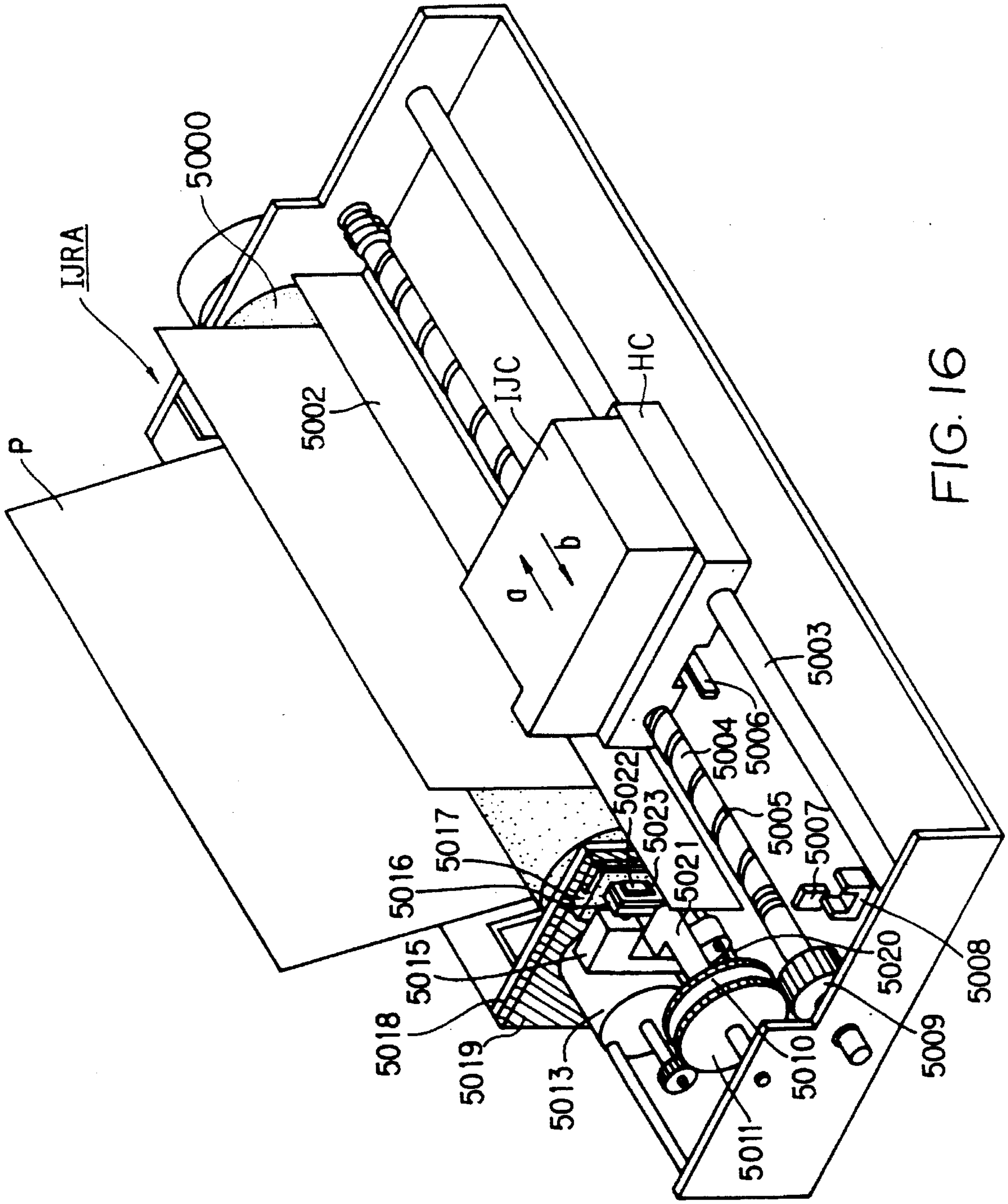
FIG. 16 is a view showing an appearance of an apparatus incorporating the cartridge of FIG. 12.

(iii) Description of an installation of the ink jet cartridge IJC onto the carriage HC In FIG. 15, reference numeral 5000 denotes a platen roller for guiding a recording medium P such as a sheet of paper moving in the direction from its lower side to its upper side. The carriage HC moves along the platen roller 5000. The carriage HC has, in a forward area of the carriage HC facing to the platen roller 5000, the front plate 4000 (with a thickness of 2 mm) in front of the ink jet carriage IJC, a flexible sheet 4005 furnished with pads 2011 corresponding to pads 1201 on the distributing substrate 1200 of the ink jet cartridge IJC, a support board 4003 for electrical connection holding a rubber pad 4006 for generating elastic force for pressing the reverse side of the flexible sheet 4005 onto the pads 2011, and the locating hook 4001 for holding the ink jet cartridge IJC on the right position of the carriage HC. The front plate 4000 has two locating protruding surfaces 4010 corresponding to the before mentioned locating protrusions 2500 and 2600 of the support member 300. The locating protruding surfaces 4010 receive a vertical pressure from the ink jet cartridge IJC installed in the carriage HC. The front plate 4000 has a plurality of reinforcing ribs (not shown in drawings) spanning in the direction along the vertical pressure. The surface of these ribs is a little closer by about 0.1 mm to the platen roller 5000 than the position of front surface 1.5 (shown in FIG. 15) of the ink jet cartridge IJC and hence these ribs is used also for protectors of the ink jet head IJH. The support board for electrical connection has a plurality of reinforcing ribs 4004 spanning in the vertical direction to another surface of the ink jet cartridge IJC in contrast to the spanning direction of the above-mentioned reinforcing ribs of the front plate 4000. The protrusion of the ribs 4004 is gradually reduced along the direction from the platen roller side to the hook 4001. This configuration of the ribs 4004 also enables the ink jet cartridge to be positioned with an inclination angle to the platen roller 5000 as shown in FIG. 15. The support board 4003 has a locating surface 4007 on the side of the locating hook 4001 and a locating surface 4008 on the side of the platen roller 5000 for electrical connection stability. The support board 4003 has a pad contact region between these locating surfaces and limits the distortion length of the rubber pad sheet 4006 corresponding to pad 2011 by these locating surfaces. Once the ink jet cartridge IJC is fixed in the right position for recording, the locating surfaces 4007 and 4008 contact on the surface of the distributing substrate 1200. Moreover, in this embodiment, as pads 1201 of the distributing substrate 1200 are arranged symmetrically with respect to the before mentioned straight line L1, the distortion amount of the pads on the rubber pad sheet 4006 is made to be uniform and then a contacting pressure between the pads 2011 and 1201 is more stabilized. In this embodiment, the pads 1201 are arranged in an array with 2 center rows, 2 upper columns and 2 lower columns.

The locating hook 4001 has a slot linking an fixing axis 4009. Using a movable space in the slot, by rotating the locating hook 4001 counterclockwise from the position shown in the FIG. 15 and moving the locating hook 4001 left along the platen roller 5000, the location of the ink jet cartridge IJC can be fixed relative to the carriage HC. Though any means for moving the locating hook 4001 may be used, a moving mechanism with a lever or the like is suitable for moving the locating hook. The following is a further detailed and stepwise description about fixing the ink jet cartridge IJC into the carriage HC. (1) At first, in response to the rotating movement of the locating hook 4001, the ink jet cartridge IJC moves to the side of the platen roller 5000 and at the same time the locating protrusions 2500 and 2600 move to the position where they can contact the locating protruding surface 4010 of the front plate 4000. (2) Next, by the movement of the locating hook 4001 in the left direction, a rectangular surface of the hook surface 4002 well contacts a rectangular surface of the click 2100 and at the same time the locating hook 4001 rotates horizontally around the contacting of the locating components 2500 and 4010, and then as a result the pads 1201 and 2011 contact closely to each other. (3) The locating hook 4001 is held in a fixed position, thereby a perfect contacting state between the pads 1201 and 2011, a perfect contacting state between the locating protrusions 2500 and 4010, a facial contacting state between the rectangular surface of the hook surface 4002 and the click 2100 and a face contacting state between the distributing substrate 1200 and the locating surfaces 4007 and 4008 of the support board 4003 are established at the same time, and then the fixing of the ink jet cartridge into the carriage HC is established finally.

(iv) Summarized description of a body of the ink jet recording system

FIG. 16 illustrates schematically an embodiment of an ink jet recording apparatus IJRA to which the present invention is applied. A pin arranged in the carriage HC meshes with a screw channel 5005 of a lead screw axis 5004 rotated reversibly by the torque transmitted through driving gears 5011, 5010 and 5009 from a driving motor 5013. As the driving motor 5013 rotates clockwise or counterclockwise, simultaneously the lead screw axis 5004 rotates in the same manner. The carriage HC moves in the either direction of the arrow a or b as shown in FIG. 16 as the lead screw axis 5004 rotates clockwise or counterclockwise. Reference numeral 5002 denotes a paper keep plate for pressing a paper sheet P as a recording medium against the platen roller 5000 along the moving direction of the carriage HC. Reference numerals 5007 and 5008 denote photo-couplers, which generate a signal to indicate that the carriage HC is in a home position by sensing an existence of a lever 5006 in the region where photo-couplers are placed. The signal is used to change the turning direction of the motor 5013 and so on. Reference numeral 5016 denotes a supporting member for support a capping member 5022 which is used to cap the front side of the ink jet head IJH. Reference numeral 5015 denotes a suction means for absorbing ink inside the capping member 5022 from an aperture 5023 within the capping member so as to recover and increase the ink ejection power of the ink jet head IJH. Reference numeral 5017 denotes a cleaning blade. Reference numeral 5019 denotes a member for enabling the cleaning blade 5017 to move forward or backward and supported by a body supporting plate 5018. As for another embodiment of the cleaning blade 5017, there is no need to say that other types of cleaning blades as used in prior art are applicable to the present embodiment. In addition, a lever 5021 used for starting to recover an absorbing ability moves in accordance with the movement of a cam 5020 meshing the carriage HC and this movement is controlled by a torque transmission means as used in prior art such as means for switching a clutch by a driving force from the driving motor 5013. In order to perform capping, cleaning and absorption restoration operations, a controller for actuating them are formed so that expanded tasks regarding the above mentioned operations may be performed at an appropriate timing and at their right positions controlled by the rotation of the lead screw axis 5004 when the carriage HC arrives at its home position.

Further, the ink jet recording system shown in FIG. 16 can be preferably realized as a portable or handy printer, since the ink jet cartridge IJC is compact.

(v) Various Aspects of the Invention

The present invention is particularly suitably useable in an ink jet recording head having thermal energy means for producing thermal energy as energy used for ink ejection such as a plurality of electrothermal converting elements, a laser apparatus for generating a plurality of laser beams or the like and a recording apparatus using the head. The thermal energies cause variation of the ink condition and thereby discharge ink. This is because, the high density of the picture element, and the high resolution of the recording are possible.

The typical structure and the operational principles are preferably those disclosed in U.S. Pat. Nos. 4,723,129 and 4,740,796. The principle is applicable to a so-called on-demand type recording system and a continuous type recording system. Particularly however, it is suitable for the on-demand type because the principle is such that at least one driving signal is applied to an electrothermal converting element disposed on a liquid (ink) retaining sheet or ink passage, the driving signal being enough to provide such a quick temperature rise beyond a departure from nucleation boiling point, by which the thermal energy is provided by the electrothermal converting element to produce film boiling on the heating portion of the recording head, whereby a bubble can be formed in the liquid (ink) corresponding to each of the driving signals. By the development and collapse of the bubble, the liquid (ink) is ejected through an ejection outlet to produce at least one droplet. The driving signal is preferably in the form of a pulse, because the development and collapse of the bubble can be effected instantaneously, and therefore, the liquid (ink) is ejected with quick response. The driving signal in the form of the pulse is preferably such as disclosed in U.S. Pat. Nos. 4,463,359 and 4,345,262. In addition, the temperature increasing rate of the heating surface is preferably such as disclosed in U.S. Pat. No. 4,313,124.

The structure of the recording head may be as shown in U.S. Pat. Nos. 4,558,333 and 4,459,600 wherein the heating portion is disposed at a bent portion in addition to the structure of the combination of the ejection outlet, liquid passage and the electrothermal converting element as disclosed in the above-mentioned patents. In addition, the present invention is applicable to the structure disclosed in Japanese Patent Application Laying-open No. 123670/1984 wherein a common slit is used as the ejection outlet for plurality electrothermal converting elements, and to the structure disclosed in Japanese Patent Application Laying-open No. 138461/1984 wherein an opening for absorbing pressure waves of the thermal energy is formed corresponding to the discharging portion. This is because, the present invention is effective to perform the recording operation with certainty and at high efficiency irrespective of the type of the recording head.

The present invention is effectively applicable to a so-called full-line type recording head having a length corresponding to the maximum recording width. Such a recording head may comprise a single recording head and a plurality of recording heads combined to cover the entire width.

In addition, the present invention is applicable to a serial type recording head wherein the recording head is fixed on the main assembly, to a replaceable chip type recording head which is connected electrically with the main apparatus and can be supplied with the ink by being mounted in the main assembly, or to a cartridge type recording head having an integral ink container.

The provision of the recovery means and the auxiliary means for the preliminary operation are preferable, because they can further stabilize the effect of the present invention. As for such means, there are capping means for the recording head, cleaning means therefor, pressing or suction means, preliminary heating means by the ejection electrothermal converting element or by a combination of the ejection electrothermal converting element and additional heating element and means for preliminary ejection not for the recording operation, which can stabilize the recording operation.

As regards the kinds and the number of the recording heads mounted, a single head corresponding to a single color ink may be equipped, or a plurality of heads corresponding respectively to a plurality of ink materials having different recording colors or densities may be equipped. The present invention is effectively applicable to an apparatus having at least one of a monochromatic mode solely with a main color such as black and a multi-color mode with different color ink materials or a full-color mode by color mixture. The multi-color or full-color mode may be realized by a single recording head unit having a plurality of heads formed integrally or by a combination of a plurality of recording heads.

Furthermore, in the foregoing embodiment, the ink has been liquid. It may, however, be an ink material solidified at the room temperature or below and liquefied at the room temperature. Since in the ink jet recording system, the ink is controlled within the temperature not less than 30° C. and not more than 70° C. to stabilize the viscosity of the ink to provide the stabilized ejection, in usual recording apparatus of this type, the ink is such that it is liquid within the temperature range when the recording signal is applied. In addition, the temperature rise due to the thermal energy is positively prevented by consuming it for the state change of the ink from the solid state to the liquid state, or the ink material is solidified when it is unused is effective to prevent the evaporation of the ink. In either of the cases, with the application of the recording signal producing thermal energy, the ink may be liquefied, and the liquefied ink may be ejected. The ink may start to be solidified at the time when it reaches the recording material. The present invention is applicable to such an ink material as is liquefied by the application of the thermal energy. Such an ink material may be retained as a liquid or solid material through holes or recesses formed in a porous sheet as disclosed in Japanese Patent Application Laying-open No. 56847/1979 and Japanese Patent Application Laying-open No. 71260/1985. The sheet is faced to the electrothermal converting elements. The most effective one for the ink materials described above is the film boiling system.

The ink jet recording apparatus may be used as an output means of various types of information processing apparatuses such as a work station, personal or host computer, a word processor, a copying apparatus combined with an image reader, a facsimile machine having functions for transmitting and receiving information, or an optical disc apparatus for recording and/or reproducing information into and/or from an optical disc. These apparatuses require means for outputting processed information in the form of hand copy.

FIG. 17 schematically illustrates one embodiment of a utilizing apparatus in accordance with the present invention to which the ink jet recording system shown in FIG. 16 is equipped as an output means for outputting processed information.

In FIG. 17, reference numeral 10000 schematically denotes a utilizing apparatus which can be a work station, a personal or host computer, a word processor, a copying machine, a facsimile machine or an optical disc apparatus. Reference numeral 11000 denotes the ink jet recording apparatus (IJRA) shown in FIG. 16. The ink jet recording apparatus (IJRA) 11000 receives processed information from the utilizing apparatus 10000 and provides a print output as hard copy under the control of the utilizing apparatus 10000.

Figure 18:
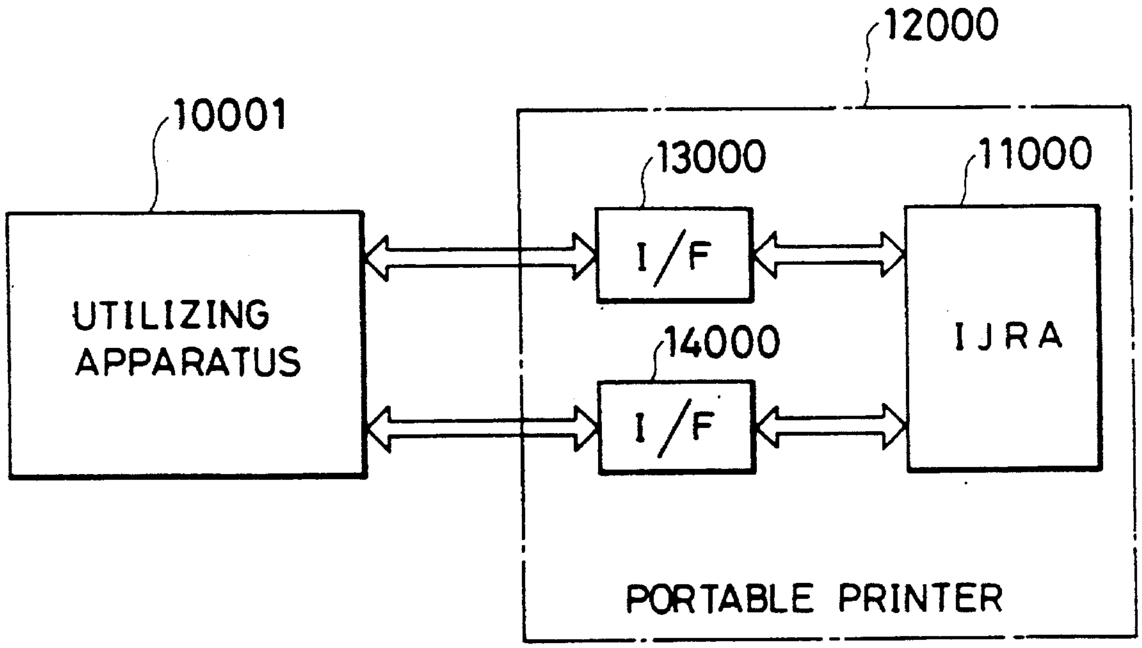
FIG. 18 is a schematic drawing illustrating an embodiment of a portable printer in accordance with the present invention.

FIG. 18 schematically illustrates another embodiment of a portable printer in accordance with the present invention to which a utilizing apparatus such as a work station, a personal or host computer, a word processor, a copying machine, a facsimile machine or an optical disc apparatus can be coupled.

In FIG. 18, reference numeral 10001 schematically denotes such a utilizing apparatus. Reference numeral 12000 schematically denotes a portable printer having the ink jet recording apparatus (IJRA) 11000 shown in FIG. 16 incorporated thereinto and interface circuits 13000 and 14000 receiving information processed by the utilizing apparatus 11001 and various controlling data for controlling the ink jet recording apparatus 11000, including hand shake and interruption control from the utilizing apparatus 11001. Such control per se is realized by conventional printer control technology.

Although specific embodiments of a record apparatus constructed in accordance with the present invention have been disclosed, it is not intended that the invention be restricted to either the specific configurations or the uses disclosed herein. Modifications may be made in a manner obvious to those skilled in the art.

For example, although the embodiments are described with regard to a serial printer, the present invention can also be applied to line printers. Here, the serial printer is defined as a printer that has a moving member on which the record head is mounted, the moving member being moved to and from in the direction perpendicular to the transporting direction of the recording paper. Accordingly, it is intended that the invention be limited only by the scope of the appended claims.

As explained above, in accordance with the present invention, a plurality of the semiconductor devices with high withstanding voltage and excellent electrical isolation can be formed on the common single substrate. Accordingly, it is not necessary to connect the individual devices outside of the substrate to the circuits connected in a matrix form, so that the number of the production processes can be reduced and also the likelihood failure can be reduced. Thus, the recording head with a high reliability can be obtained.

Further, in accordance with the present invention, since the semiconductor devices and the electrothermal converting elements driven by the semiconductor devices are formed on the common single substrate the areas of the circuits can be made small and the numbers of the production processes can be reduced and further the reliability of the head can be improved. As a result the recording head with which the image with a high resolution can be recorded is obtained.

Further, since the substrate is so constructed as the transistor structure is formed on the substrate plate and the driving voltage is applied on the short-circuited base and collector and the electrothermal converting element is connected to the emitter and the individual devices on the substrate plate are electrically separated with the isolation region with each other, the switching rate is high due to absence of the injection of the minority carriers between the base and collector so that rising characteristic is improved, and the parasitic effect is small. Hence, in the recording head of the present invention a favorable thermal energy can be supplied to the liquid and as a result, the ink ejection characteristics can be improved.

Further in accordance with the present invention, on the occasion of the shallow emitter, the problems for narrowing the width of the wiring can be resolved, and the chip area of the recording head can be reduced to one half by integrating the functional elements in high density without increasing the number of the production processes, so that cost reduction can be achieved without deterioration of the reliability.

In accordance with the present invention, by defining the junction area and the junction length of the semiconductor device, with any type of semiconductor device, the devices with less deviation and high reliability can be obtained.

The present invention has been described in detail with respect to preferred embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

What is claimed is:

1. A method for preparing a device for an ink jet recording head which ejects ink using thermal energy generated by applying an electrical current of at least 200 mA and not more than 300 mA to a rectifier element to drive an electrothermal converting element, said method comprising the steps of:

preparing a semiconductor body of a first conductivity type;

forming the rectifier element on said semiconductor body; and forming the electrothermal converting element electrically connected to said rectifier element on said semiconductor body, wherein said rectifier element forming step comprises the steps of:

forming a first semiconductor region of a second conductivity type on said semiconductor body;

forming a second semiconductor region of the first conductivity type within said first semiconductor region;

forming a third semiconductor region of the second conductivity type within said second semiconductor region; and forming an electrode for short-circuiting said first semiconductor region and said second semiconductor region;

wherein a junction area between said second semiconductor region and said third semiconductor region is within a range from $5\times10^{-6}$ cm$^2$ to $5\times10^{-4}$ cm$^2$.

2. A method as in claim 1, wherein said first conductivity type is a P type.

3. A method as in claim 1, wherein said rectifier element is a diode obtained by short-circuiting a base and a collector of an NPN transistor.

4. A method for preparing a device for an ink jet recording head which ejects ink using thermal energy generated by applying an electrical current of at least 300 mA and not more than 400 mA to a rectifier element to drive an electrothermal converting element, said method comprising the steps of:

preparing a semiconductor body of a first conductivity type;

forming the rectifier element on said semiconductor body; and forming the electrothermal converting element electrically connected to said rectifier element on said semiconductor body;

wherein said rectifier element forming step comprises the steps of:

forming a first semiconductor region of a second conductivity type on said semiconductor body;

forming a second semiconductor region of the first conductivity type within said first semiconductor region;

forming a third semiconductor region of the second conductivity type within said second semiconductor region; and forming an electrode for short-circuiting said first semiconductor region and said second semiconductor region;

wherein a junction area between said second semiconductor region and said third semiconductor region is within a range from $1\times10^{-4}$ cm$^2$ to $5\times10^{-4}$ cm$^2$.

5. A method as in claim 4, wherein said first conductivity type is a P type.

6. A method as in claim 4, wherein said rectifier element is a diode obtained by short-circuiting a base and a collector of an NPN transistor.

7. A method for preparing a device for an ink jet recording head which ejects ink using thermal energy generated by applying an electrical current of at least 200 mA and not more than 300 mA to a rectifier element to drive an electrothermal converting element, said method comprising the steps of:

preparing a semiconductor body of a first conductivity type;

forming the rectifier element on said semiconductor body;

forming the electrothermal converting element electrically connected to said rectifier element on said semiconductor body; and forming an orifice for ejecting ink corresponding to said electrothermal converting element;

wherein said rectifier element forming step comprises the steps of:

forming a first semiconductor region of a second conductivity type on said semiconductor body;

forming a second semiconductor region of the first conductivity type within said first semiconductor region;

forming a third semiconductor region of the second conductivity type within said second semiconductor region; and forming an electrode for short-circuiting said first semiconductor region and said second semiconductor region;

wherein a junction area between said second semiconductor region and said third semiconductor region is within a range from $5\times10^{-6}$ cm$^2$ to $5\times10^{-4}$ cm$^2$.

8. A method as in claim 7, wherein said first conductivity type is a P type.

9. A method as in claim 7, wherein said rectifier element is a diode obtained by short-circuiting a base and a collector of an NPN transistor.

10. A method as in claim 7, further comprising a step of supplying an ink to said ink jet recording head.

11. A method for preparing a device for an ink jet recording head which ejects ink using thermal energy generated by applying an electrical current of at least 300 mA and not more than 400 mA to a rectifier element to drive an electrothermal converting element, said method comprising the steps of:

preparing a semiconductor body of a first conductivity type;

forming the rectifier element on said semiconductor body;

forming the electrothermal converting element electrically connected to said rectifier element on said semiconductor body; and forming an orifice for ejecting ink corresponding to said electrothermal converting element;

wherein said rectifier element forming step comprises the steps of:

forming a first semiconductor region of a second conductivity type on said semiconductor body;

forming a second semiconductor region of the first conductivity type within said first semiconductor region;

forming a third semiconductor region of the second conductivity type within said second semiconductor region; and forming an electrode for short-circuiting said first semiconductor region and said second semiconductor region;

wherein a junction area between said second semiconductor region and said third semiconductor region is within the range from $1\times10^{-4}$ cm$^2$ to $5\times10^{-4}$ cm$^2$.

12. A method as in claim 11, wherein said first conductivity type is a P type.

13. A method as in claim 11, wherein said rectifier element is a diode obtained by short-circuiting a base and a collector of an NPN transistor.

14. A method as in claim 11, further comprising a step of supplying an ink to said ink jet recording head.

* * * * *

UNITED STATES PATENT AND TRADEMARK OFFICE

CERTIFICATE OF CORRECTION

PATENT NO. : 5,567,630

DATED : October 22, 1996

INVENTORS : SHIGEYUKI MATSUMOTO ET AL.

It is certified that error appears in the above-identified patent and that said Letters Patent is hereby corrected as shown below:

ON THE TITLE PAGE Item:

[75] "Yashiro Naruse," should read --Yasuhiro Naruse,--.

COLUMN 1

Line 15, "stations" should read --stations,--;
Line 66, "configurat ion" should read --configuration--.

COLUMN 4

Line 33, "including;" should read --including:--.

COLUMN 9

Line 52, "of" should read --of an--.

COLUMN 10

Line 38, "$S_{B2}O_3$," should read --$SB_2O_3$,--.

COLUMN 11

Line 30, "dependent" should read --dependent upon--.

UNITED STATES PATENT AND TRADEMARK OFFICE

CERTIFICATE OF CORRECTION

PATENT NO. : 5,567,630

DATED : October 22, 1996

INVENTORS : SHIGEYUKI MATSUMOTO ET AL.

It is certified that error appears in the above-identified patent and that said Letters Patent is hereby corrected as shown below:

COLUMN 12

Line 20, "an" should read -- and an--.

COLUMN 13

Line 43, "resist, were removed" should read --resist was removed,--.

COLUMN 17

Line 33, "out let." should read --outlet.--;
Line 46, "precesses" should read --processes--.

COLUMN 19

Line 30, "FIGS. 8A" should read --FIG. 8A--.

COLUMN 22

Line 31, "$5x10^{-2}$" should read --$5x10^{-3}$--.

COLUMN 23

Line 30, "followings is" should read --following is an--;

UNITED STATES PATENT AND TRADEMARK OFFICE
CERTIFICATE OF CORRECTION

PATENT NO. : 5,567,630

DATED : October 22, 1996

INVENTORS : SHIGEYUKI MATSUMOTO ET AL.

It is certified that error appears in the above-identified patent and that said Letters Patent is hereby corrected as shown below:

<u>COLUMN 23</u> continued

Line 32, "shows" should read --show--;
Line 52, "each" should read --each of the--.

<u>COLUMN 26</u> line 59, "Let" should read --L3--.

<u>COLUMN 27</u>

Line 18, "latchble" should read --latchable--;
Line 38, "an" should read --a--.

<u>COLUMN 28</u>

Line 30, "is" should read --are--;
Line 58, "an" should read --a--.

UNITED STATES PATENT AND TRADEMARK OFFICE

CERTIFICATE OF CORRECTION

PATENT NO. : 5,567,630

DATED : October 22, 1996

INVENTORS : SHIGEYUKI MATSUMOTO ET AL. Page 4 of 4

It is certified that error appears in the above-identified patent and that said Letters Patent is hereby corrected as shown below:

COLUMN 32

Line 48, "likelihood" should read --likelihood of--.

COLUMN 33

Line 19, "invention" should read --intention--.

Signed and Sealed this

Twenty-second Day of April, 1997

Attest:

BRUCE LEHMAN

*Commissioner of Patents and Trademarks*

*Attesting Officer*